United States Patent [19]
Aitken

[11] Patent Number: 4,847,504
[45] Date of Patent: * Jul. 11, 1989

[54] APPARATUS AND METHODS FOR ION IMPLANTATION

[75] Inventor: Derek Aitken, East Molesey, England

[73] Assignee: Applied Materials, Inc., Santa Clara, Calif.

[ * ] Notice: The portion of the term of this patent subsequent to Mar. 25, 2003 has been disclaimed.

[21] Appl. No.: 832,327

[22] Filed: Feb. 24, 1986

Related U.S. Application Data

[60] Division of Ser. No. 641,027, Aug. 15, 1984, which is a continuation-in-part of Ser. No. 523,463, Aug. 15, 1983.

[51] Int. Cl.$^4$ .................. H01J 37/00; H01J 27/00
[52] U.S. Cl. .................. 250/492.2; 250/492.1; 250/423 R
[58] Field of Search .............. 250/492.2, 492.21, 296, 250/298, 492.1, 492.3, 285, 423 R, 426; 313/360.1, 361.1, 636.1

[56] References Cited

U.S. PATENT DOCUMENTS

| | | | |
|---|---|---|---|
| 2,390,917 | 3/1960 | Nief | 250/423 R |
| 3,445,650 | 5/1969 | Liebl | 250/296 |
| 3,705,320 | 12/1972 | Freeman | 250/423 R |
| 4,017,403 | 4/1977 | Freeman | 250/492.2 |
| 4,118,630 | 10/1978 | McKenna et al. | 250/492.2 |
| 4,316,090 | 2/1982 | Sakudo et al. | 250/423 R |
| 4,345,113 | 10/1982 | Goode et al. | 250/423 R |
| 4,612,440 | 9/1986 | Brunee et al. | 250/288 |

FOREIGN PATENT DOCUMENTS

| | | | |
|---|---|---|---|
| 0829783 | 3/1960 | United Kingdom | 250/423 R |
| 2070853 | 9/1981 | United Kingdom | 250/423 R |

Primary Examiner—Janice A. Howell
Assistant Examiner—Michael Aronoff
Attorney, Agent, or Firm—Flehr, Hohbach, Test, Albritton & Herbert

[57] ABSTRACT

A system for implanting ions into a target element including a source arrangement for producing an ion beam; a beam analyzing arrangement for receiving the ion beam and selectively separating various ion species in the beam on the basis of mass to produce an analyzed beam; and a beam resolving arrangement disposed in the path of the analyzed beam for permitting a preselected ion species to pass to the target element. The analyzing arrangement has an ion dispersion plane associated therewith. The source arrangement has an associated ion emitting envelope including an area of substantial extension in a plane parallel to the ion dispersion plane and producing ions entering said analyzing arrangement which are travelling substantially either toward or from a common apparent line object lying in a plane perpendicular to the ion dispersion plane.

31 Claims, 32 Drawing Sheets

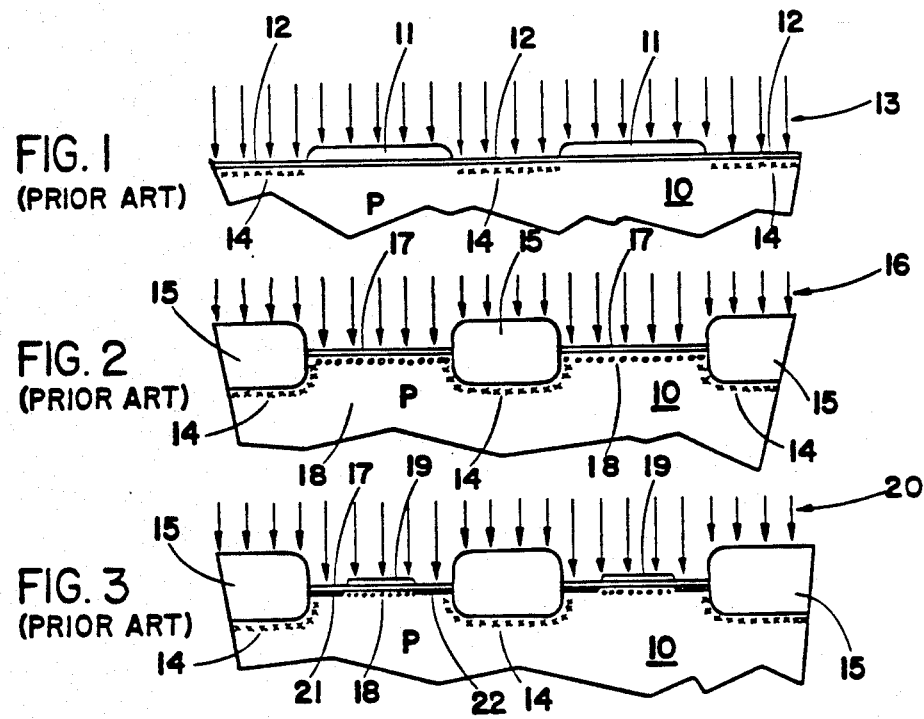
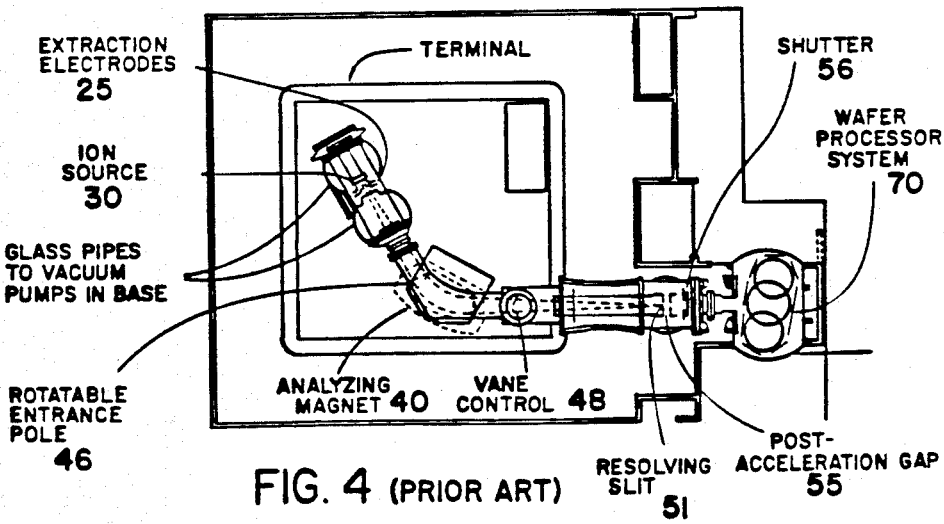

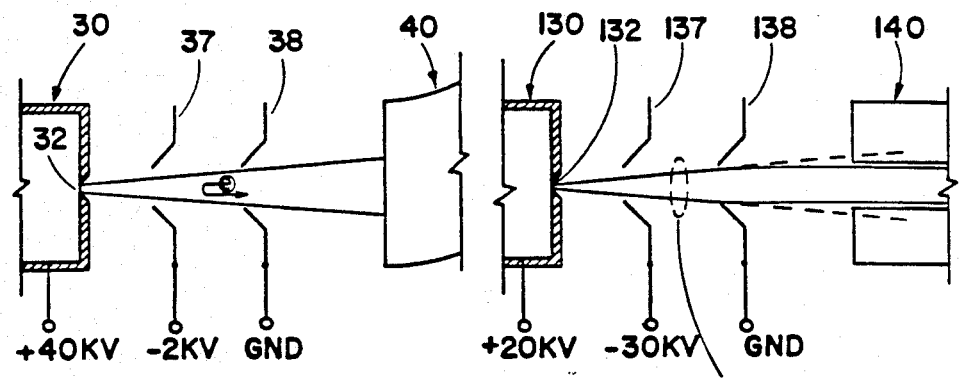
FIG. 29 (PRIOR ART)
FIG. 30
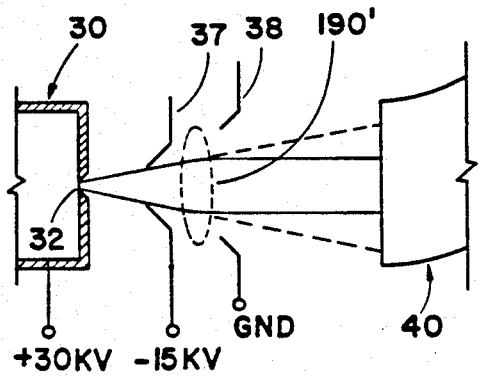
FIG. 31
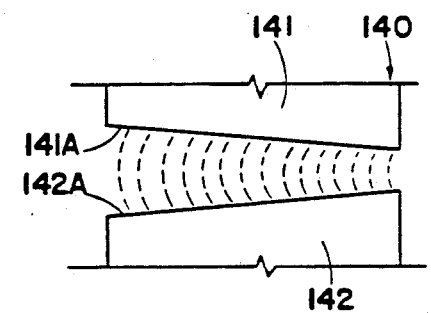
FIG. 32
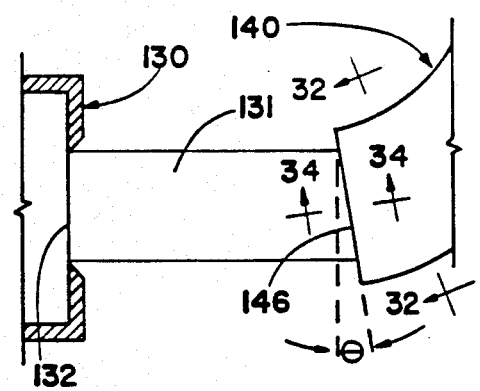
FIG. 33
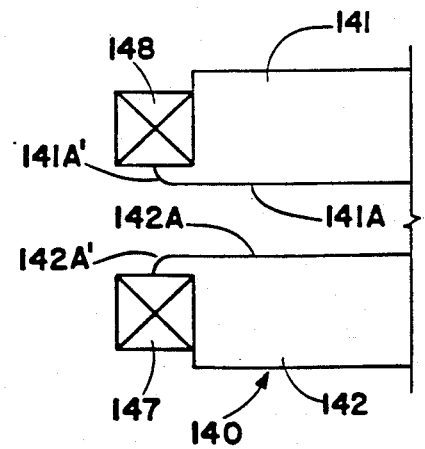
FIG. 34

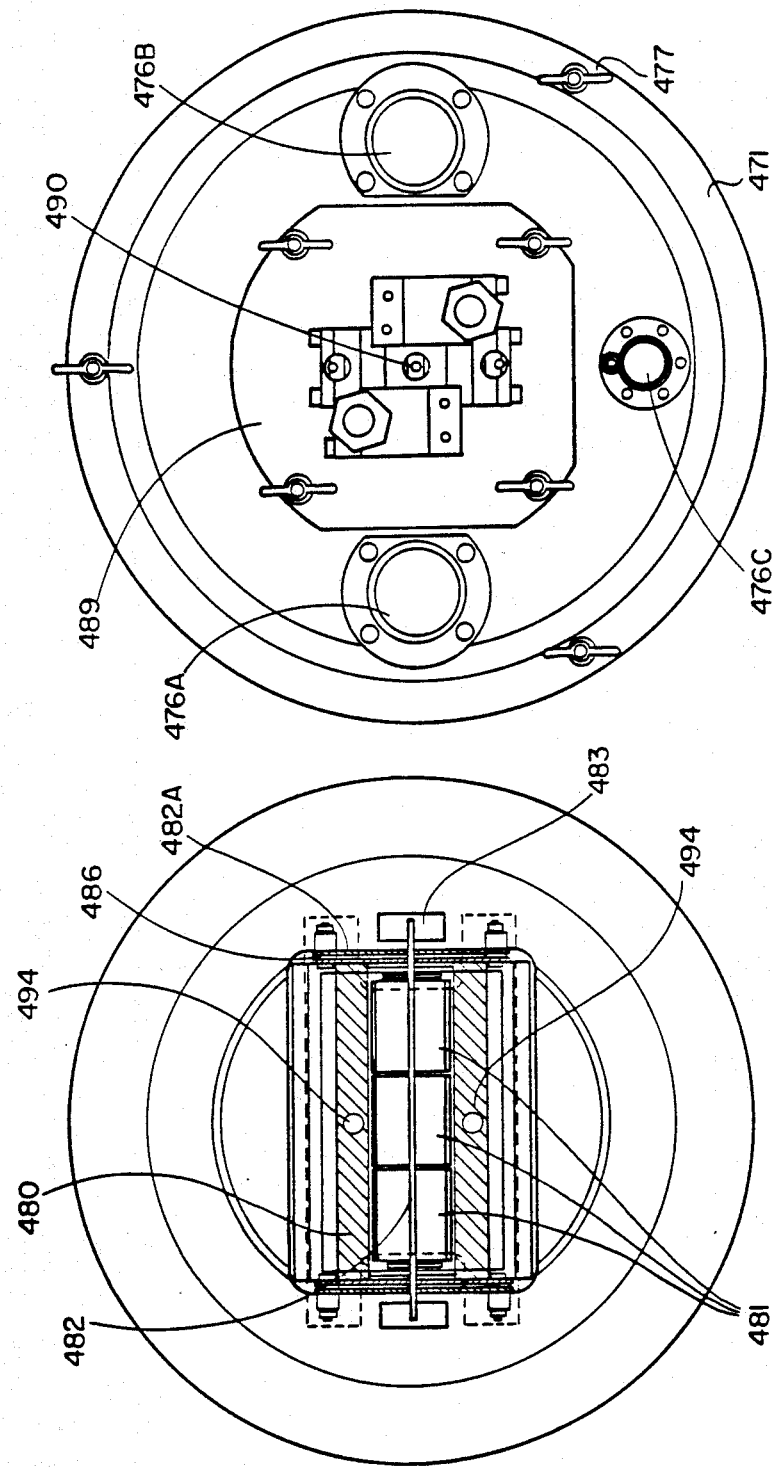

APPARATUS AND METHODS FOR ION IMPLANTATION

REFERENCE TO RELATED APPLICATION

This is a division of application Ser. No. 641,027 filed Aug. 15, 1984 which is a Continuation-in-Part of my co-pending patent application Ser. No. 523,463, filed on Aug. 15, 1983.

FIELD OF THE INVENTION

This invention relates generally to systems and methods for implanting ions of a preselected chemical element into a target element and, more specifically, to systems and methods for implanting conductivity modifying chemical impurities into semiconductor wafers as part of the process for manufacturing semiconductor devices such as large scale integrated circuit chips.

Discussion of Background and Prior Art

While the apparatus and methods of this invention are useful in implanting ions into the surface of metals to produce surface alloying and may also be useful in other applications, the principal commercial use of ion implantation today is in the manufacture of large scale integrated circuit (LSIC) chips. Accordingly, for purposes of illustration but not of limitation, the methods and apparatus of this invention will be described in connection with the manufacture of LSIC chips. To understand the importance of the invention in the LSIC field, some background information on IC manufacture will be helpful.

Use of Ion Implantation in Semiconductor Processing

Very great improvements in the scale of integration of semiconductor devices on integrated circuit (IC) chips and the speed of operation of such devices have been achieved over the past several years. These improvements have been made possible by a number of advances in integrated circuit manufacturing equipment as well as improvements in the materials and methods utilized in processing virgin semiconductor wafers into IC chips. The most dramatic advances in manufacturing equipment have been improved apparatus for lithography and etching and improved systems for implanting ions of conductivity modifying impurities into the semiconductor wafer.

Generally, the density of integrated circuits and their speed of operation are dependent largely upon the accuracy and resolution of the lithography and etching apparatus used to form patterns of circuit elements in masking layers on the semiconductor wafer. However, density and speed are also dependent upon tight control of the profile of doped regions in the wafer, i.e., regions to which substantial concentrations of conductivity modifying impurities have been added. Tight control of wafer doping can best be achieved using ion implantation techniques and equipment.

Large scale integration (LSI) and very large scale integration (VLSI) of conductor-insulator-silicon (CIS) devices are improved by making more efficient use of the wafer area, shortening interconnects between devices, producing smaller geometries and reducing noise. All of these improvements are made possible in large part through the use of ion implantation doping methods.

Manufacture of bipolar circuits has also been improved with ion implantation. In this processing technology, improvements have resulted from performing predepositions with ion implantation and simultaneously taking advantage of the low contamination and compatibility with photoresist masking which are characteristics of ion implantation equipment.

It is well-known in the industry that doping small geometric regions of a semiconductor wafer cannot be done adequately with gaseous or spin-on deposition of the dopant material on the surface of the wafer, followed by a high temperature furnace diffusion operation which drives the dopant material into the semiconductor wafer in an isotropic manner, i.e., the dopant molecules travel laterally as well as vertically into the wafer. The kinds of dopant profiles, concentrations and lateral geometries required on an LSIC or VLSIC wafer make ion implantation the doping process of choice. The uniformity of doping achievable only with ion implantation is critical in the fabrication of smaller geometry devices. In addition, doping uniformity across the wafer and repeatability from wafer to wafer, which is achievable with ion implantation, dramatically improves fabrication yields of high density devices.

Example of Use of Ion Implantation

FIGS. 1–3 illustrate the use of a sequence of ion implantation steps in fabricating CIS integrated circuits devices on a semiconductor wafer. FIG. 1 illustrates a first ion implantation step which may be performed on the P-type wafer 10 to produce a light implant in the field regions 14 of the wafer. The field regions 14 are defined at this point as the regions of the wafer which are not covered by the regions of photoresist 11. The regions of photoresist 11 are formed using a standard lithography process in which a thin layer of resist is spun over the entire surface of the wafer and then selectively exposed through a mask pattern or by a directly scanned electron beam. This is followed by a developing step which removes areas of the photoresist which have been exposed to the light or to the electrons. This is known as a positive lithography process using a positive resist material. After the layer of resist has been exposed and developed a thin layer of thermal oxide 12 is typically grown over the exposed surfaces of the semiconductor wafer so that the implant in the field regions 14 will be made through the thin oxide layer.

A light implantation of ions of a P-type material such as boron is performed using an ion implantation apparatus. This field implant is done to provide greater electrical isolation between the active device regions which lie under the regions 11 of photoresist material.

After the implantation step shown in FIG. 1, wafer 10 is typically placed in a furnace and thick field oxide regions 15 are grown in a wet oxidation process. During this oxidation process, the implanted ions 14 are driven into the semiconductor substrate to underlie the field oxide regions 15.

After this step, the masking regions 11 are removed and a thin gate oxide 17 is formed in the active device regions 18. At this point, a second ion implantation step, using an N-type dopant material such as phosphorus, may be performed to tailor the threshold voltage of the silicon gate field effect transistor devices to be formed in the active regions. Accordingly, N-type dopant ions 16 will be implanted through the gate oxide layer 17 in a light implant step to create the implanted region 18.

After this light threshold setting implant has been performed, the silicon gate regions 19 of the field effect transistor devices are formed on the wafer using a lithography and etching step to produce the device topology shown in FIG. 3. Thereafter, a heavy implantation of N-type ions may be performed to simultaneously dope the silicon gate element 19 and the source and drain regions 21 and 22 to complete the basic structure of the silicon gate field effect transistor device.

Many additional fabrication steps are required to complete the integrated circuit, including forming an oxide or nitride insulating layer over the entire wafer, forming contact openings with a lithography and etching process to provide contact openings to the source, drain and silicon gate, followed by forming pathways of conductive materials to provide a conductor network for connecting the various devices on the wafer into an overall integrated circuit.

From the above brief explanation, it should be apparent that there are a number of individual process steps which are performed on a semiconductor wafer to translate the virgin wafer into a completed semiconductor IC device. Each of the individual process steps is a potential yield loss operation in that, if the step is not properly performed, all or a large portion of the IC devices on an individual wafer (or batch of wafers in a batch processing operation) may be defective. In addition, with process steps such as ion implantation, uniformity of dosage of the ion implant across the surface of the wafer importantly determines the yield of good chips on each individual wafer.

Desirable Features of Ion Implantation Apparatus

One of the strong desiderata in the field of manufacturing LSI devices using ion implantation techniques is to improve the wafer throughput capability of the ion implanter without dramatically increasing the cost of the ion implanter system, especially for the heavy implants which are becoming more popular in the LSI manufacturing processes. The principal parameter which determines wafer throughput in an ion implanter is ion beam current. The present generation of ion implanters involve a number of different systems having widely varying ion beam current generating capacity with a high current machine in today's parlance being considered one which generates about 10 milliAmperes (mA) of arsenic ion beam current.

Prior Art Implantation Systems

Current generation high current machines are very large and expensive. For example, a typical 160 kV, 10 mA ion implantation system involves a machine which is eleven feet wide and eighteen feet long. The basic core technology portion of an ion implantation system is the ion beam line itself, a typical example of which is depicted in FIG. 5. The dimensions of the beam line dictate to a large extent the size of the overall ion implantation system.

FIGS. 4 and 5 of the drawings illustrate the major components of a prior art ion implanter and the typical ion optics of all prior art ion implantation systems. FIG. 4 shows a schematic layout of the Series III AIT implanter taken from an article by the present inventor entitled "The Design Philosophy for a 200 kV Industrial High Current Ion Implanter," *Nuclear Instruments and Methods*, Vol. 139, pp. 125-134 (1976). The machine described in this article was modified in certain details before the commercial versions were produced, but the general arrangement of components remained the same. FIG. 5 is a schematic isometric view of the beam line components. The ion beam 31 is extracted from the ion source 30 by an extraction electrode assembly 25. The beam leaving the ion source is a ribbon beam which is rectangular in cross-section, with a typical aspect ratio of 8:1 to 30:1.

The divergent beam from the ion source 30 enters the analyzing magnet, which has a rotatable entrance pole 46. This enables the beam to be focused into the resolving slit 51 without the use of any electrostatic focusing lenses. Immediately after the beam has passed through the flight tube between the poles of the analyzing magnet 40, it comes to the vane unit 48 which controls the beam current reaching the wafer processor system 70. The vane unit is driven by a high speed stepper motor and can change the current by approximately 0.1% per step, the step time being one millisecond. The vane unit together with the analyzing magnet and the ion source are in the accelerator terminal which can float at up to 160 kV to give the post-acceleration of the beam.

The post-acceleration of the ion beam is achieved across a single gap 55. Immediately after the post-acceleration gap 55 is a magnetically suppressed shutter 56 for beam current measurement prior to entry of the beam into the wafer processor system 70.

The vacuum system consists of four stages of differential pumping. The function of the diffusion pumps is primarily to maintain a low air or feed gas partial pressure in the system when used for semiconductor applications.

Prior Art Ion Beam Optics in General

Referring specifically to FIG. 5, it is seen that the typical beam line in a prior art ion implanter system includes an ion source arrangement 30, an analyzing magnet arrangement 40, a resolving slit arrangement 50, a post-acceleration system 60 and a wafer processing system 70. Ions which are generated in the ion source 30 are extracted by an electrode structure (not shown) to produce a ribbon beam directed toward the pole gap of the analyzing magnet 40. As shown, the ion beam diverges in a plane parallel to the dispersive plane of the analyzing magnet 40, which is the median plane between the upper and lower pole faces 41 and 42, respectively.

In the pole gap between the upper pole 41 and the lower pole 42, the ions in the ion beam 31 are sorted according to their charge-to-mass ratio. As each individual ion enters the pole gap, its line of flight is bent into a path of radius R which is proportional to the square root of the mass of the ion. The extraction system operates to assure that all ions of the same mass have substantially the same velocity when entering the flight tube between the magnet poles so that a consistent dispersion of ions will occur in the analyzing magnet. The analyzing magnet system 40 also reconverges the diverging beam due to the varying radial path lengths of the ions traversing the flight tube.

Ions having the selected charge-to-mass ratio are focused by the analyzing magnet through the aperture 51 in the resolving slit arrangement 50 to enter into the post-acceleration arrangement 60 where they are further accelerated to a preselected energy before striking the wafer 71 which is mounted on a heat sink arrangement 72 in the wafer handling apparatus 70.

Ions of a substantially different charge-to-mass ratio will pass through the accelerating magnet and be focused either to the left or to the right of the resolving slit 51 and thus be selected out of the final ion beam striking the target wafer 71.

Evolving Developments in Prior Art Ion Implanters

In the earliest ion implantation machines, the ion source aperture was typically a small hole approximating a point source. To achieve higher ion beam currents, the size of the circular aperture was increased, but it was soon discovered that there was a limit to the increase in size of a circular aperture which would give an ion beam of acceptable quality. Beam instability due to an unstable plasma meniscus (the meniscus is discussed in detail below), resulted when both vertical and horizontal dimensions of the source aperture were simultaneously increased. However, it was found that, by lengthening the circular hole into a rectangular slit, higher beam currents without beam instability could be obtained. The rectangular slit was oriented perpendicular to the dispersive plane of the magnet, tracking the parallel developments in obtaining higher currents in isotope separators which utilized ion source exit slits with the same orientation to the pole pieces of the analyzing magnet. From the standpoint of ion optics, the elongated slit ion exit aperture may be considered as a continuous series of point sources which would resolve to an elongated rectangular area at the resolving slit 51.

To achieve higher and higher ion beam currents, the length of the ion exit aperture was gradually increased, but retaining the straight vertical orientation thereof as shown in FIG. 5. To accommodate the increased length of the ion exit aperture 32, the pole gap d of the analyzing magnet 40 also had to be increased to accommodate the greater beam thickness. This resulted in dramatic increases in the size, expense and power requirements of the analyzing magnet arrangement. This is illustrated in the schematic view in FIG. 6, looking horizontally at the ion beam optics parallel to the ion dispersion plane. (For convenience of illustration, the ion path has been unfolded to show the source and resolving slit in a common plane. This is a standard way of showing ion beam optics parallel to the ion dispersion plane.) The smaller length source aperture 32' could utilize an analyzing magnet having a pole gap d' substantially smaller than the pole gap d required for the longer ion exit aperture 32.

To reduce the degree of increase in pole gap required to handle an elongated ion exit aperture, some prior art machines were designed with a curved ion exit slit which produced an ion beam converging in a plane perpendicular to the dispersive plane of the magnet as shown in FIGS. 7 and 8. The curved ion exit slit 32A enables the use of a pole gap $d_a$ substantially smaller than the effective ion beam source length $d_i$. This resulted in a substantial improvement in the compactness of the analyzing magnet arrangement of the system. Although the radius of curvature of the ion source aperture must be kept relatively high, substantial improvements in overall relationship between ion beam current and magnetic pole gap were achieved using this curved source geometry.

As shown in FIGS. 7 and 8, the source 30 produces ions entering the analyzing magnet which are travelling substantially from an apparent line object located behind the source aperture 32A. The location of the line object in the prior art ion beam optics is strictly a function of the shape of the plasma meniscus, as is illustrated in FIGS. 22 and 23. (The width of the ion exit aperture in each instance in FIGS. 8, 22 and 23 is exaggerated so that the position of the line object can be seen. In practice the aperture is formed with a width in the range of 1–3 millimeters, usually around 2 millimeters, in order to maintain a stable plasma meniscus with acceptable geometry.) In FIG. 22 a concave meniscus is shown and the line object is a real line object in front of the aperture 32 at the position 31A'. In FIG. 23 a convex meniscus is shown, and this shape results in a common apparent line object behind the source aperture at the position 31B', similar to the position in FIG. 8. A stable plasma meniscus and thus a stable real or apparent line object position are critical to a stable focus of the analyzed ion beam image at the resolving slit.

FIGS. 9 and 10 illustrate that even the curved source aperture geometry has limitations if it is desired to go to higher and higher beam currents. For example, using the arrangement shown in FIG. 7, ion beams of up to 12–15 mA of arsenic were possible using a source slit length of 90 mm and a pole gap of 40 mm. However, to go to higher ion beam currents with longer source slit lengths would require a larger pole gap, as shown in FIG. 9, or would require that the ion source be spaced further away from the analyzing magnet as shown in FIG. 10. Each of these approaches to increasing ion beam current has undesirable side effects. Increasing the pole gap utilizing the approach shown in FIG. 9 has the undesirable effects described above.

While moving the ion source 30 further from the analyzing magnet 40 eliminates the need to increase the magnet pole gap, other disadvantages are introduced into the system by such a change. For example, the width of the magnet poles must be increased to handle the greater beam divergence. As the ion beam source 30 is moved further away, some of the gain in additional beam current from a longer ion exit slit is lost as a greater portion of the ion beam is neutralized in the longer line of flight region between the source and the analyzing magnet. To counteract this, larger and more expensive vacuum pumps would be required to decrease the pressure in the source-to-magnet region to avoid loss of ions as neutralized species which cannot be analyzed and focused into the resolving slit by the analyzing magnet. Thus moving the ion source 30 further from the analyzing magnet 40 produces corresponding increases in overall size of the machine which directly translates into higher costs of manufacturing and installation.

The basic thrust of ongoing developments in current generation ion implanters to increase ion beam current for achieving higher wafer throughput continues to utilize the ion beam optics depicted in FIGS. 5–10. Accordingly, systems utilizing this geometry have dramatically increased the size and cost of both beam line components and associated vacuum pumping equipment in pursuit of higher ion beam currents.

FIGS. 10–13 illustrate a modified version of the prior art ion optics arrangement which has been proposed by G. Aston in an article in the September 1981 issue of REVIEW SCIENTIFIC INSTRUMENTS and entitled "High Efficiency Ion Beam Accelerator System." This system utilizes a source with a two dimensional arrangement 32A of ion exit apertures in a hexagonal array as shown in the enlarged view of FIG. 13. The longer dimension of the array of apertures is in a plane perpendicular to the ion dispersion plane of the magnet 40. The apertures are formed such that the centerlines of each row converge to a common intersection point close in front of the source. A focusing grid 36 is positioned in front of the array 32A of ion exit apertures and is biased to form individual focusing lenses for the beamlets from the individual ion exit apertures. In this manner the individual beamlets extracted from the individual apertures are directed toward a common line object in front of the source as they are accelerated by the extraction electrode 37.

In this modified system, the ion beam is produced from an ion emission envelope which has a magnitude of extension in a plane parallel to the ion dispersion plane which is greater than the width of the thin exit slit in the source shown in FIG. 5. Each of the individual apertures in the Aston source has a diameter of 0.082 inch which is at the high end of the 1–3 mm (0.04–0.12 inch) range of ion source slit widths used in single slit systems of the type shown in FIG. 5. The fifty-three ion slit apertures in the array used by Aston produce an ion emission envelope which is about 0.5 inch wide and about one inch long. However, the ion beam envelope then narrows as the individual beamlets are focused toward the common line object before passing through the extraction electrode 37. Because of the requirement to focus the individual beamlets to a common line object positioned in front of the source, the overall width of the array of holes which can be utilized in Aston's proposed system is very limited. Ion beam quality would begin to decline drastically if a much wider array of apertures were used.

The use of a highly focused two-dimensional array of apertures extends the ion emission envelope parallel to the ion dispersion plane and produces an extracted ion beam with substantially greater ion current density than is produced in a single ion exit slit. In the Aston source the degree of practicable extension of the ion emission envelope in planes parallel to the ion dispersion plane is very limited, both by practical considerations of source fabrication and the beam quality and limited beam divergence required in an ion implantation system for semiconductor components. Further extension of the Aston source beyond the five rows of apertures would make it increasingly difficult to focus the individual beamlets to a common line object near the source and unacceptable degradation in beam quality would probably result. Thus further increases in overall ion beam current from the Aston source would require extending the ion emission envelope in a direction perpendicular to the ion dispersion plane as is typical in prior art systems.

The Aston source achieves the effect of increasing the width of the ion extraction slit without loss of stability of the plasma meniscus because the overall integrated shape of the meniscus, i.e. the geometry of the meniscus considered as a single meniscus across the ion emission envelope, is maintained by the physical geometry of the apertures. The quality of the line focus is dependent upon the use of the focus grid 36 to optimize beamlet focussing at the extraction electrode aperture. The beamlets are shown in FIG. 12 as parallel, ribbon beams, but in practice each beamlet would have a focal point at the extraction electrode 37.

SUMMARY OF THE INVENTION

Objects of the Invention

It is the principal object of this invention to provide improved ion implantation systems and methods.

It is another object of this invention to provide an ion implantation system and method capable of producing higher ion beam currents than prior art systems while simultaneously reducing the overall size of the ion implantation apparatus.

It is another object of this invention to provide an improved ion source arrangement.

It is another object of this invention to provide an improved ion source arrangement which contributes to reduction in overall size of ion implantation equipment.

It is another object of this invention to provide an ion beam source having improved operating characteristics.

It is another object of this invention to provide an ion beam source arrangement having improved beam uniformity.

It is another object of this invention to provide an ion implantation system having an improved arrangement of beam line components.

It is another object of this invention to provide an ion implantation system having an improved beam resolving system.

It is another object of this invention to provide an improved method for producing a high current ion beam comprising a single ion species.

It is another object of this invention to provide an improved method for operating an ion source system.

Features of the Invention a. New Ion Source-Analyzing System Geometry

In accordance with one aspect of this invention, a system for implanting ions into a target element is provided. The system includes a source arrangement for producing an ion beam and a beam analyzing arrangement (typically an analyzing magnet) for selectively separating various ion species in the beam on the basis of mass to produce an analyzed beam. A beam resolving arrangement is disposed in the path of the analyzed beam for permitting a preselected ion species to pass to the target element. The analyzing means has an ion dispersion plane associated with it. The source means has an associated ion emitting envelope, including an area of substantial extension in a plane parallel to the ion dispersion plane, and produces an ion beam having an envelope which retains an area of substantial extension in a plane parallel to the ion dispersion plane throughout the region between the source and the analyzing means. The ions entering the analyzing means are travelling substantially either toward or from a common apparent line object lying in a plane perpendicular to the ion dispersion plane.

In one embodiment of the invention the ion emitting envelope is defined by a substantially continuous ion emitting region, such as a continuous elongated rectangular slot in the arc chamber of a plasma ion source.

In another embodiment of the invention the ion emitting envelope is defined by a plurality of separate ion emitting regions. An example of such a source would be one with plural rectangular apertures with each of the longer sides of each rectangular ion-emitting aperture, being parallel to the ion dispersion plane.

As mentioned above, it has apparently been the universal belief of artisans and experts in the field of ion sources for ion implantation that it was necessary to limit the width of the ion exit slit of the source to a dimension in the range of 1–3 millimeters in order to maintain a stable ion beam and to have sufficient resolving power. It has been discovered, in accordance with this invention, that it is possible to have an ion exit slit substantially wider than 3 millimeters, e.g. up to five or six millimeters and still maintain a sufficiently stable beam. This discovery facilitates obtaining substantially greater amounts of raw beam current from the ion source. For example, in a prototype system in accordance with this invention, raw beam currents of 28 milliamps of boron and 67 milliamps of arsenic were extracted from a source having an exit slit width of 5 millimeters and a length of 100 millimeters. "Raw beam current" refers to the ion beam current arriving at the resolving slit.

In accordance with this invention the source arrangement may include an ion source together with an electrode arrangement for extracting and accelerating ions from the ion source and a collimating arrangement positioned between the electrode arrangement and the analyzing system for substantially eliminating from the ion beam passing through the electrode arrangement ions which are on paths which deviate substantially from paths which lead to or from the common apparent line object. In the case of an ion source arrangement which includes one or more elongated rectangular ion exit apertures in a plasma source arc chamber, the collimating arrangement may be utilized to remove from the ion beam ions having paths which deviate substantially from paths which lead to or from the common apparent line object due to thermal energy velocity components of the individual ions in the beam.

In another arrangement, the ion source may include a plurality of small ion exit apertures arranged in a predetermined configuration for producing a plurality of corresponding ion beamlets with the outline of the ion beamlets comprising the ion emitting envelope. In this case the collimating arrangement includes first and second collimating grates each having apertures aligned with corresponding apertures in the other grate and with the ion exit apertures for substantially eliminating from each of the ion beamlets those ions which have paths which substantially deviate from paths which lead to or from the common apparent line object. The ion exit apertures may be arranged in a single row, or in a regular two dimensional array of apertures, or in an arbitrary arrangement so long as the ion emitting envelope has an area of substantial extension in a plane parallel to the ion dispersion plane.

b. New Electrode Biasing Arrangement

In a preferred embodiment the source arrangement comprises an ion source means electrically biased to a preanalysis acceleration voltage. An extraction electrode is positioned in the vicinity of the ion emitting region of the source and is biased to a voltage value relative to the preanalysis acceleration voltage to extract and accelerate ions from the source in the region between the exit aperture and the extraction electrode. A deceleration electrode is positioned downstream of the extraction electrode and is biased to a voltage value relative to the extraction voltage value to substantially decrease the velocity of ions passing through the region between the electrodes. By first accelerating the ions in a high electric field region to obtain high extraction currents and thereafter decelerating the ions before entering the analyzing means, a more compact analyzing means may be used because of the reduced ion velocity.

Preferably a stabilized power supply is used to supply the preanalysis acceleration voltage to the source and an unstabilized power supply is employed to supply the voltage to the extraction electrode. In this manner the extraction electrode voltage will rapidly drop in magnitude when a spark discharge (which is an inherent characteristic of all ion implantation systems) occurs between the source and the extraction electrode. This limits the energy of, and quickly quenches, the spark without substantially affecting the velocity of extracted ions entering the analyzing means.

Despite this soft sparking bias arrangement, a condition of beam latch-up has been encountered in operation of the ion source in accordance with this invention under high current conditions. Beam latch-up occurs when a spark between the extraction electrode and the source causes the voltage on the extraction electrode to drop sufficiently that the ion beam looses focus and blows up to the point of striking the electrode itself. This results in increased current in the extraction electrode bias circuit due to ions impinging on the electrode and secondary electrons emitted therefrom toward the source. This current contribution from the beam itself maintains the voltage drop originally caused by the spark, and thus the beam remains in a latched-up condition. An approach to eliminating this latch-up condition and preventing it from having an adverse effect on the operation of the ion implantation apparatus of this invention is disclosed in a copending and commonly assigned U.S. patent application entitled "Method and Apparatus for Eliminating Latch-Up Conditions in Ion Implantation Sources."

c. New Ion Source Features

The system of this invention also features an ion source means which includes an ion source having a plurality of ion exit apertures each having a substantially rectangular configuration with the longer side thereof substantially parallel to the ion dispersion plane. The use of plural ion exit apertures is made possible by reorienting the longer dimension of the ion beam exit aperture parallel to the ion dispersion plane from the perpendicular relationship in the prior art geometry. This enables higher ion beam currents to be achieved without otherwise substantially affecting the geometry and size of the ion optics and the elements associated therewith.

In accordance with one aspect of this invention, the ion implantation system employs a source means comprising a source chamber with an elongated ion exit aperture in one wall thereof and an elongated filament-cathode disposed lengthwise within the source chamber. A biasing arrangement is employed for applying a current generating electrical potential difference across the filament-cathode to heat the cathode and simultaneously means are employed for applying an arc creating bias between the chamber and the filament-cathode to generate ions from the vapor or gas introduced into the chamber. Magnetic means are employed to apply a magnetic field parallel to the filament-cathode with a non-uniform field strength to counteract non-uniform ion generation characteristics typically observed between opposite ends of the ion source.

Preferably the source means also comprises a source chamber with a plurality of separate anode elements mounted within the source chamber with electrical isolation therebetween. A bias voltage arrangement is employed to apply separate bias voltages to the separate anode structures for independent control of the ion current generated in the vicinity of each anode structure. This further permits analysis of and control of ion current across the width of the ion beam to achieve improved beam uniformity.

It has also been found to be of importance to implement an ion source control system which gives good control over the ion current and operating conditions of the ion source. Such a system is disclosed in a co-pending and commonly assigned U.S. patent application entitled "Apparatus and Method for Automatic Control of Freeman-Type Ion Source."

d. New Beam Resolving Arrangement

An ion implantation system in accordance with this invention preferably includes a beam resolving arrangement which comprises a plurality of beam resolving elements each having a resolving aperture together with an arrangement for selectively positioning one of the beam resolving elements in the path of the analyzed beam. By providing a plurality of beam resolving elements, each of the elements may be dedicated to a particular ion species to eliminate contamination from other ion species which may be deposited on the edges of the resolving elements and later be sputtered off during an ion implanting process using other ions. In addition, plural beam resolving elements may be employed to selectively alter the final beam purity achieved by the system. For example, it may be advantageous when implanting antimony to reduce beam purity to pass both mass 121 and mass 123 of the antimony ion beam through the resolving slit to effectively increase overall antimony ion beam current.

In addition to eliminating sources of contamination in the beam resolving system, it is believed to be important to reduce or eliminate contamination from other components of the beam line. Approaches to reducing contamination are set forth in a co-pending and commonly assigned U.S. patent application entitled "Apparatus and Method for Ion Implantation." Overall reduction in contamination should assist in attaining higher yield of good devices which have been processed in ion implantation equipment.

e. New Ion Beam Generating and Analyzing Method

The method of this invention includes the step of creating an ion beam analyzing field having an associated ion dispersion plane for separating various ion species in an ion beam on the basis of mass. An ion beam is produced and directed into the ion beam analyzing field with the ion beam having an associated overall ion beam envelope which includes a cross-sectional area of substantial extension in a plane parallel to the ion dispersion plane throughout the region of travel of the beam into the analyzing field. The final step is to separate out of the analyzed beam the ions comprising a preselected ion species.

f. New Ion Source Operating Method

This invention also features a method for operating an ion source system which comprises an ion source having an ion emitting region, an extraction electrode positioned in the vicinity of the ion emitting region and a second electrode positioned substantially adjacent the extraction electrode. The method includes the steps of applying a preanalysis acceleration voltage to the ion source, applying to the extraction electrode a bias potential having a value relative to the preanalysis acceleration voltage to extract and accelerate ions from the source and applying to the second electrode a bias potential having a value relative to the bias potential value on the extraction electrode to reduce substantially the velocity of ions travelling between the the second electrode and the entrance of the analyzing magnet.

Preferably the step of applying the preanalysis acceleration voltage to the source comprises applying a stabilized potential thereto and the step of applying a bias potential to the extraction electrode comprises applying an unstabilized potential thereto so that the potential will drop rapidly in magnitude when a spark discharge occurs between the source and the extraction electrode. This limits the energy of and quickly quenches the spark as noted above.

Major Advantages of the Invention a. Smaller Machine with Higher Ion Currents

The various features of this invention contribute simultaneously to increasing dramatically the ion current in an ion implantation system while reducing the overall size of the equipment. The novel orientation of the extended region of the ion emitting envelope (e.g. the elongated ion source slit or slits in the preferred embodiment) parallel to the ion dispersion plane of the analyzing magnet, as contrasted to the perpendicular orientation in the prior art arrangement, permits at least four or five times as much ion beam current (i.e. 50 mA) of arsenic to be produced and utilized in a system smaller than prior art 10–12 mA machines. For example, in a research prototype version of a beam line which employs the ion optics of this invention and includes the wide source slit referred to above, raw beam currents of 28 milliamps of boron and 67 milliamps of arsenic have been observed. This represents a major advance in ion implantation performance and leads to most effective utilization of other improvement features of this invention, some of which would also independently improve prior art systems.

In addition, with this new source orientation, the ion source may be located much closer to the analyzing magnet regardless of whether a curved or straight ion exit aperture is utilized. This both reduces the height of the ion beam entering the analyzing magnet and reduces the ion neutralization which occurs in the region between the source and the analyzing magnet. This enables higher beam currents to be achieved with gas fed species such as boron from $BF_3$ gas. The size of the analyzing magnet is substantially reduced by use of another feature of this invention to decelerate the extracted ions between the extraction electrode and the deceleration electrode so that they have lower velocity entering the magnet. The same angle of bending of the ion beam can be achieved with a smaller analyzing magnet area and/or lower magnet power, again greatly contributing to reduced equipment size, complexity and cost.

The source/magnet geometry of this invention provides mechanical control of the plasma meniscus geometry in the ion dispersion plane and thus eliminates the need for a rotatable entrance pole on the magnet or an electrostatic focusing arrangement to focus the analyzed beam into the resolving slit.

The opportunity to stack ion source slits is provided by the ion source dispersion plane geometry of this invention, thereby enabling higher beam currents to be achieved within the same source to magnet geometry and with substantially the same magnet pole gap in the analyzing magnet.

Because of the discovery of the usefulness of a wider ion source exit slit than previously thought possible, it turns out that the ion beam from such a wide slit tends to have greater divergence. When used with the ion optics arrangement of this invention, this greater beam divergence tends to make it necessary to increase the magnet pole gap. However, it has been found that use of a homogeneous magnet with strong entry focussing provided by a fairly sharply angled entry pole face e.g. about 45 degrees) minimizes the increase in the pole gap required to handle the larger divergence of the beam.

b. Improved Source Operation

The combination of acceleration and deceleration of the ions using the extraction and deceleration electrode system of this invention also has the beneficial effect of producing a cylindrical converging lens which further reduces the divergence of the ribbon beam leaving the deceleration electrode.

By utilizing a purposely unstabilized power supply (i.e., one with limited current generation capability before decline in output voltage) to supply the voltage to the extraction electrode, very quick quenching of sparks is achieved without substantially altering the overall velocity of the ion source species entering the analyzing magnet. In prior art systems the substantial sparking which regularly occurs between the ion source and the extraction electrode is quenched only when the power supply providing the preanalysis accelerating voltage to the source runs out of current generating capability, causing a reduction in the effective accelerating potential of the ions. As the spark is between a pair quenched for a brief period of time, the ion accelerating voltage is substantially lower than normal. This may result in a contaminating ion species being focused through the resolving slit into the post-acceleration structure and into the target element itself. In a semiconductor processing operation, such contaminating ion species could reduce the yield of good devices on the wafer involved, i.e., by producing bad devices in the region of the wafers being scanned by the beam at that period of time when the contaminating ions are striking the wafer.

The system of this invention also provides the advantage of multiple resolving slits selectably positionable with respect to the ion beam to eliminate other sources of contamination in the semiconductor processing environment.

Other objects, features, and advantages of this invention will be apparent from a consideration of the following detailed description of the various features of the invention taken in conjunction with the accompanying drawings.

DESCRIPTION OF THE DRAWINGS

FIGS. 1-3 are schematic section views of a portion of a semiconductor wafer illustrating the use of ion implantation in a semiconductor process.

FIG. 4 is a schematic top plan view of a prior art ion implantation system.

29 is a schematic view of ion source biasing arrangements typically utilized on prior art ion implantation systems.

FIGS. 30 and 31 are schematic views of an ion source electrode biasing arrangement in accordance with one feature of this invention.

FIGS. 32-34 are schematic view of various preferred constructional details of components of an ion beam line in accordance with this invention.

Figure 35:
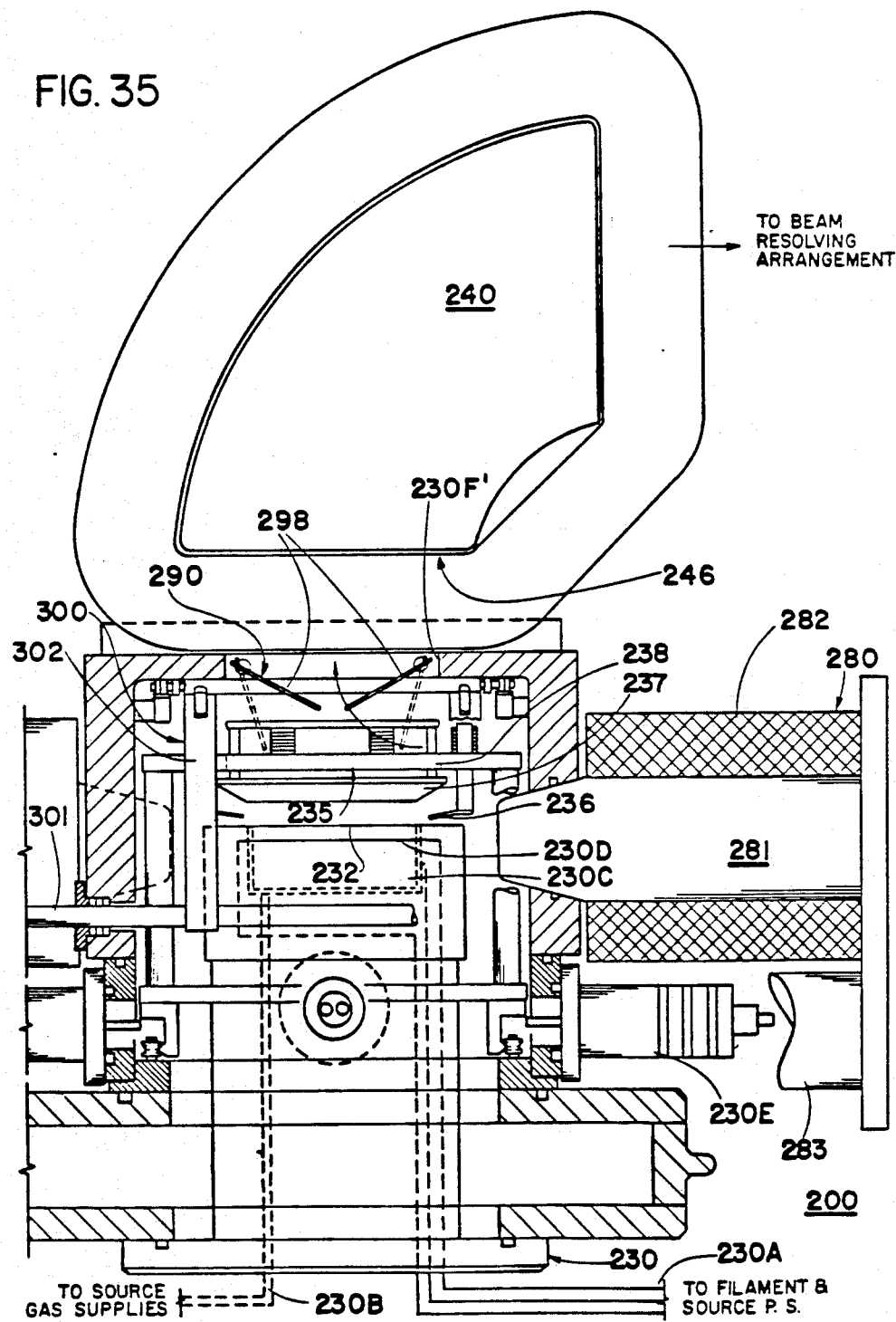

FIG. 35 is a partly sectioned side elevational view of an ion source and analyzing magnet arrangement in accordance with a preferred embodiment of this invention.

Figure 36:
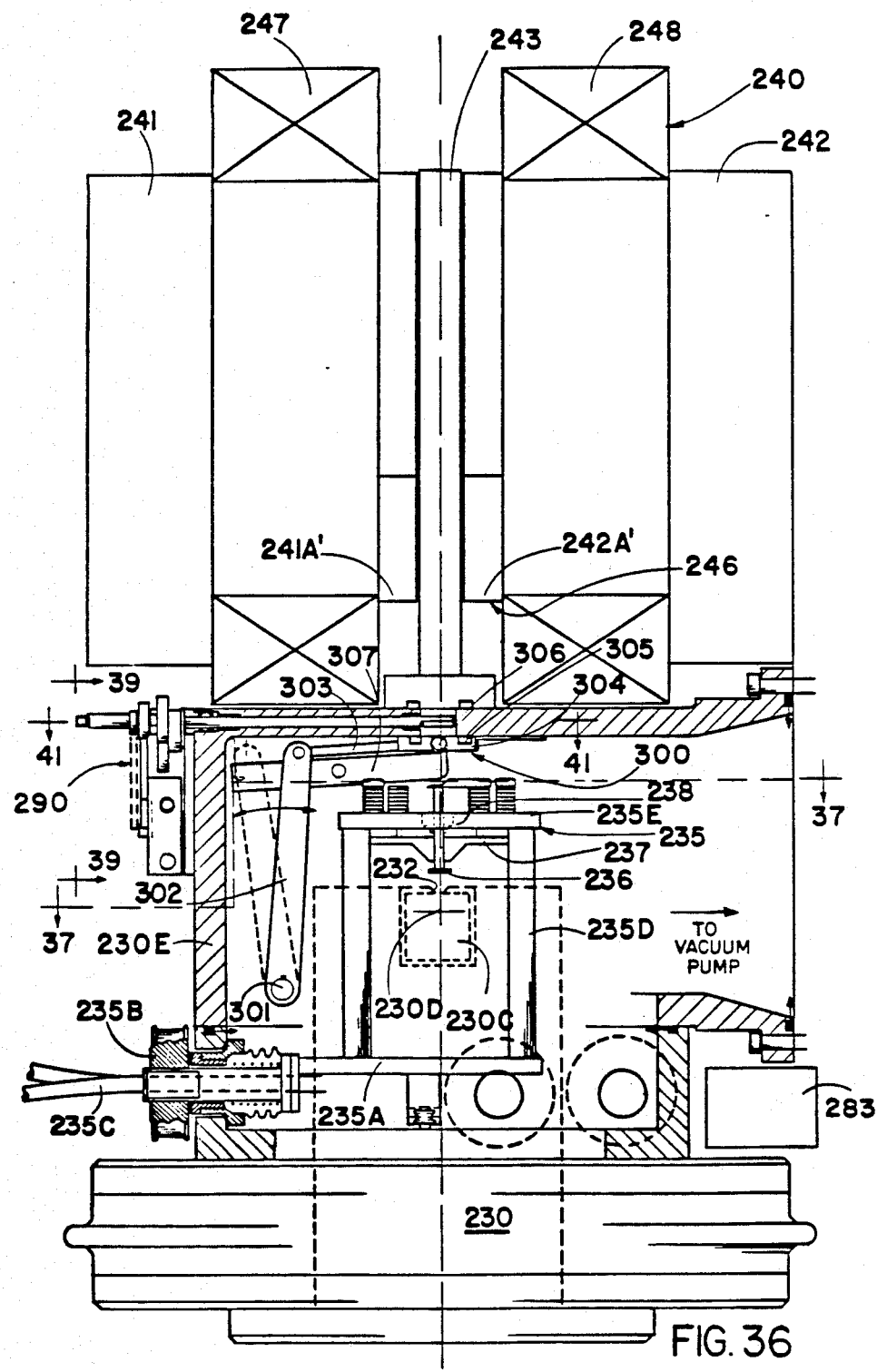

FIG. 36 is a partly sectioned front elevational view of an ion source and analyzing magnet arrangement in accordance with a preferred embodiment of this invention.

Figures 37, 38:
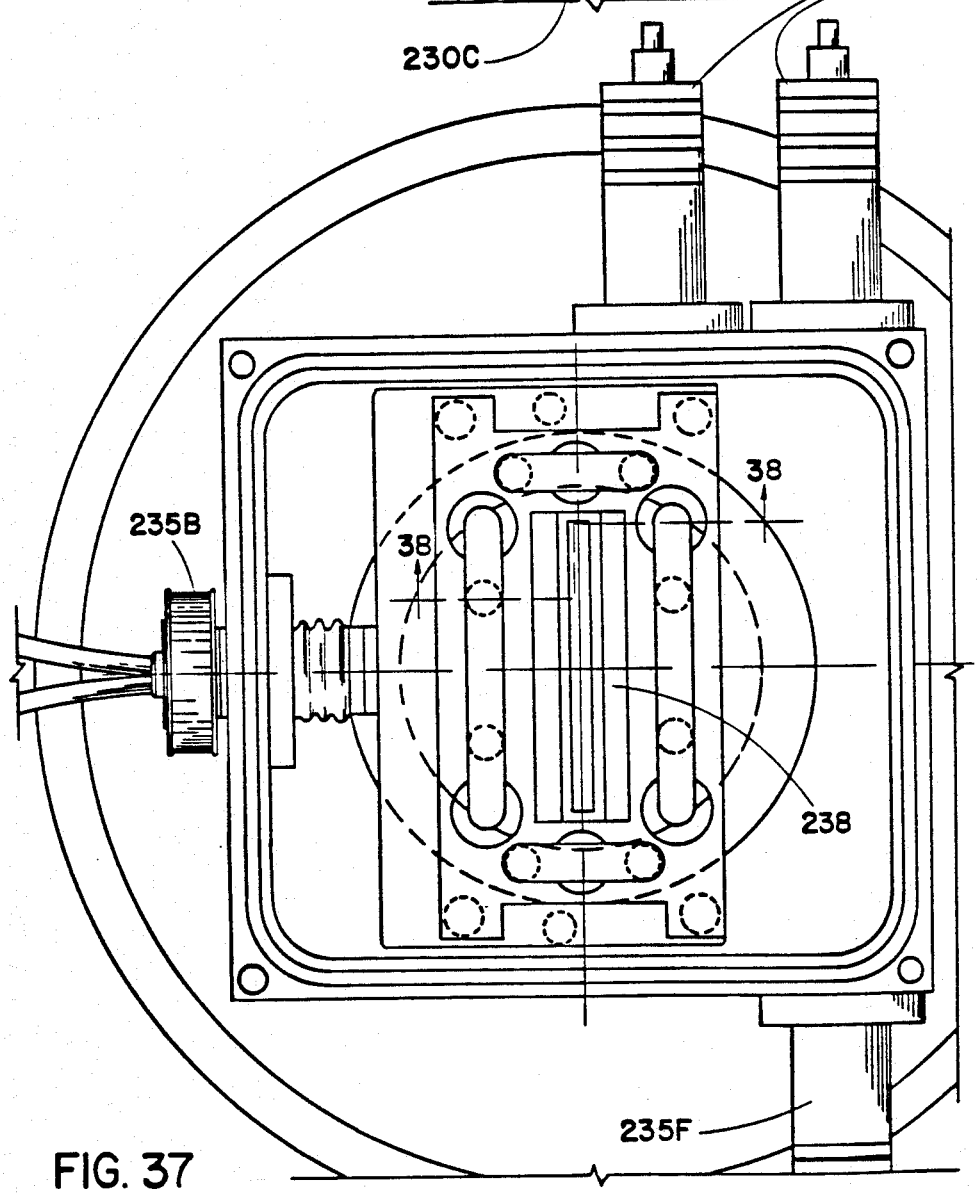

FIG. 37 is a partly sectioned plan view of portions of the ion source arrangement taken along the lines 37—37 in FIG. 36.

FIG. 38 is a partial section view of an electrode assembly taken along the lines 38—38 in FIG. 37.

Figure 39:
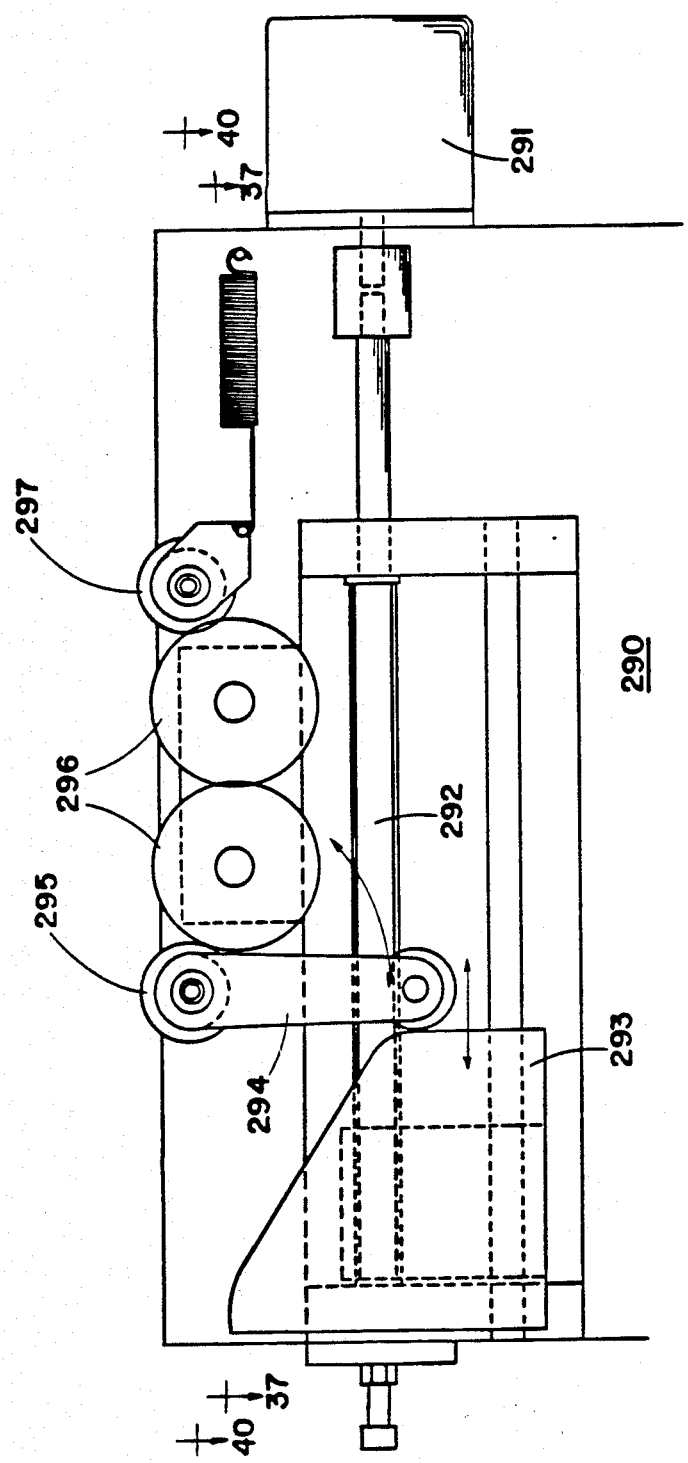

FIG. 39 is a partial side elevational view showing structural and operational details of a beam control vane arrangement taken along the lines 39—39 in FIG. 36.

Figure 40:
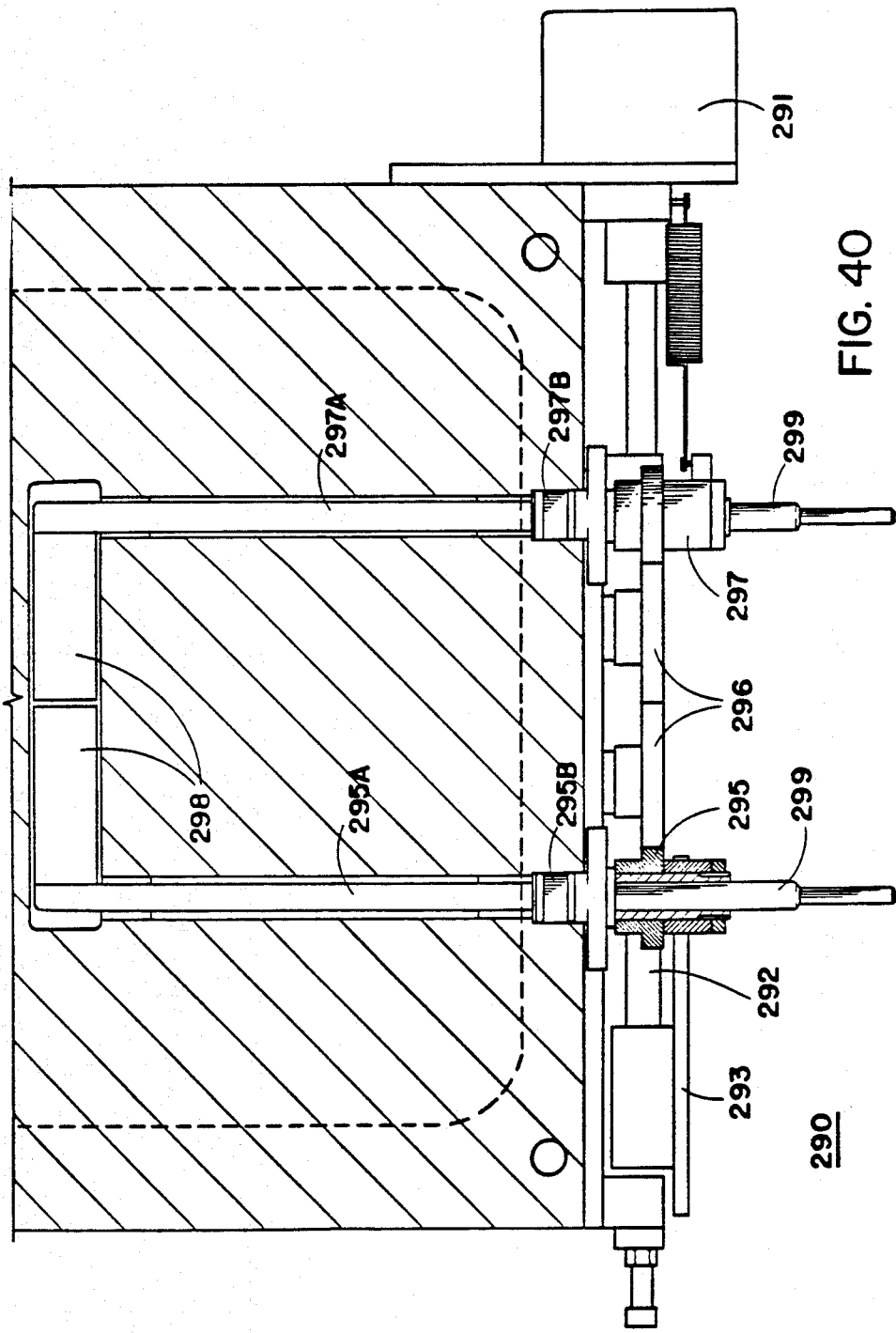

FIG. 40 is a partly sectioned top plan view of a beam control vane system in accordance with this invention taken along the lines 40—40 in FIG. 39.

Figure 41:
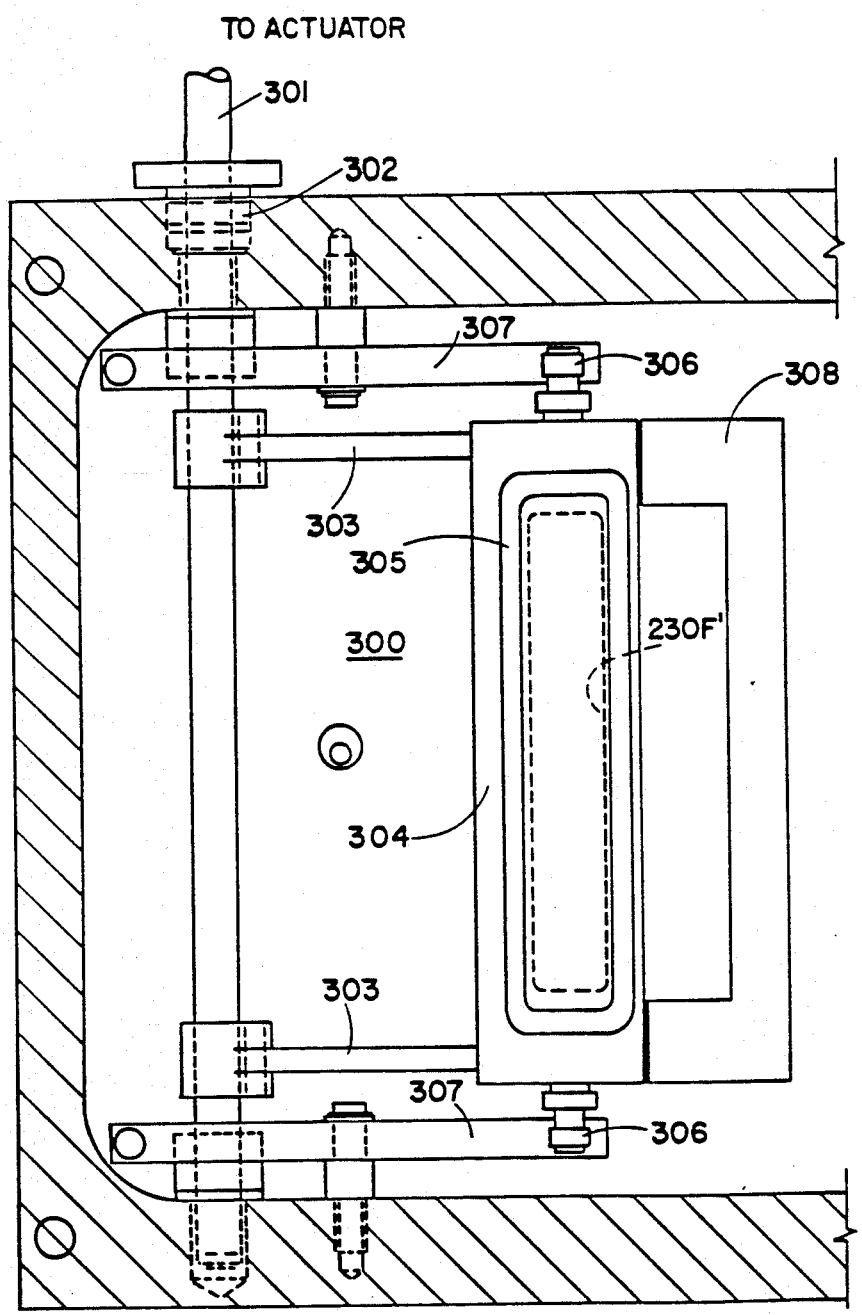

FIG. 41 is a partly sectioned top plan view of a vacuum seal arrangement taken along the lines 41—41 in FIG. 36.

Figure 42:
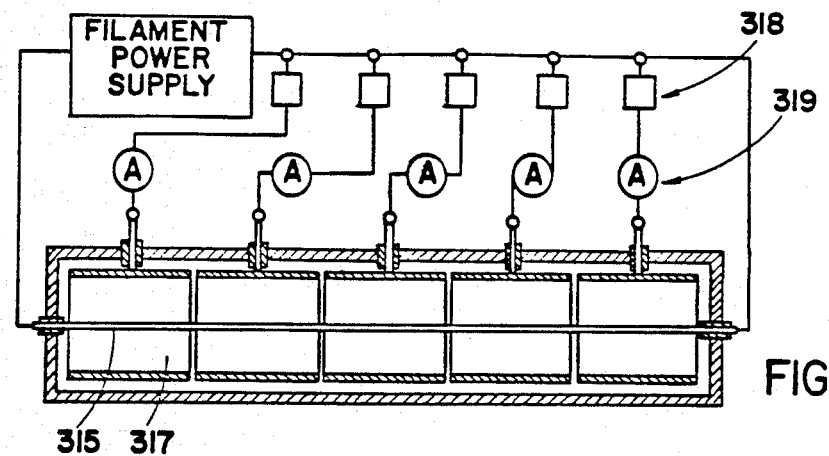
Figure 43:
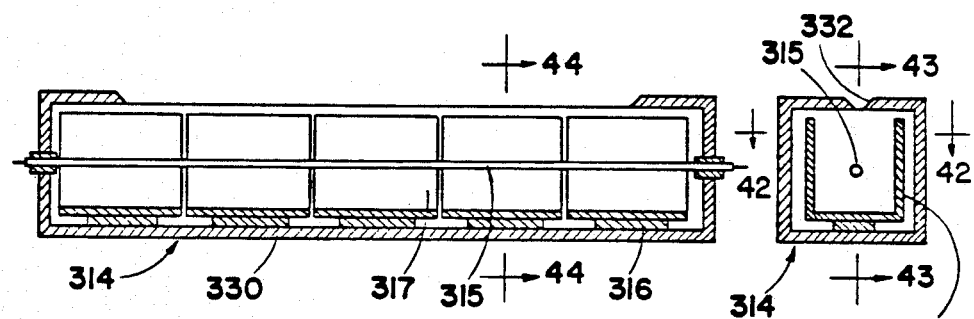
Figure 44:
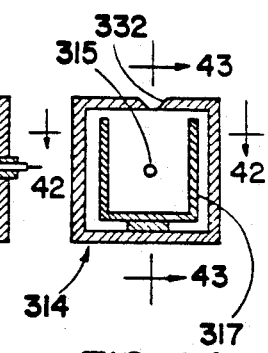

FIGS. 42-44 are partly sectioned schematic views of a preferred version of a modified Freeman ion source arrangement in accordance with this invention.

Figure 45:
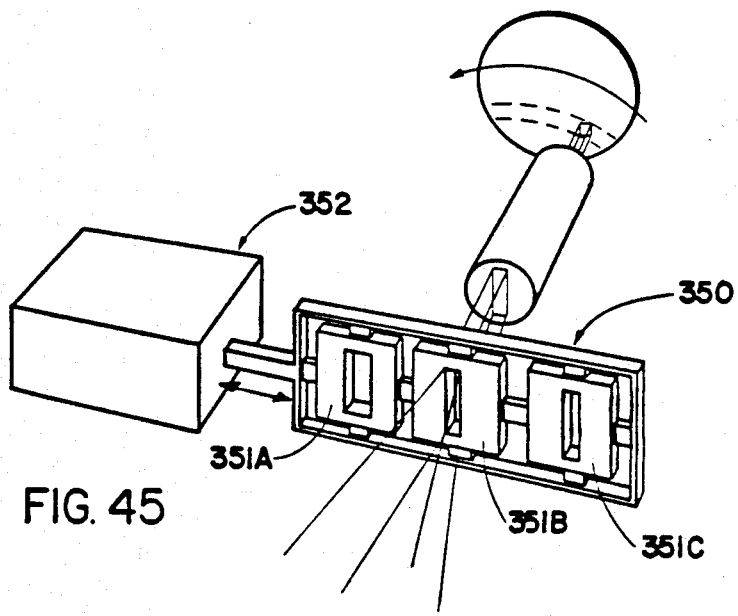

FIG. 45 is a schematic isometric view of a multiple resolving slit arrangement in accordance with one feature of this invention.

FIGS. 46-50 are schematic views of alternative embodiments of ion beam optics and beam line components in accordance with this invention.

Figure 51:
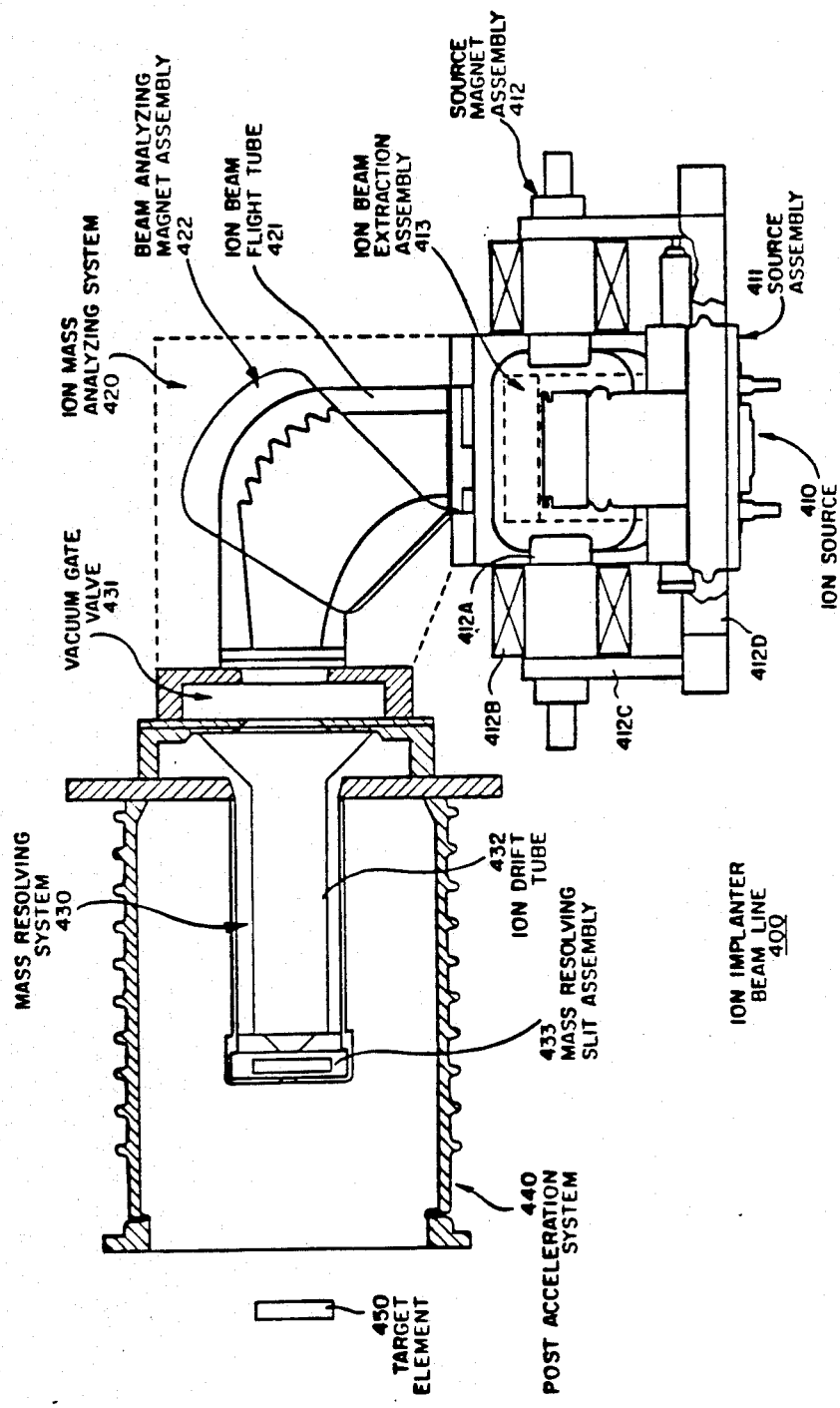

FIG. 51 is a partly sectioned elevational view of the beam line modules of an ion implantation system in accordance with this invention.

Figure 52:
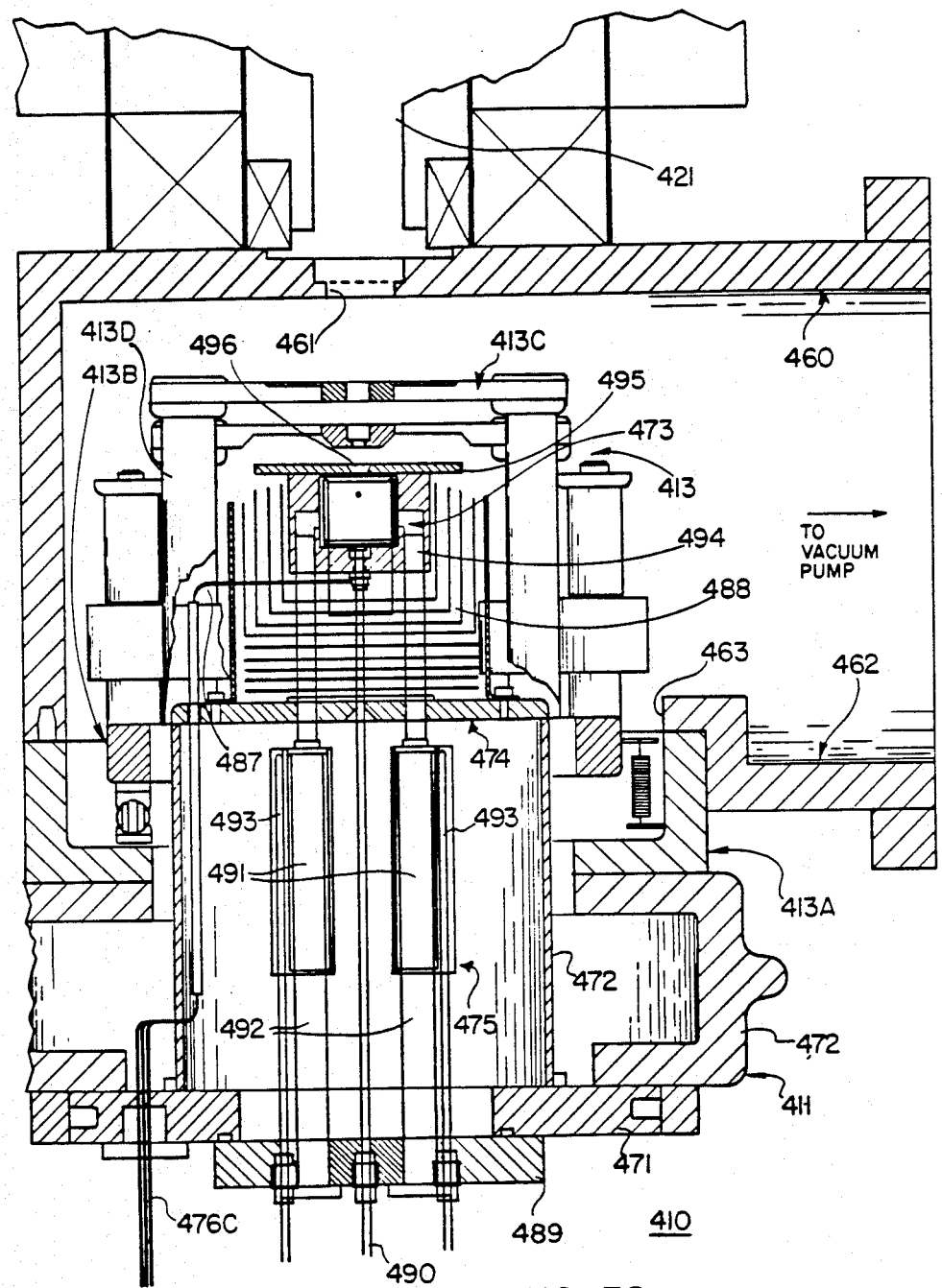

FIG. 52 is a partly sectioned, side elevational view of an ion source arrangement of source housing, ion source, and beam extraction electrode system in accordance with this invention.

Figure 53:
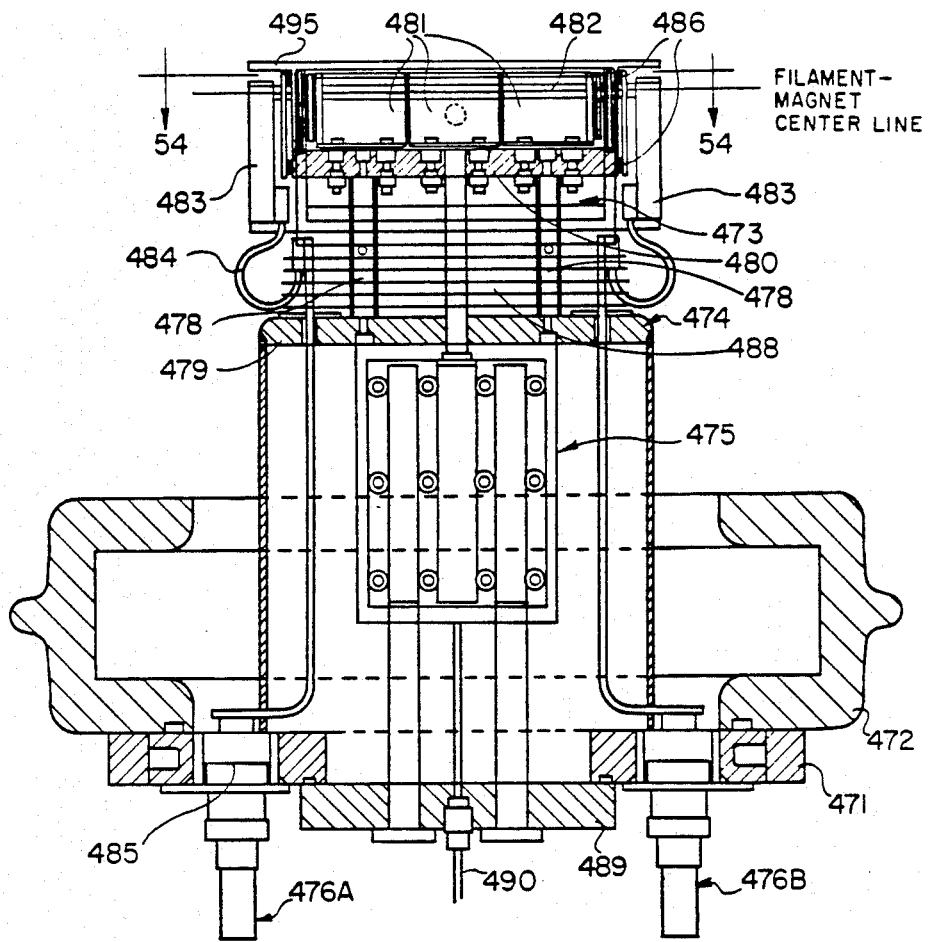

FIG. 53 is a side elevational view, partly sectioned, of a Freeman-type ion source module in accordance with this invention.

FIG. 54 is a top view of the ion source module of FIG. 53 taken along the lines 54—54 in FIG. 53.

FIG. 55 is a bottom view of the Freeman-type ion source assembly of FIG. 53.

Figure 56:
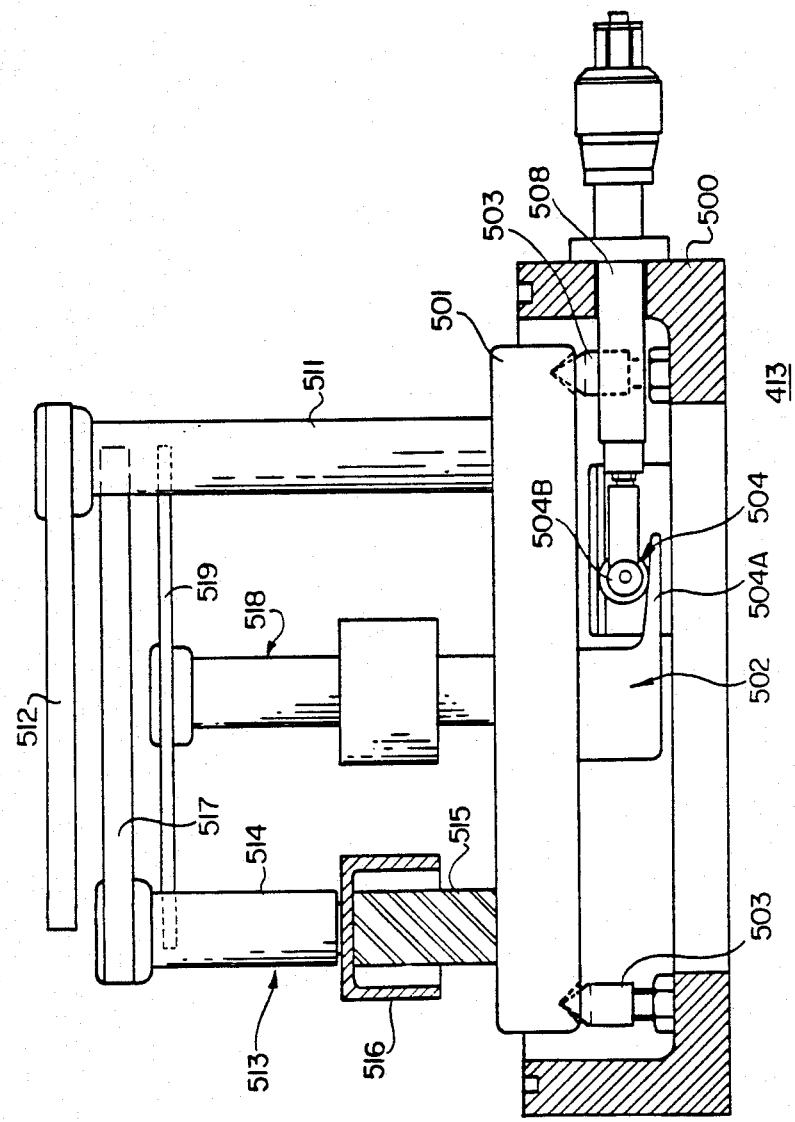
Figure 57:
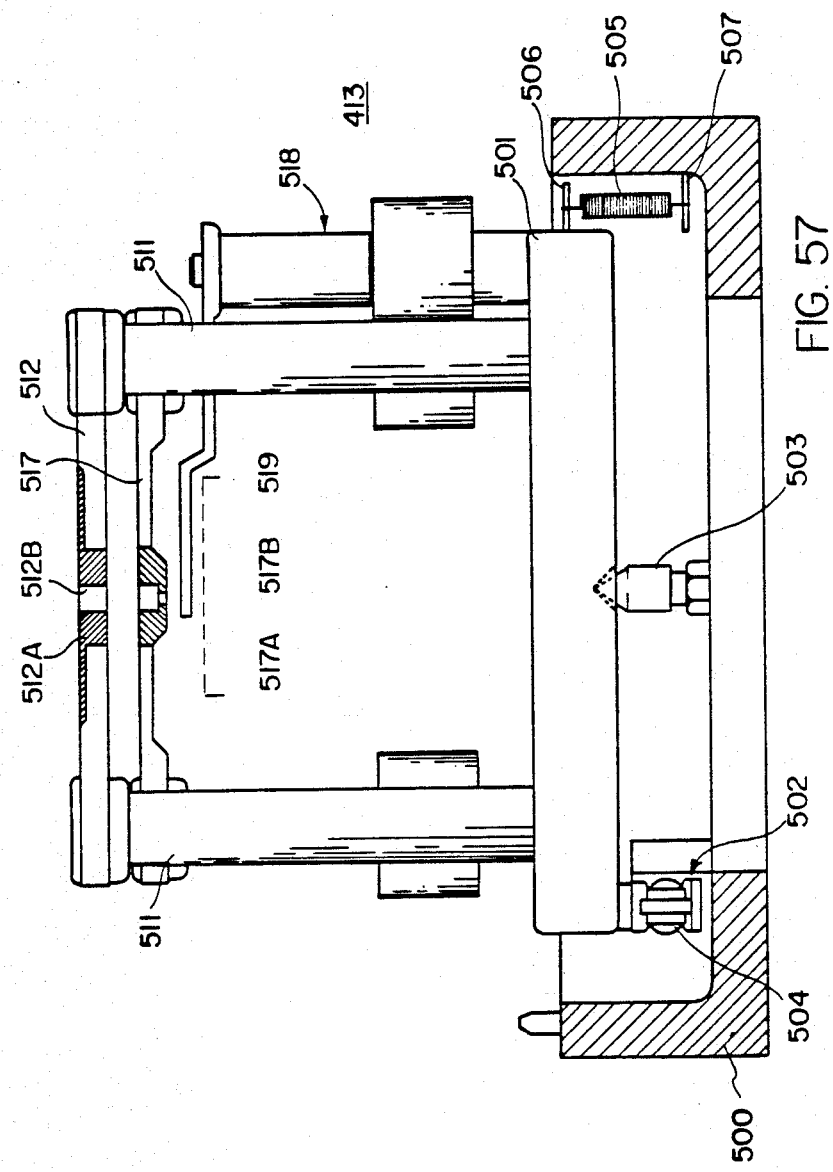
Figure 58:
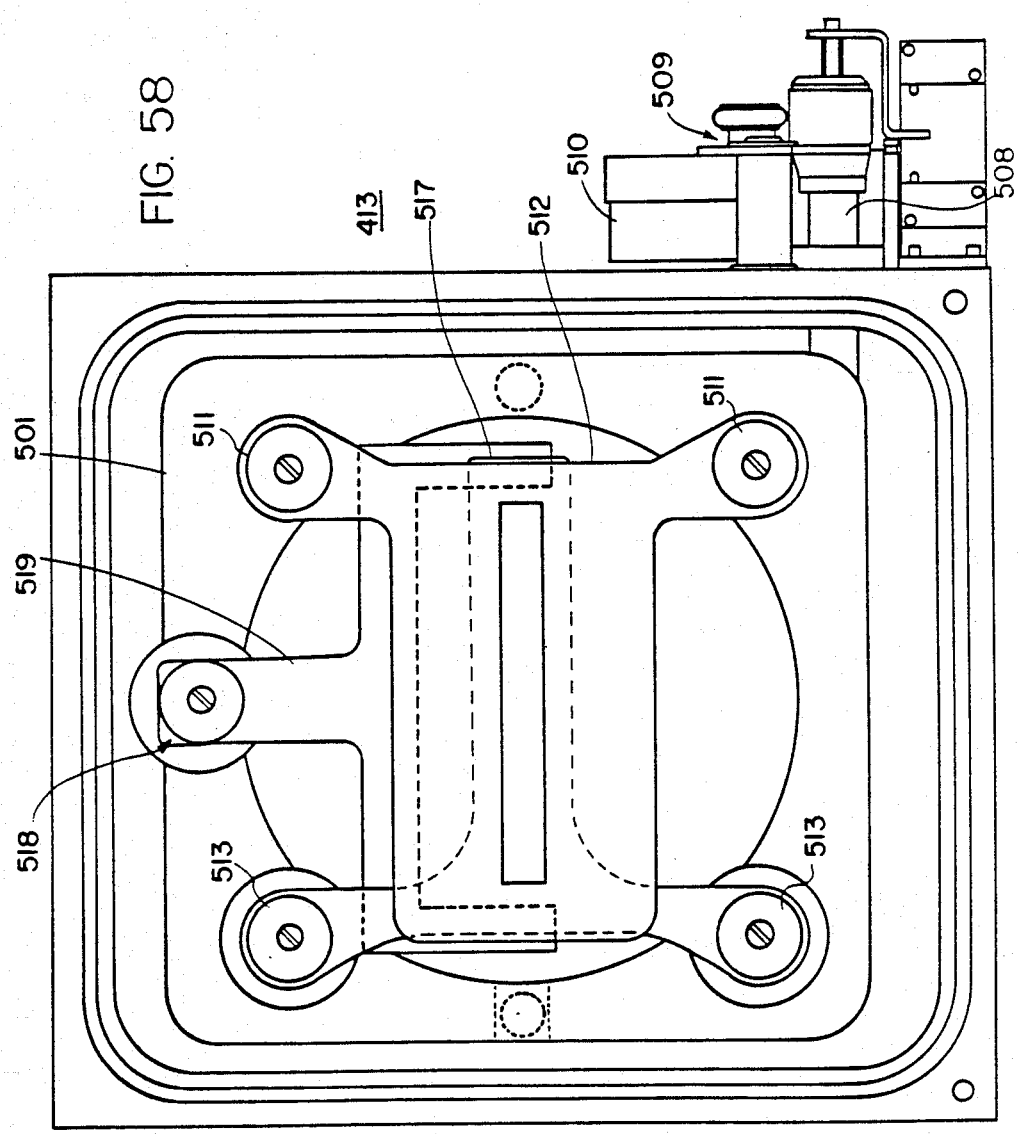

FIGS. 56-58 are front, side, and top views, respectively, of an extraction electrode module in accordance with this assembly.

Figure 59:
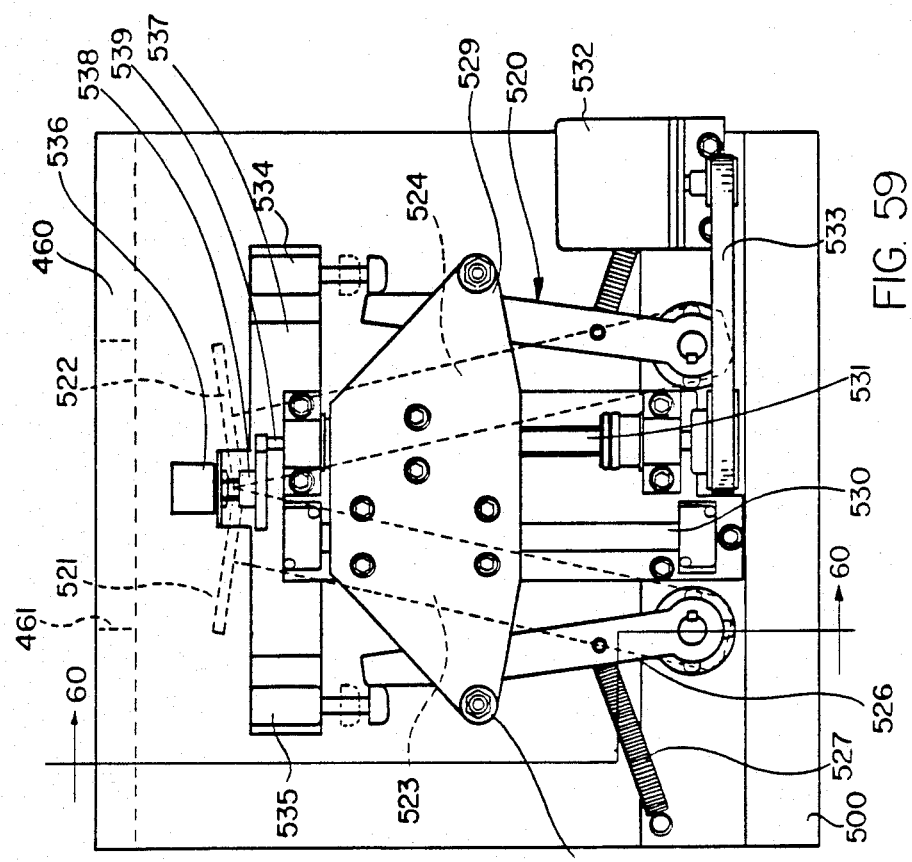

FIG. 59 is a side elevational view of a beam control vane system in accordance with this invention.

Figure 60:
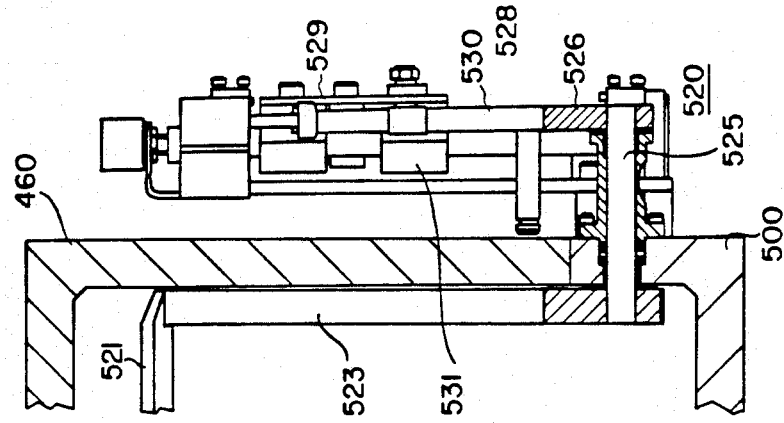

FIG. 60 is a partial section view of the beam control vane system showing FIG. 59 and taken along the lines 60—60.

Figure 61:
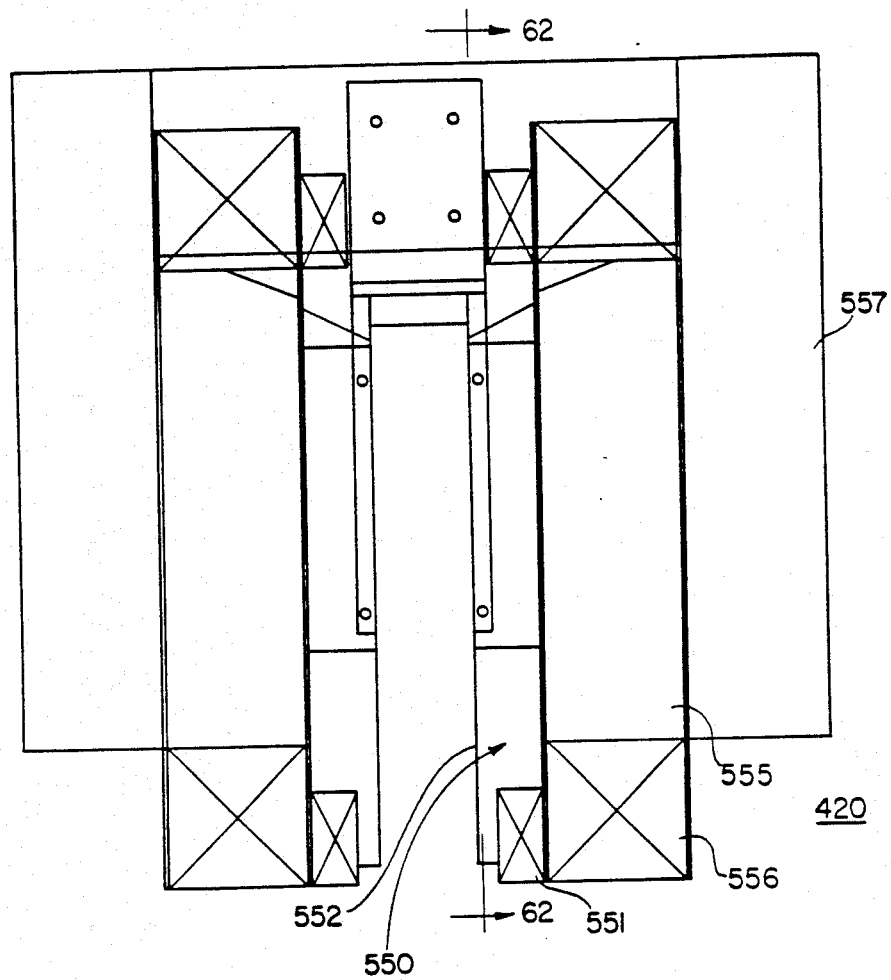
Figure 62:
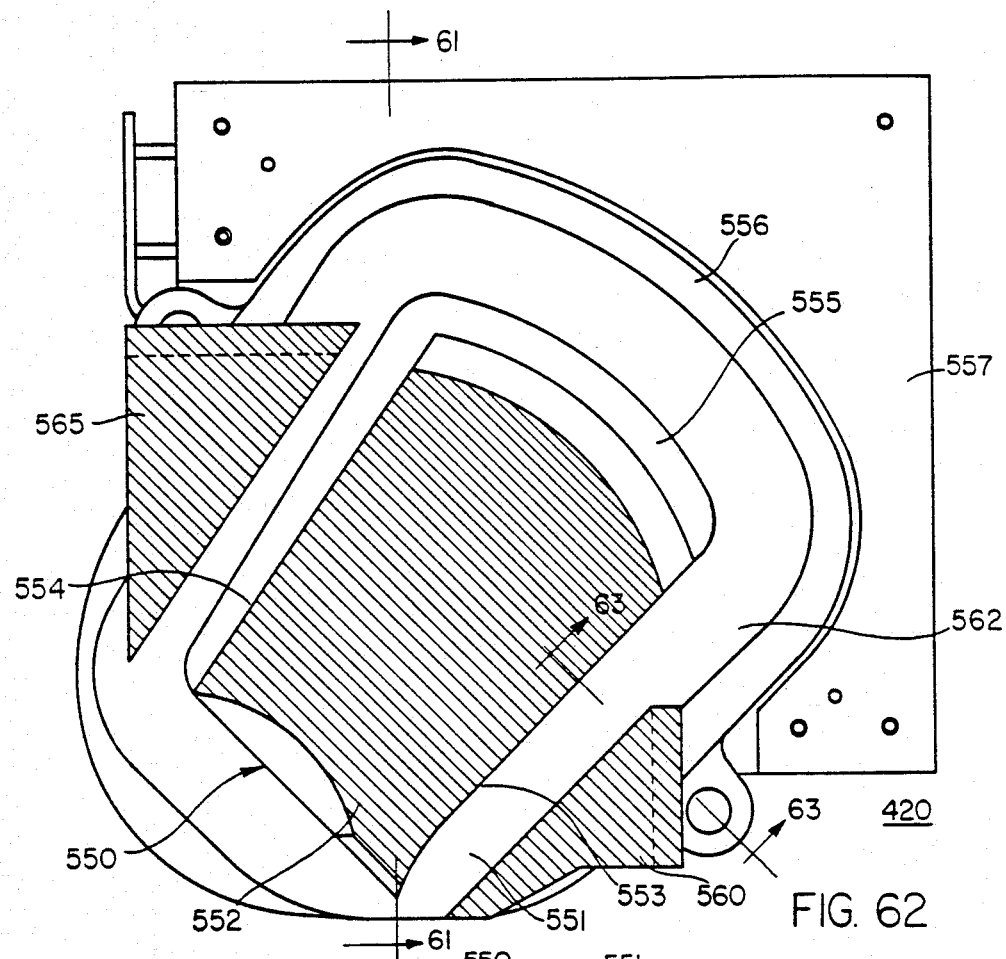

FIG. 61 is a partly sectioned front view of an analyzing magnet assembly taken along the lines 61—61 in FIG. 62.

FIG. 62 is a section view of an analyzing magnet assembly taken along the lines 62—62 in FIG. 61.

Figure 63:
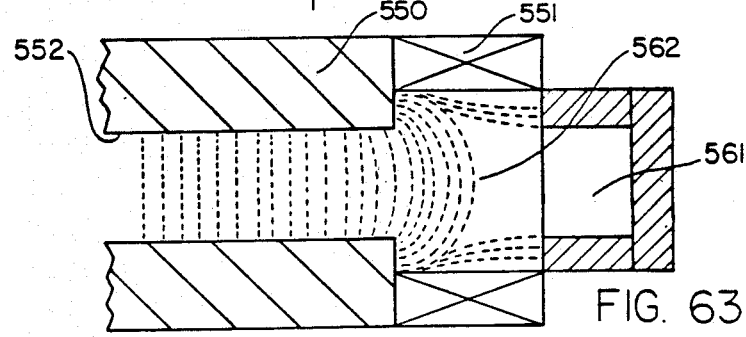

FIG. 63 is a partial section view of the analyzing magnet assembly of FIG. 62 taken along the lines 63—63 in FIG. 62.

Figure 64:
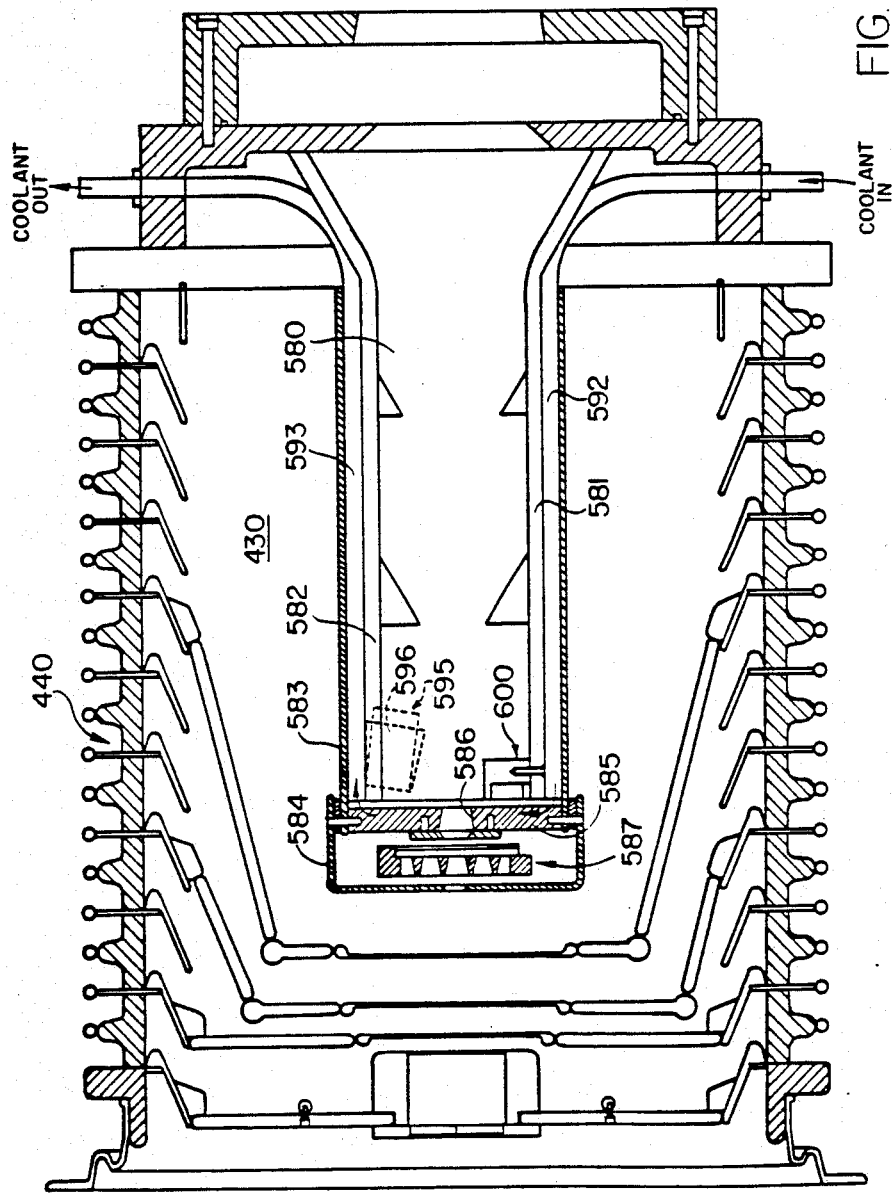

FIG. 64 is a partly sectioned side view of a mass resolving system in accordance with this invention together with a post-acceleration system.

Figure 65:
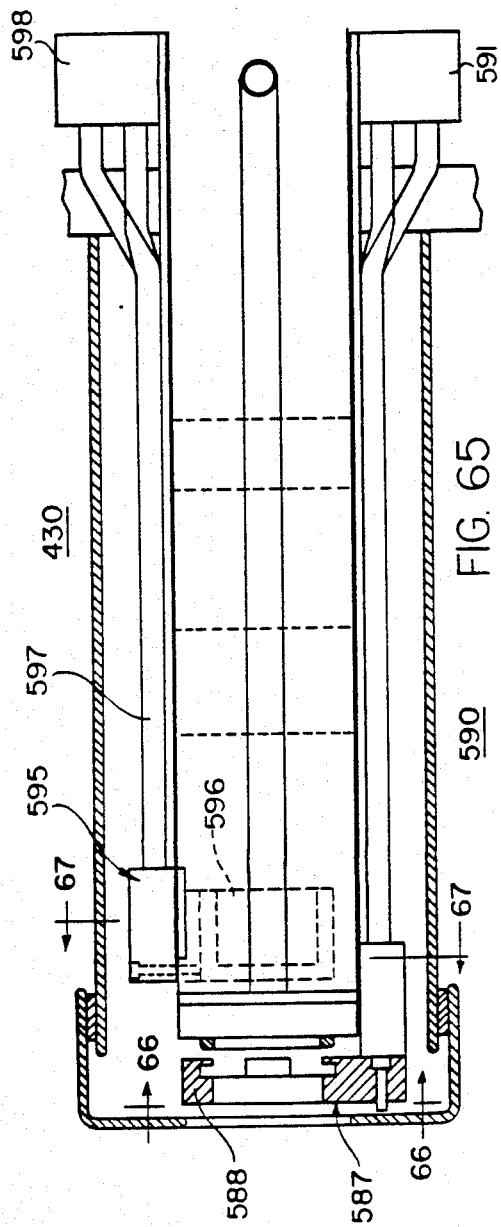

FIG. 65 is a top view of a mass resolving system of this invention.

Figure 66:
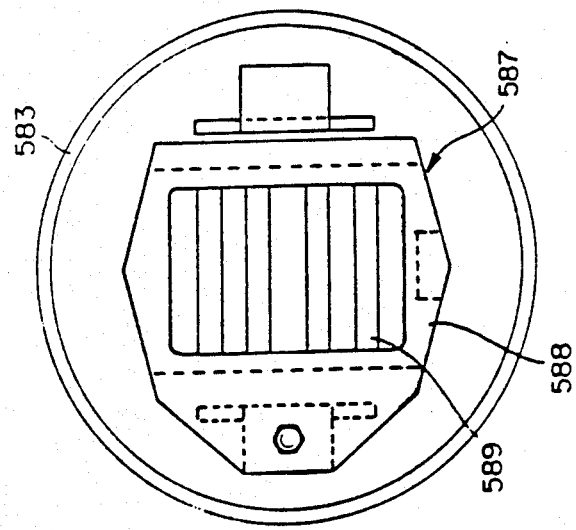

FIG. 66 is an end view of the mass resolving system of this invention taken along the lines 66—66 in FIG. 65.

Figure 67:
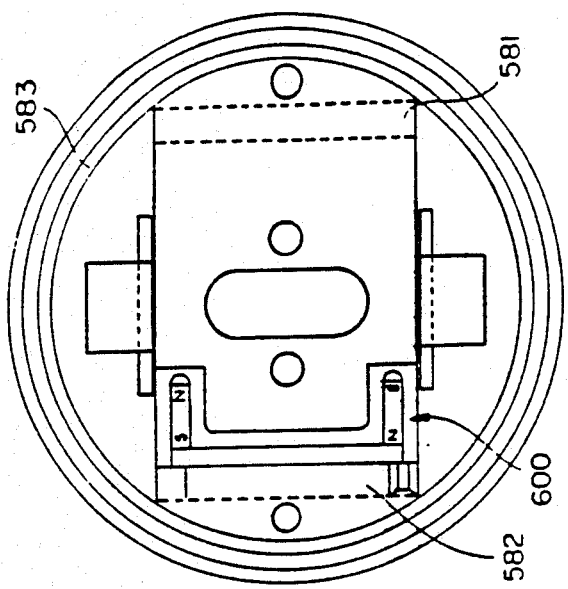

FIG. 67 is another partly sectioned end view of the mass resolving system of this invention taken along the lines 67—67 in FIG. 65.

Figure 68:
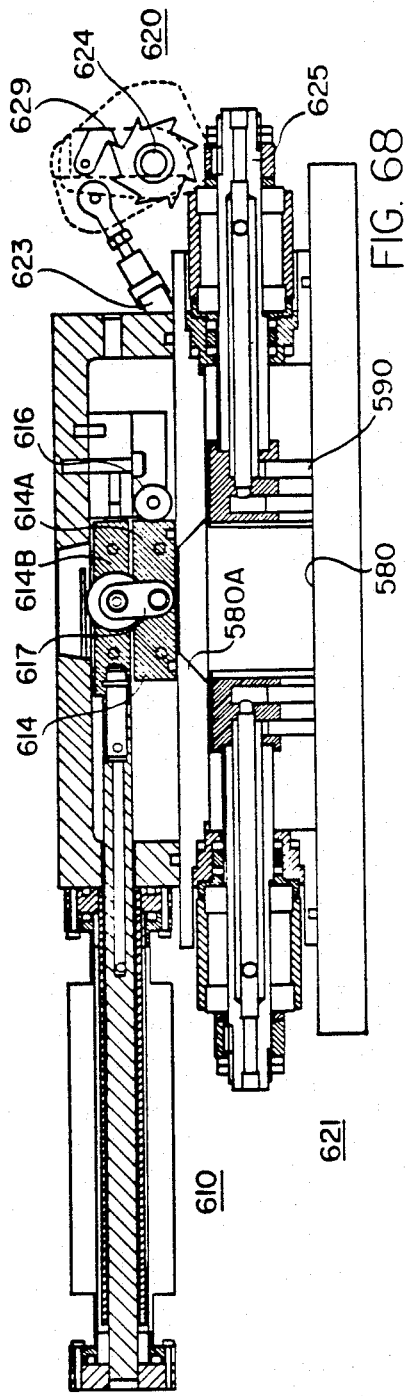
Figure 69:
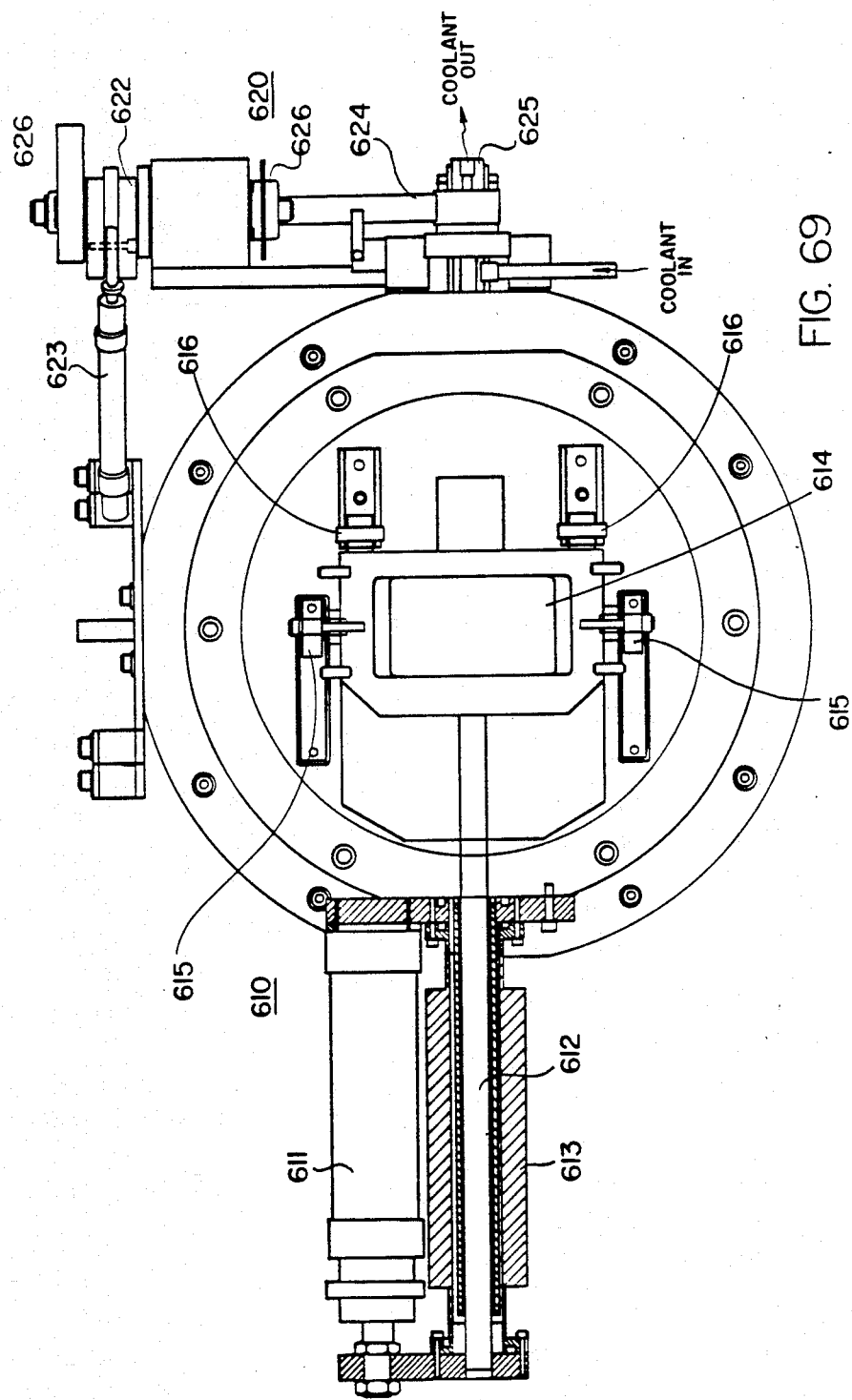

FIGS. 68 and 69 are partly sectioned views of the mass resolving system gate valve assembly and a ratchet and cam arrangement for driving the multiple resolving slit assembly and the Faraday cup assembly in the mass resolving system of this invention.

Figure 70:
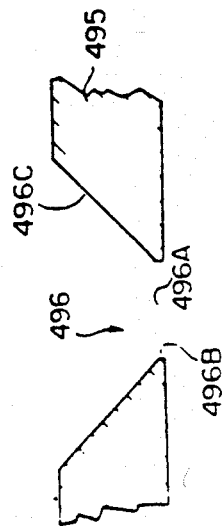

FIG. 70 is a section view showing the overall structural geometry of the source exit slit of a preferred embodiment of this invention.

DESCRIPTION OF PREFERRED EMBODIMENTS

New Ion Optics—Basic Principles

Figure 7:
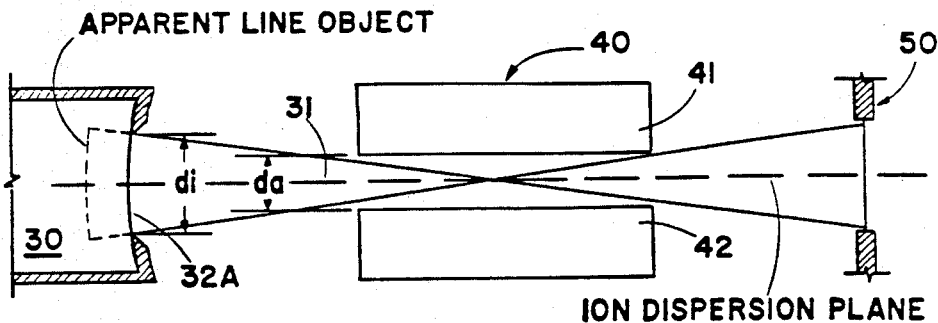
Figure 8:
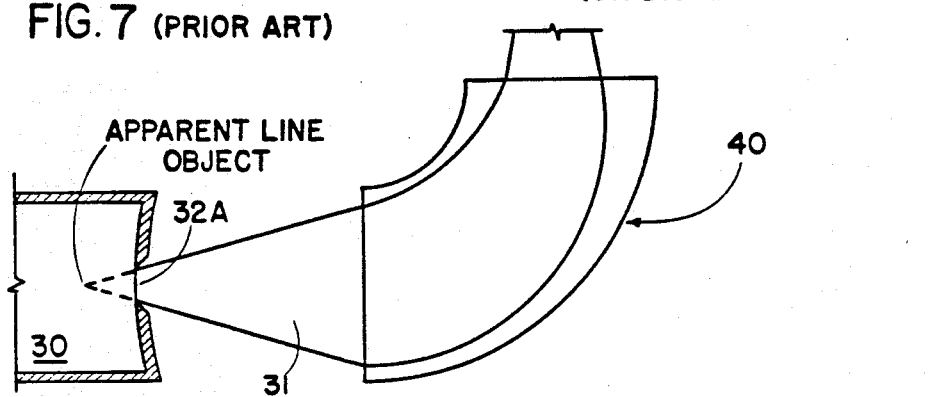
Figure 9:
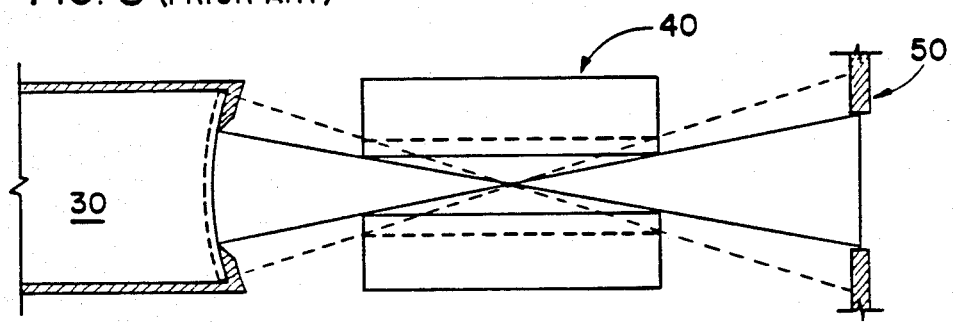
Figure 10:
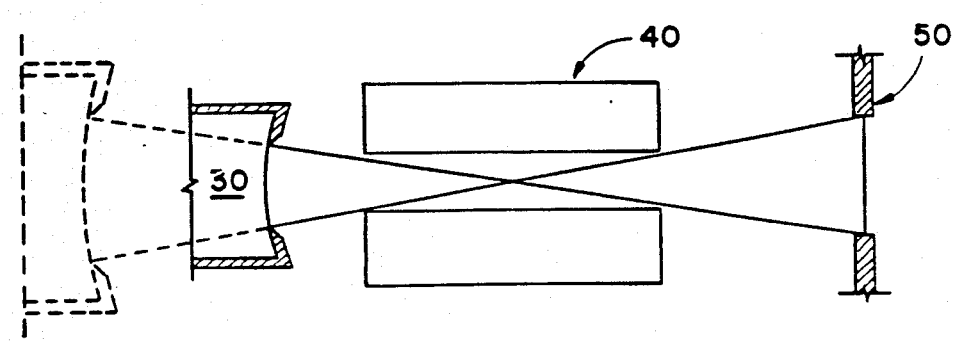
Figure 17:
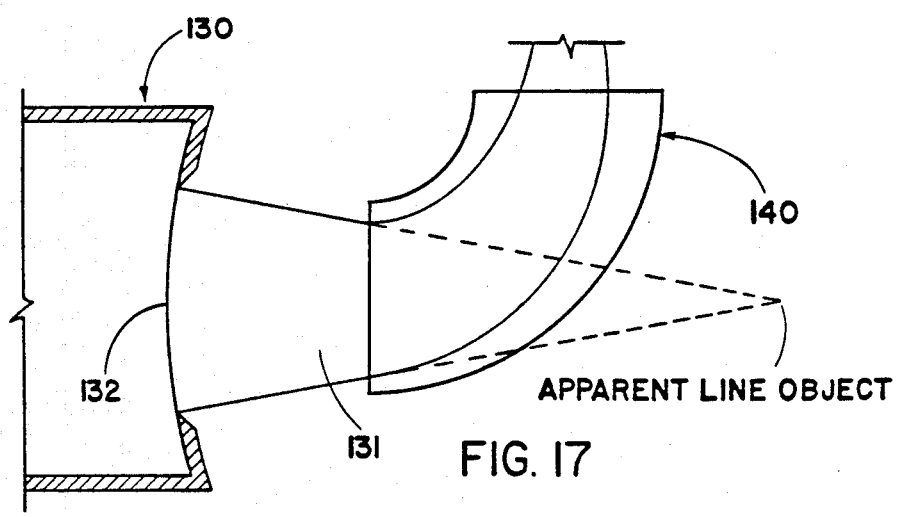
Figure 18:
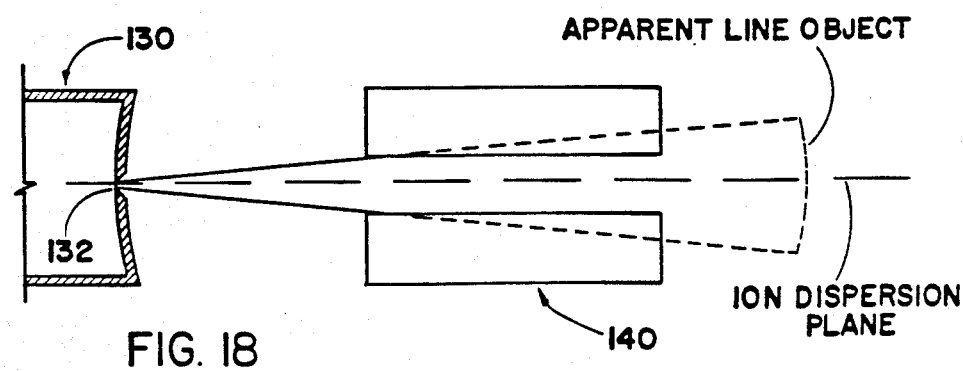

The basic differences between the ion optics of this invention and the prior art can best be seen by contrasting FIGS. 7 and 8, illustrating a version of prior art optics, and FIGS. 17 and 18, illustrating the ion optics involved in an embodiment of this invention. As shown in FIGS. 7 and 8 (together with FIGS. 22 and 23), the position of the common line object (whether apparent or real) in the prior art ion optics is determined by the shape of the plasma meniscus and not by any geometrical factors.

Figure 11:
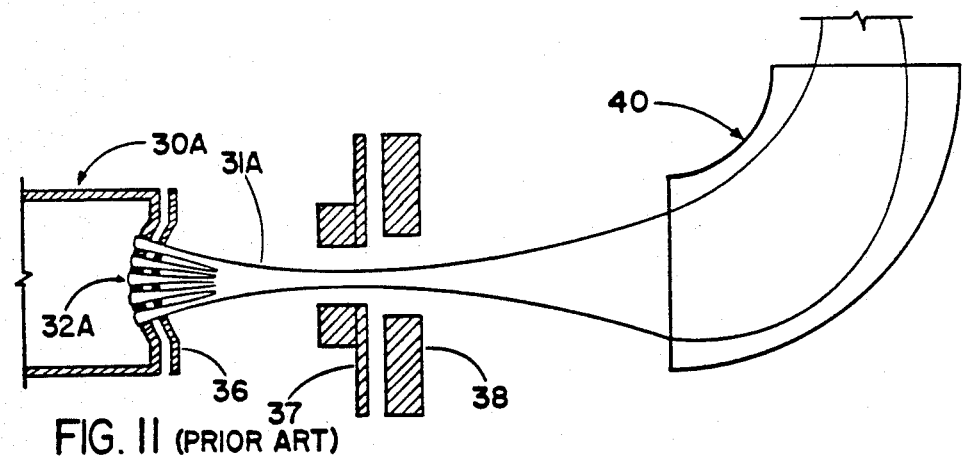
FIGS. 11-13 are schematic views of a version of ion beam optics representing a variation of prior art optics principles.
Figure 12:
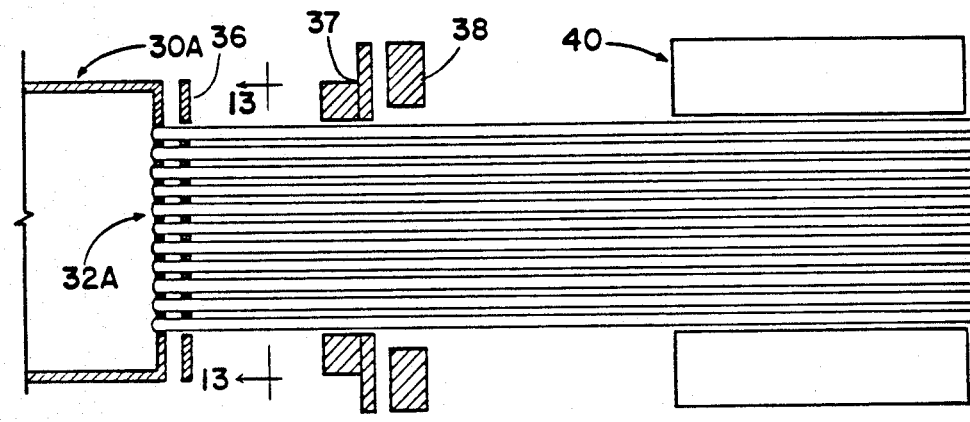
Figure 13:
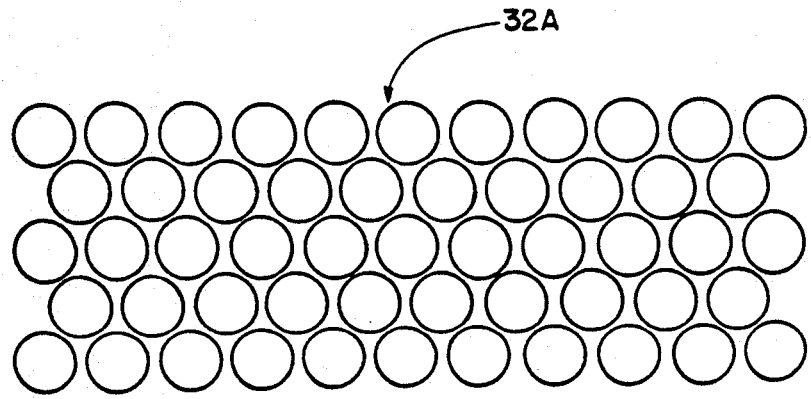
Figure 19:
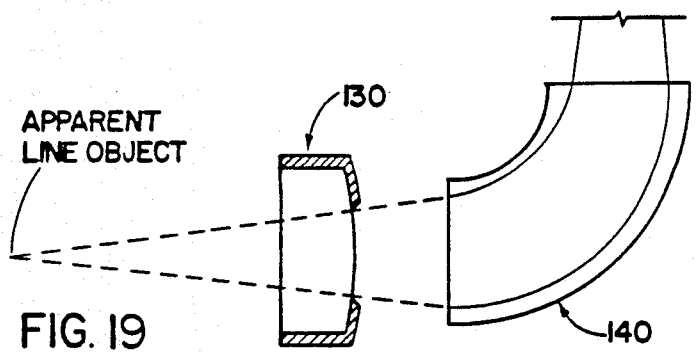
Figure 20:
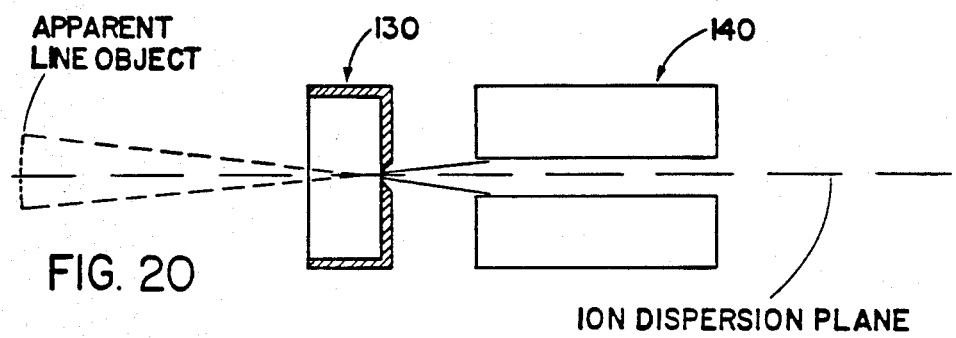

In the prior art version of FIGS. 11-13, the common line object is mechanically controlled by the common focal point of the ion source apertures and must be close in front of the source to maintain good overall beam quality. In contrast, the position of the common apparent line object in systems which employ the ion optics principles of this invention is determined solely by the geometry of the ion exit aperture or exit apertures in the ion dispersion plane and may be far in front of the source (as shown in FIGS. 17 and 18) or behind the source (as shown in FIGS. 19 and 20). If a straight ion exit slit is used, the common apparent line object is located at infinity. More importantly, the degree of extension of the ion emission envelope of the source in places parallel to the ion dispersion plane is not limited as it is in both the standard prior art approach shown in FIGS. 7 and 8 and the Aston source of FIGS. 11-13.

It is this fundamental difference which permits substantially greater ion beam current generating capacity with smaller overall equipment volume than is possible with the prior art arrangement. Stacked ion exit apertures cannot be utilized in the prior art system (except in the limited arrangement of FIGS. 11-13) because there would be no single common apparent line object of multiple source slits and multiple actual line images would appear at the resolving slit. In other words, a single analyzed ion beam with common focused images for each mass species at the resolving slit could not be achieved in the prior art system with multiple ion exit slits.

In the system of this invention multiple ion source slits can be utilized because the position of the common apparent line object is dependent on geometric factors which can be made the same for each of multiple source slits. The multiple slits will thus resolve to a single focused image for the selected mass species in the resolving slit.

Moreover, as will be discussed in detail below with respect to FIGS. 46-50 of the drawings, the ion optics of this invention would permit multiple small aperture sources of single line extension or two-dimensional extension to be utilized, provided that ion beam collimating arrangements are utilized to assure that the ions produced within the ion emitting envelope of the source which are permitted to enter the analyzing means are travelling substantially either toward or from a common apparent line object lying in a plane perpendicular to the ion dispersion plane. It is thus seen that the use of ion optics principles in this invention are radically different from and provide dramatic performance improvements in ion implantation systems.

General Arrangement of Beam Line Components

Figure 14:
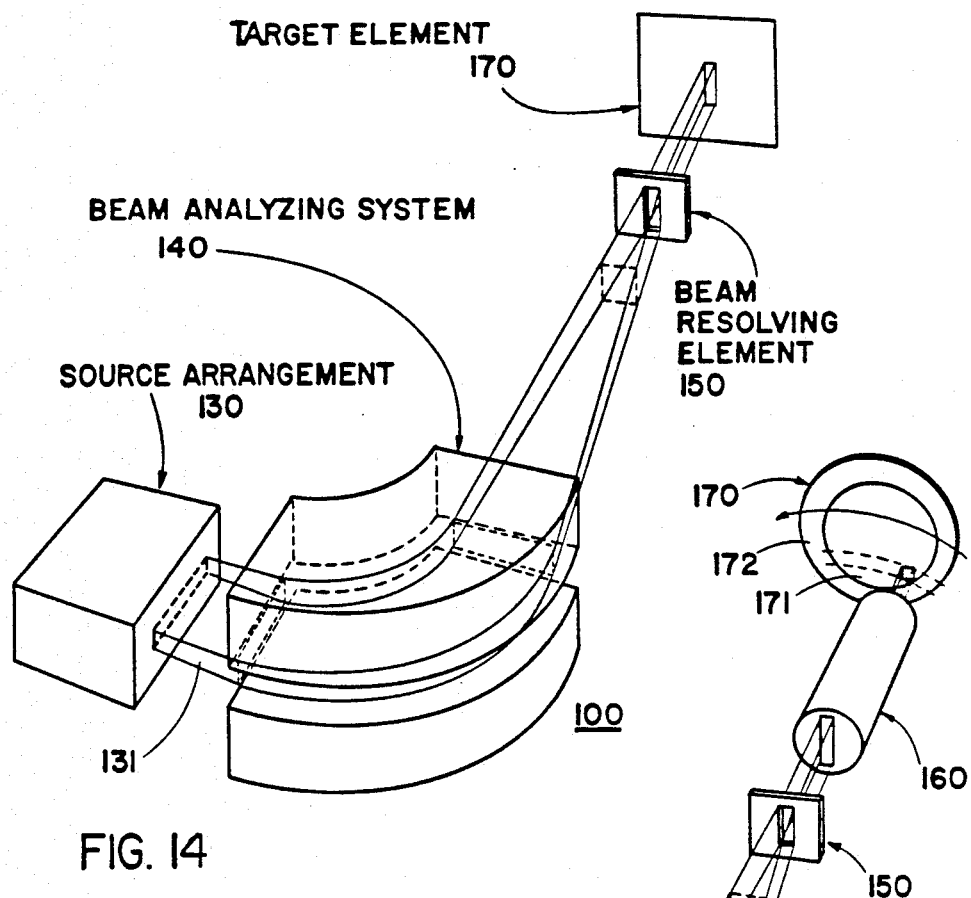
FIG. 14 is a generalized schematic isometric view of the ion beam optics utilized in systems and methods for ion implantation in accordance with this invention.

FIG. 14 illustrates the general arrangement of ion beam line components in accordance with this invention. A source arrangement 130 produces an ion beam 131 which enters the beam analyzing system 140. The source arrangement 130 has an associated ion emitting envelope including an area of substantial extension in a plane parallel to the ion dispersion plane of the beam analyzing system 140. In addition, the source arrangement 130 produces ions entering the analyzing system 140 which are travelling substantially either toward or from a common apparent line object lying in a plane perpendicular to the ion dispersion plane. This ion dispersion plane is the median plane lying between the pole faces of the beam analyzing system 140 in the case of the use of an electromagnet beam analyzing system as schematically illustrated in FIG. 14. Other analyzing systems, such as combined electric and magnetic field systems may be utilized, but at present magnetic field systems are preferred. The ion source may be a Freeman-type plasma source or a multipole plasma source as described in Ehlers et al., "Increasing the Efficiency of a Multicusp Ion Source", Rev. Sci. Instrum. 59(3) September 1982, pp 1429-1433. Other known ion sources, such as those with solid ion emitting surfaces and field emission sources may be used in some instances, but plasma sources are presently preferred for semiconductor applications.

In the case of the converging ion beam as shown in FIGS. 17 and 18, the apparent line object is in front of the ion source arrangement. In the diverging beam arrangement shown in FIGS. 19 and 20, the apparent line object is behind the ion source arrangement 130. In the case where the ion exit aperture of the source is neither convex nor concave but straight as in FIGS. 15 and 16, the common apparent line object is mathematically considered to be a line at infinity.

Figure 15:
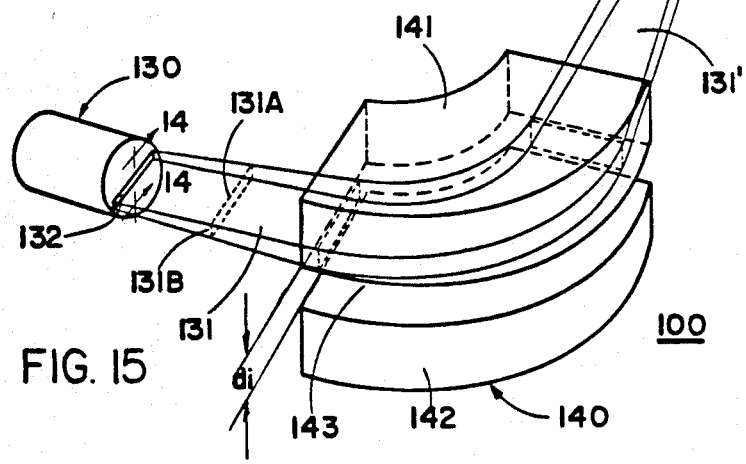
FIG. 15 is a schematic isometric view illustrating generally the ion beam optics of a preferred embodiment of this invention as applied to semiconductor processing.
Figure 16:
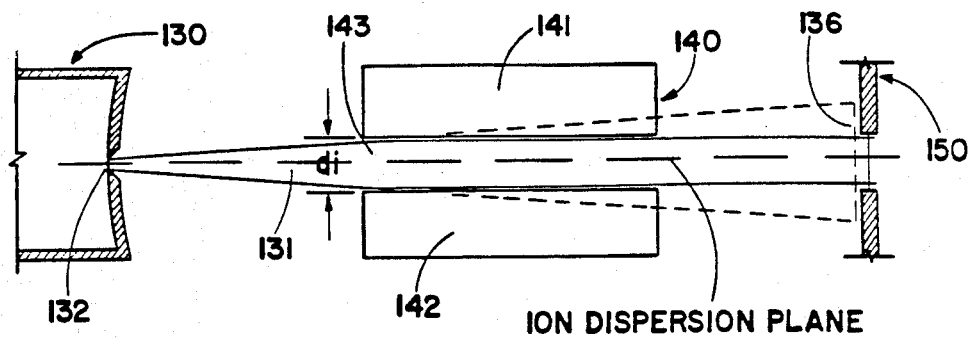
FIGS. 16-28 are schematic views of various specific embodiments of ion beam optics and ion source arrangements useful in accordance with this invention.

FIGS. 15 and 16 illustrate schematically the improved ion beam optics which are at the core of one of the principal features of this invention. (The beam line components are shown arranged in a horizontal plane for convenience of comparison to the prior art of FIG. 5, but it should be understood that the preferred orientation is as shown in FIGS. 35 and 36 with the ion beam directed vertically into the analyzing magnet pole gap.) The ion implantation system 100 shown in FIG. 15 is utilized for the purpose of implanting ions into a target element such as the semiconductor wafer 171 mounted on a heat sink 172 of a wafer handling apparatus 170. Ion implantation system 100 includes a source arrangement 130 which produces an ion beam 131. A beam analyzing means such as the electromagnet arrangement 140 receives ion beam 131 and separates various ion species in the beam on the basis of mass (i.e. charge-to-mass ratio) to produce an analyzed beam 131' exiting the analyzing arrangement 140.

The beam analyzing arrangement 140 has an ion dispersion plane which is the median plane passing through the gap 143 between the pole faces 141 and 142. A beam resolving arrangement 150 is disposed in the path of the analyzed beam 131' to permit only a preselected ion species to pass to the target element 171. Contrasted to the orientation of the source arrangement 30 in the prior art ion optics geometry of FIG. 5, the source arrangement in the embodiment of this invention shown in FIG. 15 is oriented relative to the analyzing arrangement 140 such that the longer side 131A of the ion beam cross-section is generally parallel to the ion dispersion plane of the beam analyzing arrangement 140. In the embodiment shown in FIG. 15 the source arrangement 130 includes a source means which has an ion exit aperture 132. In addition to the ion exit aperture 132 various electrode structures (not shown here but described below) would be utilized as part of the source arrangement.

As can be seen in FIG. 15, and as depicted in a schematic elevation view in FIG. 16, the ion beam 131 diverges as it travels from the ion source slit 132 toward the gap 143 of the analyzing magnet arrangement 140. As will later be discussed in some detail, because of various optional magnetic focusing arrangements, convergent focusing will be provided to preclude ions in the beam striking the ion flight tube which is positioned between upper and lower magnet poles.

As shown in FIGS. 15 and 16, the novel orientation of the longer dimension of the rectangular ion beam 131 parallel to the ion dispersion plane of the analyzing arrangement 140 and closer spacing of the source and magnet, enables a narrow pole gap $d_i$ to be utilized.

FIG. 15 illustrates the basic ion beam optics of this invention when a straight source slit 132 is utilized. In this case the ion beam 131 exiting from the source slit 132 travels straight into the analyzing magnet arrangement 140. FIGS. 17 and 18 illustrate that an ion exit slit which has a curvature, permits a substantial increase in beam current without requiring a corresponding increase in the width of the pole pieces of the analyzing magnet arrangement 140. The converging beam also decreases the convergence angle of the beam travelling through the resolving slit. The ion beams exiting from a curved source slit 132' converge to an apparent line object in a plane perpendicular to the ion dispersion plane.

Figure 5:
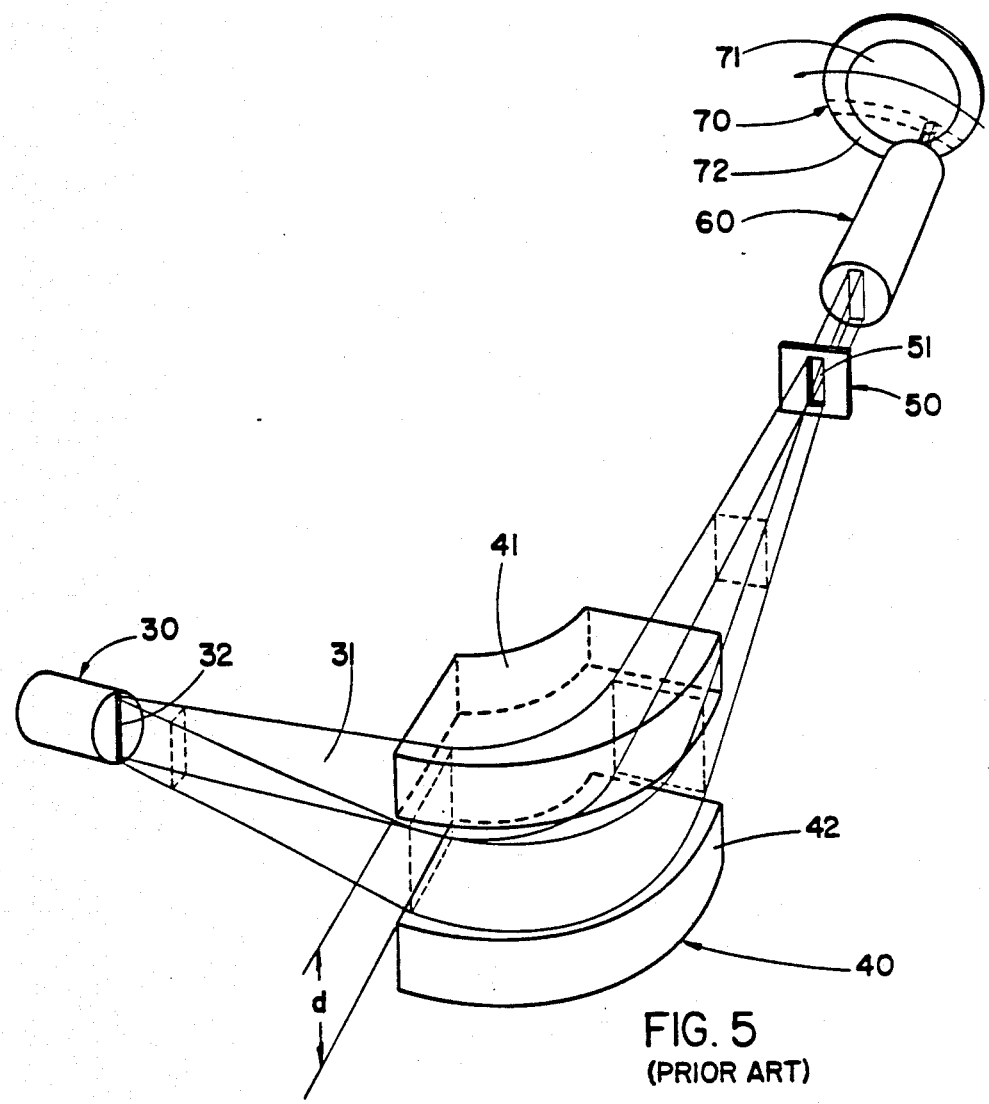
FIG. 5 is a schematic isometric view of ion beam optics used in prior art ion implantation systems.
Figure 6:
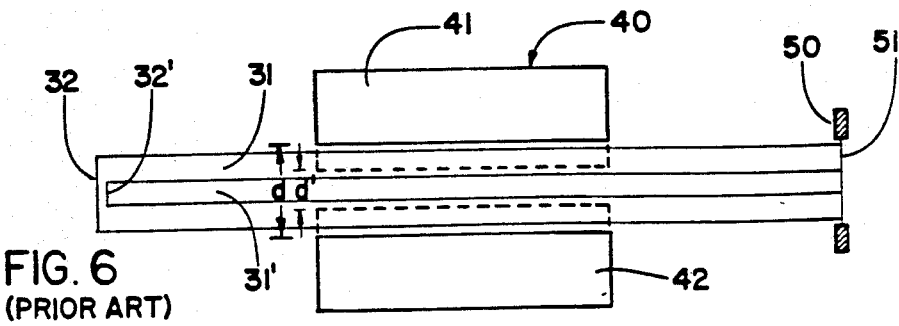
FIGS. 6-10 are schematic views of ion beam optics which illustrate the ion optics principles utilized in prior art apparatus.

As shown in FIG. 15, the ion beam 131 provided by the source 130 can be focused by the analyzing magnet arrangement 140 in essentially the same manner as the focusing accomplished by the analyzing magnet arrangement in the ion dispersion plane for the prior art arrangement as shown in FIG. 5. The image of the analyzed ion beam 131' at the resolving slit 150 has a dimension in the dispersion plane which depends on the resolving power of the ion optics arrangement including the source geometry and the resolving power of the analyzing means 140. The height of the image of the analyzed beam 131 at the resolving slit arrangement 150 depends on the finite height of the projected object 136 of the source 132 as shown in FIG. 16, and the overall degree of divergence of the beam perpendicular to the dispersion plane. This divergence depends on the degree of focusing applied to the beam perpendicular to the dispersion plane by the analyzing magnet arrangement or by the combination of the analyzing magnet and a separate electrostatic lens 180 shown in FIG. 21.

It is an advantageous feature of this invention that electrostatic focusing may be employed to alter the divergence of the beam in the plane perpendicular to the ion dispersion plane. Such electrostatic focusing reduces loss of ions from the beam which might otherwise strike the ion flight tube positioned between pole faces of the analyzing magnets and enables the pole gap of the analyzing magnets to be reduced, thereby contributing to overall smaller size and reduced power requirements for the analyzing magnet. This electrostatic focusing produces no interference with the resolving power of the ion optics arrangement because the electrostatic focusing action is not in the ion dispersion plane.

Electrostatic focusing in the dispersion plane, as would be required in the prior art source arrangement of FIG. 5 to reduce the divergence of ion beam 31, would affect the resolving power of the system if very high quality optics were not provided. Such high quality ion optics are difficult to achieve. In general, in the field of ion optics, high quality electrostatic lenses can be provided if the power of the lens is weak and only the center of the lens is used. Strong electrostatic lenses typically are of low quality and the aberrations of such a lens would affect the resolving power if applied in the ion dispersion plane. As will be discussed more fully below, the ion optics of this invention permits advantageous combination of electrostatic focusing of the ion beam and a combined acceleration-deceleration of the ion beam to make further substantial contributions to reduction in the overall size of the beam line in an ion implantation system.

Figure 22:
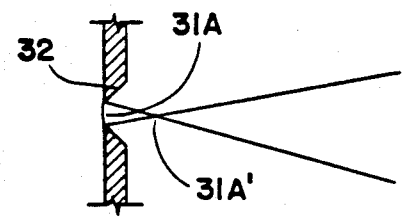
Figure 23:
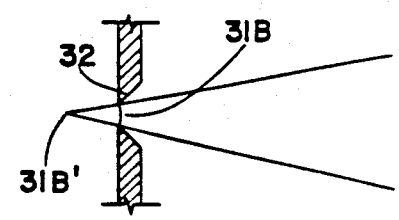

As shown in FIGS. 22 and 23, a conventional plasma source such as the Freeman source with an elongated ion exit aperture has either a real or virtual line source geometry close to the aperture 32 depending on the curvature of the plasma meniscus in the aperture from which the ions are extracted. As shown in FIG. 22, the ion plasma meniscus 31A has a concave shape, whereas the plasma meniscus 31B in FIG. 23 has a convex shape. The shape of the plasma meniscus depends on a number of factors, including the ion extraction potential between the source and the extraction electrode structure (discussed below). The plasma meniscus 31A produces a real line source 31A' close to and in front of the aperture 32 whereas the plasma meniscus 31B produces a virtual line source 31B' close to and behind the aperture 32.

In the prior art embodiment shown in FIG. 5, the degree of divergence of the ion beam 31 in the ion dispersion plane is determined by the shape of the plasma meniscus. However, electrostatic focusing to reduce the divergence typically cannot be employed since, as noted above, the aberrations of the electrostatic lens would adversely affect the resolving power. By contrast, the ion beam optics in accordance with this invention, as shown in FIGS. 14 and 15, permits electrostatic focusing in the plane perpendicular to the ion dispersion plane so that the divergence of the ion beam 131 due to the shape of the plasma meniscus has relatively less effect on the width of the beam entering the pole gap of the analyzing magnet.

Variations in Source Geometry and Electrode Structures

Figure 21:
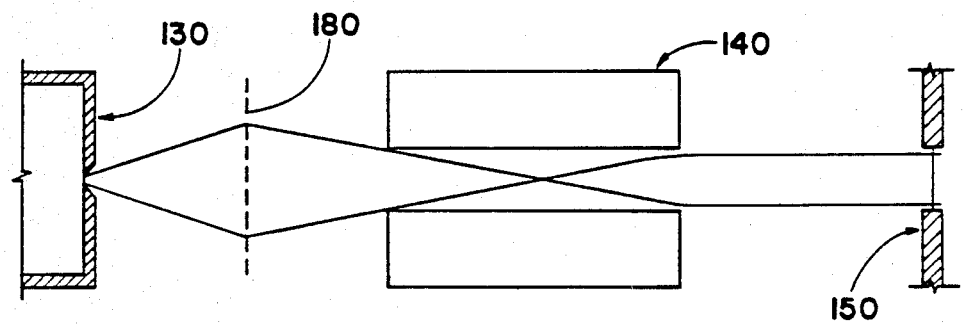

Furthermore, it can be seen that the ability to mechanically control the shape of the long dimension of the plasma meniscus in the elongated ion exit slit, as shown in FIG. 8 for the prior art arrangement and as shown in FIG. 17 for the arrangement of this invention, has radically different consequences with respect to the overall ion optics used in the two arrangements. In the prior art arrangement of FIG. 5, as depicted schematically in FIG. 8, the curved source slit enables a reduction in the size of the magnet pole gap. However, the width of the entry portion of the magnet poles cannot be reduced by electrostatic focusing of the otherwise diverging ion beam in the dispersion plane. In contrast, the ion optics of this invention takes advantage of both the ability to mechanically control the shape of the lengthwise plasma meniscus for purposes of enabling the width of the analyzing magnet poles to be less than the width of the ion source slit as shown in FIG. 17, (i.e., the ion beam width is narrower entering the pole gap than exiting from the source slit) and simultaneously using electrostatic focusing as shown in FIG. 21 to control the beam divergence in the non-dispersion plane without adversely affecting the resolving power of the system.

Increases in beam current are thus possible using the approach of this invention by electrostatic control of beam divergence in the non-dispersion plane and mechanical control of the beam convergence in the dispersion plane, both of which effectively enable higher beam currents to be achieved in a more compact source-to-analyzing magnet relationship.

Figure 24:
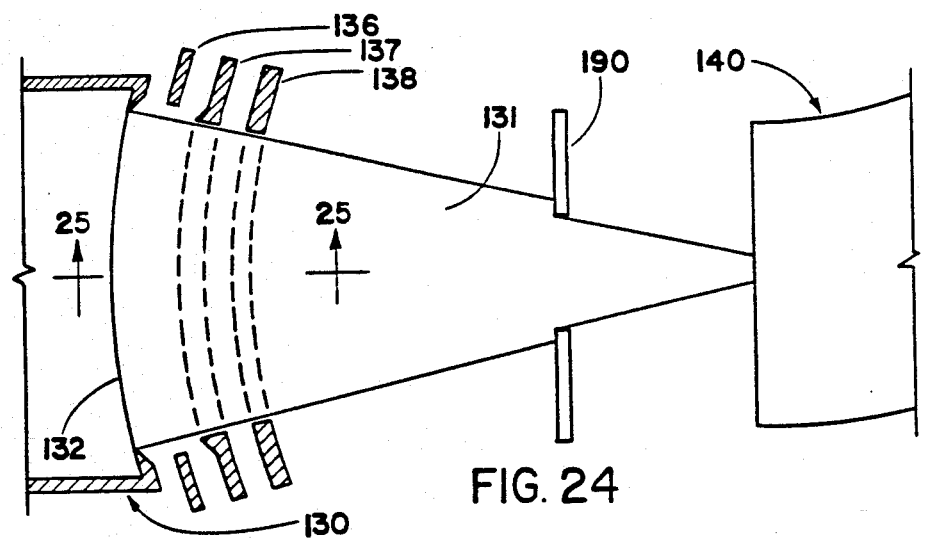
Figure 25:
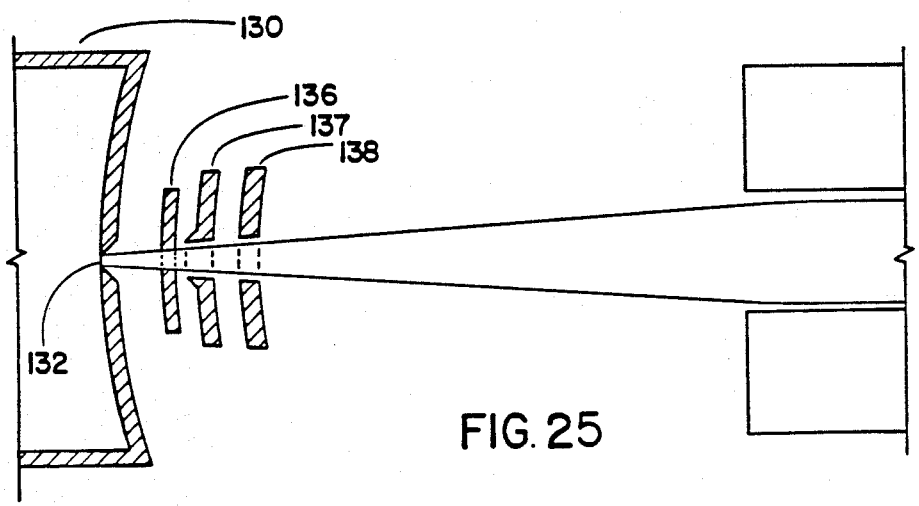

FIGS. 24 and 25 illustrate schematically the geometry of a curved source slit together with the electrode arrangement utilized in the source arrangement to extract the ions therefrom. For purposes of this discussion, the ion source 130 may be considered to be a conventional Freeman source having a concavely curved exit slit 132 but it should be understood that a straight exit slit or a convex slit could also be used. The view shown in FIG. 24 is a view looking down on the ion dispersion plane with the long dimension of the source slit 132 in the ion dispersion plane. FIG. 25 shows the same electrode structure in a schematic elevational view. A fringe control electrode 136 is provided adjacent the ion exit slit 132. An extraction electrode 137 is provided downstream of the fringe electrode 136 and a ground electrode 138 is provided downstream of the acceleration electrode.

For purposes of this discussion it will be assumed that a beam of positive ions is utilized. In the region between the ion exit slit 132 and the ground electrode 138 a positive ion beam has not yet been space charge neutralized by electrons which tend to be generated in the region between the ground electrode 138 and the entrance to the pole faces of the magnet arrangement 140. Consequently, although the ions traversing the central portion of the ion beam 131 see only surrounding positive charges and thus are not diverted from their normal path of travel, the ions at the edge regions of the beam 131 do not have surrounding positive ions and would tend to be diverted. For this reason the fringe electrode 136 is provided with a positive potential which serves to limit the spread of the beam in the dispersive plane between the ion exit slit 132 and the extraction electrode 137.

In the positive ion source-electrode arrangement, the extraction electrode 137 is typically biased in prior art systems to a voltage somewhat more negative with respect to the ground electrode 138 to repel electrons produced in the region between the electrode structure and the analyzing magnet. Without the presence of the negative voltage on the extraction electrode, these electrons would be accelerated into the plasma source. The result would be to increase the plasma source current without positive ion current effect and to produce X-rays which would require increased shielding in the source region. In addition, fewer electrons would be available to space charge neutralize the ion beam. In the prior art biasing arrangements, the ground electrode 138 is typically at ground relative to a preanalysis accelerating voltage of $+40$ to $+80$ kV applied to the source and $-2$ kV or $-3$ kV applied to the extraction electrode 137.

As shown in FIG. 24, aberration control vane 190 may be utilized between the ground electrode 138 and the entrance to the analyzing magnet arrangement 140 to remove aberrant ions from the ion beam 131, i.e. ions which are travelling in a direction which might cause unselected ion species to end up in the resolving slit of the device if they are not positively stopped at the edge of the beam. The beam edges are the locations where such aberrant ion paths may most probably occur. Other arrangement for removing ions on aberrant ion paths will be discussed below.

By orienting the long dimension of the source slit, i.e. the long dimension of the rectangular ion beam parallel to the ion dispersion plane of the analyzing arrangement, multiple ion source slits may be utilized to increase ion beam current. In the prior art arrangement shown in FIG. 5, multiple source slits cannot be utilized because multiple line sources perpendicular to the dispersion plane, would produce multiple line objects at the plane of the resolving slit. Thus an analyzed beam of a selected ion species could not be resolved in such an arrangement.

Figure 26:
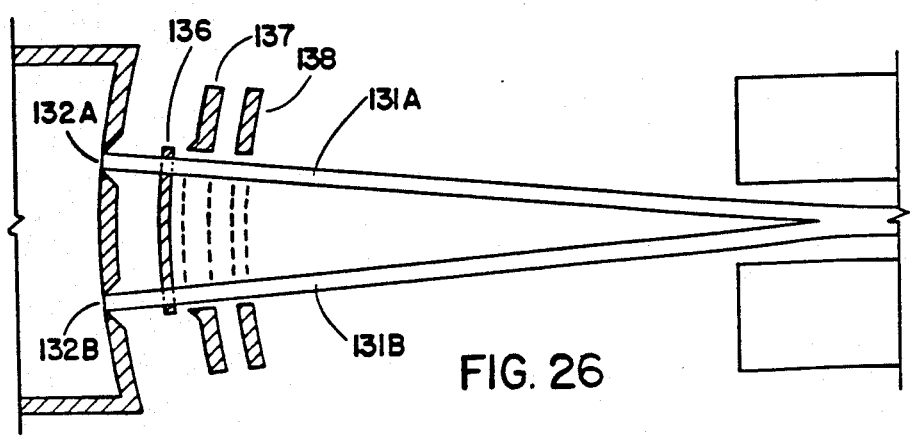

However, with the elongated source slit parallel to the ion dispersion plane, a plurality of source slits may be utilized. In FIG. 26 two source slits 132A and 132B are shown. The two source slits are shown with the ribbon ion beams 131A and 131B extracted therefrom converging to a single focal point. For purposes of this discussion the divergence of the ion beams in the non-dispersion plane is ignored, but may be present depending on the shape of the plasma meniscus.

As shown in FIG. 26, the symmetry of the two slit arrangement permits a single extraction electrode 137 and ground electrode 138 arrangement common to the two ribbon beams to be employed. However, in the triple slit arrangement of FIG. 27, the central beam from the exit slit 132A would tend to be shielded from the accelerating field of the extraction electrode 137 if the electrode structure shown in FIG. 26 were employed.

Accordingly, an extraction electrode structure 137' having separate extraction electrode regions 137A, 137B and 137C for each of the three beams is preferred so the beam acceleration for all three beams will be substantially the same. This same arrangement could be used in the two slit source of FIG. 26. A common ground electrode 138 may be employed and optionally a second extraction electrode 137" may be employed and biased with respect to the ground electrode 138 to decelerate the ion beam in the region between the second extraction electrode 137' and the ground electrode 138. This biasing would form a converging lens to converge the ion beams prior to entering the gap 143 of the analyzing magnet arrangement 140.

Figure 27:
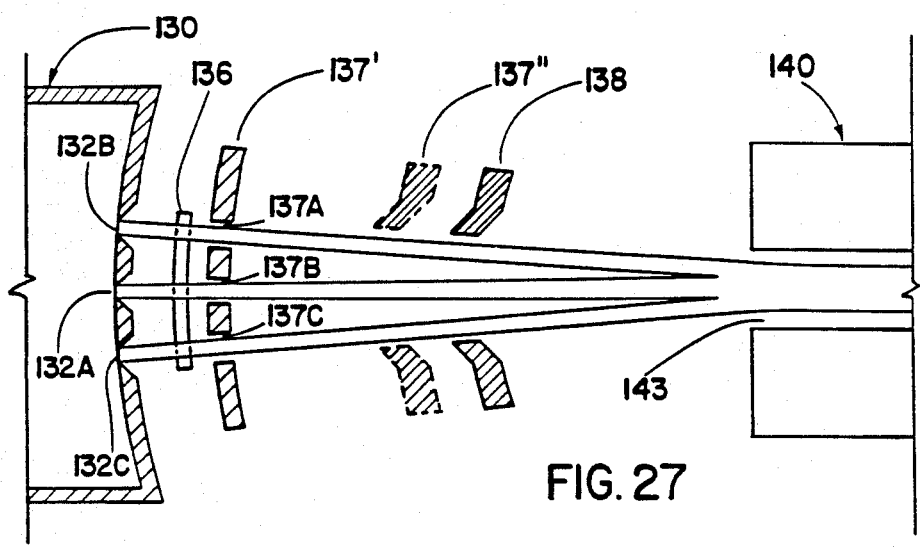
Figure 28:
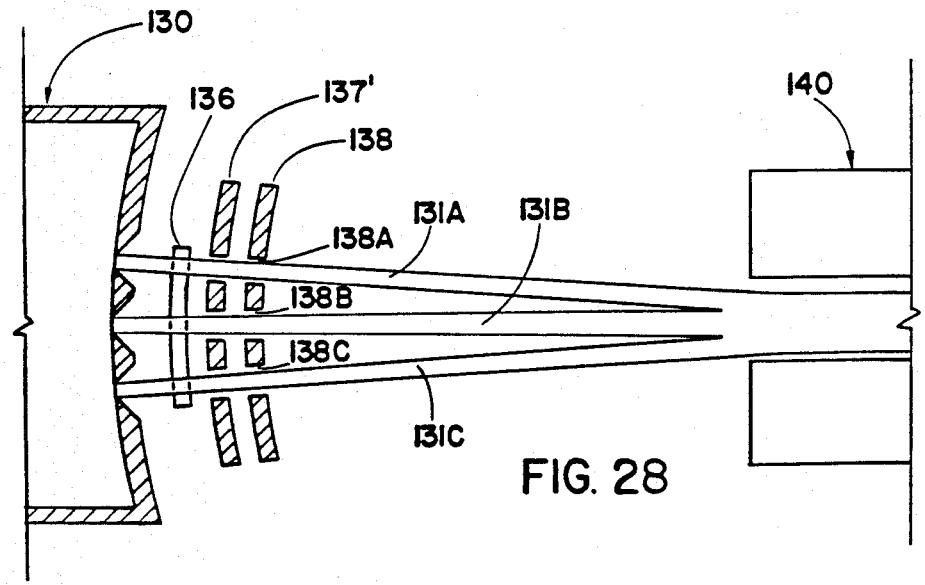

As shown in FIG. 28 an alternative approach is to provide a ground electrode 138 which has separate ground electrode apertures 138A, 138B and 138C so that, in effect, separate electrode regions are provided for each of the three ion beams 131A, 131B and 131C. This approach could also be applied to the FIG. 26 arrangement. It should be understood that in the FIGS. 24-28 there is no attempt to accurately depict the shape or geometric relationship between the ion source and electrode structures and the analyzing magnet arrangement 140. Instead the views are essentially schematic and various actual structures could be employed in a tangible physical embodiment of the invention. It should also be understood that the invention is not limited to use of one to three ion exit slits and more than three could be employed. Using the new ion optics of this invention the ion emission envelope of the ion source can be extended to a large degree both parallel and perpendicular to the ion dispersion plane to achieve dramatic increases in beam current with relatively small source and magnet sizes.

Prior Art Source Bias Arrangement

FIG. 29 shows a typical Freeman source, extraction electrode and ground electrode biasing arrangement of the prior art. The Freeman source itself is biased to a preacceleration voltage, for example, of +40 kV. The extraction electrode 37 is biased to −2 kV for a total extraction potential of 42 kV. The ground electrode 38 is at zero relative to the extraction electrode and the source. The −2 kV potential between extraction electrode 37 and the ground electrode 38 repels electrons which would otherwise tend to be accelerated from the region between the ground electrode 38 and the extraction electrode 37 into the source 30 itself. Such electrons are needed to provide a space charge neutralized beam in the gap of the analyzing magnet 40 and thus preclude further spread of the beam. It should be noted that this prior art biasing arrangement may be utilized with the improved ion optics geometry of this invention.

In the typical biasing arrangement of the prior art as shown in FIG. 29, the power supply providing the 40 kV potential to the Freeman source 30 is a stabilized power supply (also sometimes called a stiff power supply). This means that the power supply is provided with a high current potential so that it attempts to maintain the voltage at 40 kV at all current levels. One of the inherent characteristics of all ion implantation systems is a tendency to experience sparking between the source and the extraction electrode during operation of the system. Each system also goes through a conditioning period during start-up, with the source voltages being gradually brought up to full value so that mild sparking will occur at lower voltages and less heavy sparking will occur during the actual operation of the system. Nevertheless, during actual system operation, sparking conditions will occur from time-to-time.

With a stabilized power supply providing the +40 kV to the source, the sparking between the source 30 and the extraction electrode 37 will tend to involve a very heavy or hard spark due to the high current that can be maintained by the source during the sparking condition. The spark will be quenched only after the stabilized power supply runs out of current capability, thereby allowing the 40 kV voltage to drop until the spark quenches. However, as the 40 kV potential drops, the total extraction potential also drops, and the total preanalysis acceleration potential of the ions decreases. This radically changes the ion velocity entering the analyzing magnet so that, during the period that the spark is being quenched, and prior to the voltage rising again to 40 kV, the preselected ions desired to strike the target region will not be directed through the resolving slit onto the target. Instead non-selected ions may be directed into the target and these ions may be contaminating ions which could dramatically reduce the yield of good integrated circuit chips on the portion of the wafer being scanned by the beam at that period of time.

In addition, the velocity of the ions in the beam entering the analyzing magnet 40 in the prior art arrangement is that resulting from a 40 kV acceleration; and the size and power of the analyzing magnet 40 must be tailored to handle a beam of that velocity. Generally, the higher the beam velocity, the larger the analyzing magnet must be, either from the standpoint of overall area or from the standpoint of magnetic flux density in the magnet gap. The magnetic flux density can be increased only to a certain value before saturation effects take place, and thus larger magnet area is usually required.

Improved Source Biasing Arrangement

FIG. 30 illustrates an improved source biasing arrangement in accordance with one feature of this invention. It will be seen that the overall nature of the biasing arrangement is the same as that shown in the prior art in a qualitative sense. However, in accordance with this invention, the source 130 is biased to a preanalysis acceleration voltage substantially lower than the 40–80 kV used in the prior art. Instead, to achieve the high extraction potential, the extraction electrode 137 is biased to a potential which is substantially more negative than the ground electrode 138, for example, −30 kV as shown in FIG. 30. It can thus be seen that the total ion extraction potential is 50 kV; but in the region between the extraction electrode 137 and the ground electrode 138, the ions are decelerated substantially and enter the magnet gap at a velocity produced by an overall 20 kV accelerating field. Thus the biasing arrangement of this invention combines the positive benefit of high extraction potential with low velocity entering the flight tube between the magnet poles, thereby reducing the size and power requirements of the magnet and contributing to the compactness of the overall system. Furthermore, the substantial difference in bias between the ground electrode (also known in this biasing scheme as a decelerating electrode) forms a cylindrical electrostatic lens 190 in the region between the extraction electrode 137 and the ground (decelerating) electrode 138. This cylindrical converging lens tends to focus the diverging ion beam into a more parallel path before entering the flight tube of the analyzing magnet 140.

It should be understood that this feature of this invention could also be used with negative ions by reversing bias potential polarities. It should also be understood that the term "substantial" is used here to signify that the ion deceleration between the extraction electrode and the ground (deceleration) electrode is meaningfully greater than that achieved by the −2 kV or −3 kV difference in potential which was used in prior art systems for purposes of repelling electrons and not for purpose of meaningful deceleration of positive ions.

FIG. 31 illustrates that this same ion acceleration-deceleration biasing principle of this invention may be applied to the conventional ion optics shown in FIG. 5, provided the strength of the electrostatic lens 190' is kept low enough to preclude introducing resulting beam aberrations which would degrade the resolving power of the optics. This can be achieved by reducing the potential difference and making the lens larger.

In addition to the advantage of enabling more compact magnet design which is achieved by the biasing scheme of this invention as shown in FIG. 30, a further advantage can be achieved by supplying the +20 kV preanalysis acceleration voltage to the source 130 from a stabilized or stiff power supply and supplying the −30 kV extraction potential from an unstabilized or soft power supply. Such a combination produces a much softer spark which is more rapidly quenched during operation of the system. This results from the potential on the extraction electrode 137 rapidly dropping under a sparking condition since the power supply to the extraction electrode will not maintain high current. As the extraction voltage drops radically during sparking the spark quenches quickly and does not reach the same current level that it would reach in the prior art biasing and power supply arrangement.

Moreover, and of potentially great importance, a sparking condition under the bias and power supply arrangements of this invention does not radically alter the velocity of ions entering the flight tube between the analyzing magnet poles, since the preanalysis acceleration voltage of +20 kV is maintained with respect to the ground or deceleration electrode regardless of the voltage on the extraction electrode. Thus, while beam current may drop under a sparking condition and affect the dose rate of ions in a small section of the wafer during the soft but quickly quenched spark, contaminating ions will not be focused into the resolving slit and from thence into the target due to change in overall ion velocity during the sparking condition. In critical cases where the ion contamination involves the implantation of sodium ions for example, the high migration tendency of such ions could be potentially catastrophic.

It will thus be seen that the novel source biasing feature of this invention supplements the contribution of the higher current capability of the ion optics arrangement of this invention to contribute to realizing in practice a very compact, high current ion implantation system which can be shipped with the beam line intact due to the relatively much smaller size of the analyzing magnet arrangement and the ion source arrangement. With the use of the principles of this invention, it appears that an ion implantation system can be produced such that the entire beam line and wafer processor can be shipped intact since the apparatus incorporating the beam line may have a width less than the six foot double factory door. Accordingly, undesirable disassembly and reassembly of the beam line components will not be necessary. The numerous other advantages of a compact beam line and overall compact ion implantation machine as noted above can thus be realized utilizing the principles of this invention.

Useful Variations in Analyzing Magnet Pole Configuration

FIGS. 32–34 illustrate the details of several specific features of the analyzing magnet arrangement 140 which may conveniently be employed in connection with the ion optics and other principles of this invention. FIG. 33 illustrates the use of fringe focusing at the entry point of the analyzing magnet arrangement 140. The front face 146 of the pole pieces is angled with respect to a line normal to the path of the beam 131 by an angle 8 which may range between 0° and 45°. This angle of the front face of the pole pieces produces a converging magnetic lens at this location which acts on the beam 131 entering the pole gap to reduce the degree of divergence of the beam, which divergence is shown in FIG. 16.

As shown in FIG. 32, the interior faces 141A and 142A of the electromagnet poles 141 and 142 may be angled with respect to each other to produce an inhomogeneous magnetic field within the magnet pole gap. This inhomogeneous magnetic field produces a continual convergent focusing action on the beam as it passes through the analyzing magnet. This has the benefit of reducing the number of ions which strike the top and bottom surfaces of the magnet vacuum chamber between the poles, thus increasing effective beam current leaving the magnet.

With the combination of convergent electrostatic focusing illustrated in FIGS. 21 and 30 and entry fringe focusing as illustrated in FIG. 33, and continuous inhomogeneous field focusing illustrated in FIG. 32, the efficiency of transmission of the ion beam traversing the analyzing magnet gap and leaving as an analyzed ion beam can be substantially improved.

FIG. 34 illustrates another improvement which can be utilized in the ion optic system of this invention. The iron of the magnetic pole pieces 141 and 142 may be extended in the region of the interior pole faces 142A and 141A between the electromagnet windings 147 and 148 so as to earlier intercept the ion beam entering the pole gap flight tube of the analyzing magnet arrangement. This enables the overall analyzing magnet arrangement o be more compact since it begins acting on the entering ion beam sooner and also improves the resolving power of the system.

The combination of all of these techniques with the high current capacity and compact design which can be achieved with the ion source optics of this invention is expected to make possible the manufacture of a very compact ion implantation system with substantially higher beam currents than has heretofore been achieved in the art. In addition, the principles of this invention may be applied to very high current machines which may, for example, open the fields of surface metallurgy (i.e. surface alloying) to mass analyzed ion implantation techniques, as well as creating opportunities for implementing new ion implantation processes in semiconductor IC fabrication. For example, using the ion optics of this invention may make it commercially feasible for the first time to fabricate implanted oxide regions deep within a semiconductor wafer to locally oxidize the semiconductor material present thereat for purposes of creating buried oxide isolation regions. This capability could further dramatically increase the density and speed which VLSI circuits can achieve.

Details of Specific Embodiments

A First Embodiment

FIGS. 35–41 depict a specific embodiment of an ion source arrangement and analyzing magnet arrangement incorporating the general principles of this invention. The beam line arrangement 200 includes an ion source module 230, an ion beam electrode module 235, an electromagnet arrangement 280 for the source module 230, an analyzing magnet arrangement 240, a beam width control arrangement 290, and a vacuum gate valve arrangement 300.

The ion source module 230 may include a Freeman-type source comprising an arc chamber 230C with a filament 230D extending therethrough. Bias and operating potentials for the source are provided by bias connections 230A Gaseous material to be ionized in the arc chamber 230C is provided through a supply tubing arrangement 230B or from a vaporizer furnace situated in the ion source assembly. The source module 230 may be a relatively standard Freeman source structure adapted in its configuration to the more compact geometry of the optics of the beam line arrangement 200.

The fringe electrode 236, the extraction electrode 237 and the ground or deceleration electrode 238 are mounted in a modular fashion on a base plate 235A supported by columns 235D. An adjusting arrangement 235B permits slight adjustment of the position of the electrode module with respect to the source for beam alignment purposes. Coolant for the electrode structure is provided via lines 235C which are coupled into the electrode structure in a conventional fashion. The overall structure of the electrodes is best seen in FIG. 38. It should be appreciated that there are numerous ways that the Freeman source could be mounted in the source housing 230F and that there are numerous ways that the electrode structure can be mounted within the housing 230F above the arc chamber 230C. The source electromagnet arrangement includes magnetic poles 281, separate electromagnet windings 282 and a flux return bar 283 which traverses one side of the housing 230F underneath the port leading to the vacuum pump.

The analyzing magnet arrangement 240 includes magnetic pole pieces 241 and 242 having entry fringe poles 241A' and 242A' extending underneath the electromagnet coils 247 and 248 at the entry face 246 of the analyzing magnet arrangement 240. As shown schematically in FIG. 33 the entry face of the fringe pole elements 241A' and 242A' may be angled to provide fringe focusing of the beam entering the flight tube 243 between the magnetic pole pieces 241 and 242.

The beam width control arrangement 290 can best be seen in the combination of FIGS. 35, 39 and 40. An electric stepper motor 291 drives a lead screw arrangement 292 to reciprocate a cam plate 293. The reciprocating motion of the cam plate 293 causes a rotation of the lever arm 294, which in turn causes a rotation of the intermeshed gears 295, 296 and 297. The gears 295 and 297 are mounted on shafts 295A and 295B which are hollow and receive coolant via coolant lines 299. Appropriate vacuum sealing arrangements are provided at points 295B and 297B. Rotation of the shafts 295A and 297A causes corresponding rotation of the vanes 298 rigidly mounted thereto.

The rotation of the vanes 298 into the path of the ion beam exiting the ground or deceleration electrode 238 effectively controls the width of the ion beam entering the vacuum chamber 243 of the analyzing magnet arrangement. In the wide open position of the vanes 298, shown in dashed lines in FIG. 35, the maximum beam width enters the vacuum chamber of the analyzing magnet. However, aberrant ion beam components at the edges of the beam will be intercepted by the vanes 298 in this wide open position to preclude their entry into the analyzing magnet. This is a highly advantageous aspect of positioning the beam control vanes at this location immediately downstream of the source electrode module 235.

In addition, the utilization of rotating vanes for beam width control instead of reciprocating vanes is highly advantageous in that the degree of fine tuning of beam width is increased due to the fine control achieved as the vanes rotate toward each other. The degree of change in beam width for each step of the stepper motor is less as the vanes approach each other in their angular rotation than it is when the ends of the vanes are further apart from each other. Typically the stepper motor is controlled by a servomechanism arrangement which drives the stepper motor in response to detecting of actual beam current.

FIGS. 35, 36 and 41 depict a vacuum seal arrangement 300 which enables the source chamber housing 230F to be sealed at its top aperture 230F' so that vacuum can be maintained in the flight tube between the analyzing magnet poles and other components of the beam line while the source module arrangement 230 is being changed to replenish the cathode filament 230D or for other maintenance purposes. A shaft 301 operates an actuating lever 302 which is coupled by way of a pair of arms 303 to the sliding gate valve 304. A rectangular gasket 305 provides the vacuum seal against the upper walls of the ion source housing. The sliding gate valve 304 includes guides 306 which ride on rails 307 which are inclined so as to force the sliding gate into tight-fitting contact with the upper wall of the ion source housing. A stop arrangement 308 precludes overtravel of the vacuum gate valve to insure that it stays in position covering the aperture 230F'.

Ion source module 230 shown in FIGS. 35 and 36 utilizes an electromagnet arrangement 280 having the magnet poles 281 aligned with the filament 230D of the source for purposes of causing the electrons emitted from the filament to spiral around and create ions of the gaseous material filling the arc chamber 230C. As is well known in this art, the ion emission from the arc chamber tends to vary from one end of the arc chamber to the other providing a non-uniform current density in the ion beam. To some extent, it is possible in accordance with this invention to compensate for the non-uniformity of the ion beam by generating a nonuniform magnetic field in the pole gap between the magnetic poles 281 on each side of the source. This can be accomplished by independently controlling the current in the field coils 282 associated with each of the magnet poles.

Improved Freeman Source

FIGS. 42–44 illustrate an improved type of Freeman source which may also be utilized to contribute to a more uniform ion beam exiting the ion exit slit 332 from the source chamber 330. The ion chamber housing 314 encloses a plurality of separate U-shaped anode structures 317 which are electrically isolated from the chamber housing 314 by dielectric spacer means 316. The cathode-filament 315 extends through central regions of the individual anode sections 317. As shown in FIG. 42 each of the separate anode elements 317 may be separately biased using individual biasing arrangements 318. In addition the current flowing between the cathode-filament 315 and the individual anode sections may be separately indicated using individual meters 319. The individual bias voltage arrangements 318 can be used to vary the filament-to-anode bias at various regions along the length of the ion source to control the ion current emitted from the ion exit slit 332 in the region of each of the individual anodes. The combination of non-uniform magnetic biasing of the source and non-uniform electrical biasing of the individual anode elements should greatly improve overall beam uniformity for the ribbon beam exiting the ion exit slit 332. Other ion sources can also be utilized with this invention provided a relatively uniform ion beam is produced. For example a suitable ion source of the multipole type such as is shown in the above-referenced Ehlers et al. publication may be employed with this invention.

Multiple Beam Resolving Elements

FIG. 45 illustrates another feature of this invention involving the use of a beam resolving arrangement 350 which includes multiple beam resolving elements 351 which are selectively positionable in the path of the analyzed beam utilizing any convenient positioning means 352. The use of multiple resolving slits permits a number of advantages to be achieved in an ion implantation system. One of the advantages is that each resolving slit can be dedicated to a particular ion species to eliminate possibilities of cross-contamination of ion species which may otherwise occur if a single resolving slit is utilized and ions from one species sputter ions from a previous species selected in a prior implant process from the edges of the resolving slit into the final ion beam striking the target. Other uses of multiple resolving slits may involve selection of mass selectivity and beam purity. For example it may be desirable to have a broad resolving slit (e.g. 351A) for purposes of permitting both mass species of antimony to pass through the resolving slit to strike the target wafer. Since implanting of antimony may be utilized with either or both of the two relatively closely spaced mass species, dosage rates and thus wafer throughput can be increased by utilizing both species versus resolving one species or the other.

Ion Beam Collimating Arrangements

Figure 46:
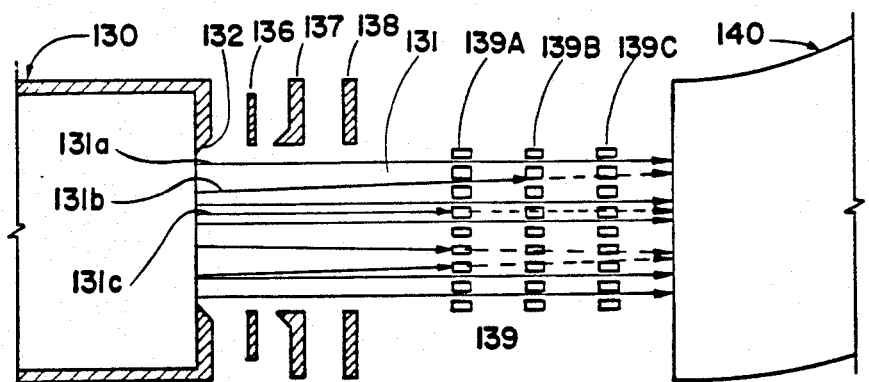

One factor involved in the arrangement of ion beam line components in accordance with this invention is that the resolving power of the system is slightly degraded by thermal noise. This is caused by the variation in the direction of individual ion paths due to the instantaneous thermal energy which the individual ions may have as they are extracted from the source aperture. If the instantaneous velocity of the extracted ion due to thermal energy is substantially perpendicular to the velocity component of the ion due to the extracting electric field and parallel to the ion dispersion plane, the individual ion will have a velocity component which is normal to the straight line beam path into the analyzing magnet such that the resultant ion path has a slight angular deviation from this straight line path. As shown in FIG. 46, a collimating arrangement 139 may be utilized to eliminate from the overall ion beam emitted from the source 130 those ions which have a deviant ion path due to the instantaneous thermal velocity of the extracted ion being substantially normal to the straight through ion path and parallel to the ion dispersion plane.

The collimating arrangement 139 may comprise a series of individual collimating structures 139A, 139B and 139C arranged between the deceleration electrode 138 and the entry face of the analyzing magnet 140. Other arrangements of collimating grates and/or screens could be used. Two or more grates or screens will produce a collimating function.

As depicted in FIG. 46, ions having a straight beam path such as the path 131a will pass directly through the collimating grate arrangements and into the analyzing magnet 140. Ions travelling on a deviant path, such as the path 131b, will generally strike one of the bars in the collimating grate arrangement 139 and thus not be permitted to enter the analyzing magnet 140. It will be appreciated, however, that because of the volume occupied by the collimating grate arrangement 139, some of the straight line ion beam paths such as 131c will also be excluded from entering the analyzing magnet 140. The net result is that the arrangement of FIG. 46 reduces the overall ion beam current entering the analyzing magnet 140. Thus there is a trade-off involved in utilizing collimation of the ion beam, i.e., there is a sacrifice in beam current to achieve an improvement in overall resolving power of the system.

Figure 47:
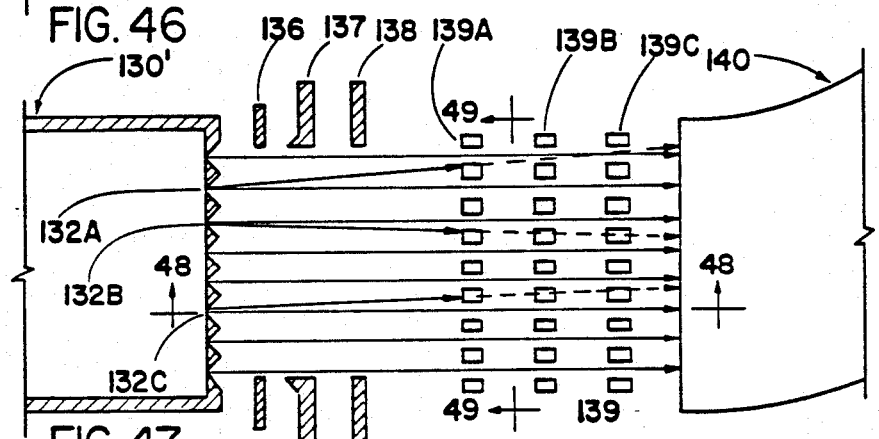
Figure 48:
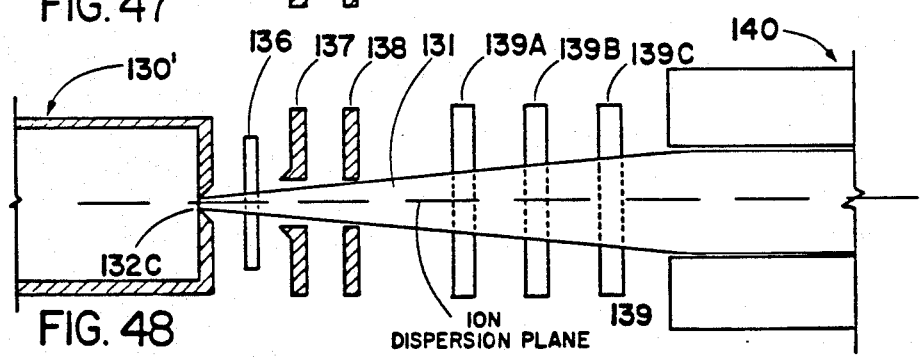
Figure 49:
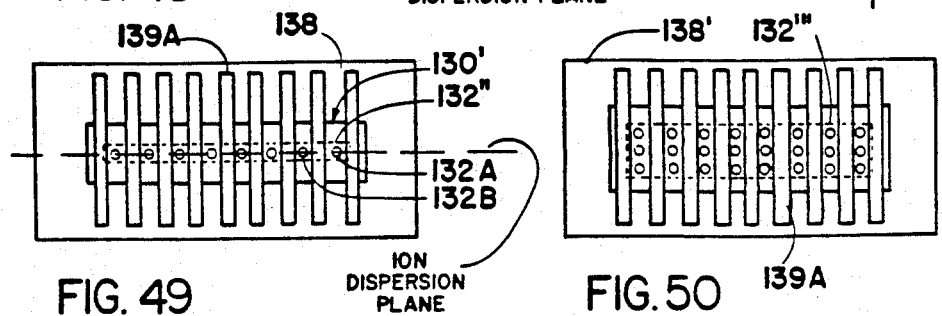

As FIG. 46 illustrates, the actual ion beam entering the analyzing magnet 140, in a case where a collimating arrangement such as arrangement 139 is utilized, involves a series of beamlets which would have the appearance of emanating from separate apertures in the front wall of the ion source 130. It is thus apparent, as shown in FIG. 47, that an ion source 130' having individual ion exit apertures, for example 132A. and 132B may be utilized, together with the collimating arrangement 139. As shown in FIGS. 48 and 49, the collimating grates 139A, 139B and 139C may comprise a series of spaced vertical bars which permit divergence of the beam from the individual ion exit slits in planes perpendicular to the ion dispersion plane of the analyzing magnet 140. Accordingly, only the diverging component of the ion beamlets emitted from each ion exit aperture in planes parallel to the ion dispersion plane will be eliminated from the ion beam entering the analyzing magnet. These are the components which would not be accurately resolved in the system.

Referring back to the general concept of this invention, it is thus seen that the ion source arrangement of FIGS. 47-49 employ the novel general principles of this invention, namely that the ion source produces ions entering the analyzing means (e.g. analyzing magnet 140) which are travelling substantially either toward or from a common apparent line object lying in a plane perpendicular to the ion dispersion plane. In the case of the straight front wall ion source depicted in FIG. 44 and FIG. 45, the common apparent line object is at infinity. However, it should be apparent that the convex or concave ion source arrangement depicted in FIGS. 17-20 could also be utilized with appropriate modifications of the arrangement of the collimating grates to handle the converging or diverging beamlets. In the case of the convex or concave front surface of the ion source, the common apparent line object would be either behind the source or in front of the source.

Figure 50:
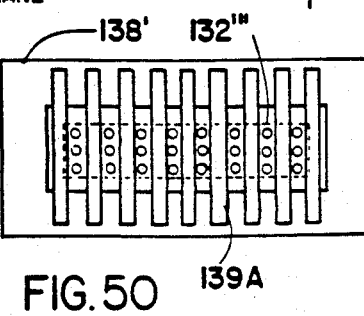

As shown in FIG. 50, several stacked rows of ion emitting apertures may be formed in the front wall of the ion source. This arrangement is similar to the stacked slit arrangement shown in FIGS. 26-28. It is thus seen that, in the general case, a beam line arrangement which implements the principles of this invention has an ion source with an ion emitting envelope which includes an area of substantial extension in a plane parallel to the ion dispersion plane of the analyzing system (e.g. magnet 140) and the beam envelope retains substantial extension in the ion dispersion plane throughout the region between the source and the analyzing means. In the case of the single source slit depicted in FIGS. 15-25, the ion emitting envelope is simply the area of the single rectangular slit. Obviously, such an ion emitting envelope has an area of substantial extension in a plane parallel to the ion dispersion plane since the longer dimension of the rectangular slit is oriented parallel to the ion dispersion plane.

In the case of the multiple rectangular slits depicted in FIGS. 26-28, the ion emitting envelope is a geometric area bounded by the extreme outer edges of the individual rectangular slits. In this case it is also obvious that the ion emitting envelope includes an area of substantial extension in a plane parallel to the ion dispersion plane since each of the rectangular slits which together define the ion emitting envelope have a substantial length in a plane parallel to the ion dispersion plane.

Referring to the arrangements of individual ion emitting apertures shown in FIGS. 49 and 50, the ion emitting envelopes are depicted as dashed rectangles 132" and 132''', i.e. geometric areas bounding the individual outer edges ion exit apertures. In this case, it is also apparent that this ion emitting envelope has an area of substantial extension in a plane parallel to the ion dispersion plane because of the extended row of apertures which lie in a plane parallel to the ion dispersion plane. Although there would be no logical reason to do so, the arrangement of individual ion exit aperture in the multiple aperture case could involve any irregular geometric shape producing an irregular ion emitting envelope provided an appropriate collimating arrangement is utilized so that the overall ion source arrangement satisfies the condition that it produces ions entering the analyzing means which are travelling substantially either toward or from a common apparent line object lying in a plane perpendicular to the ion dispersion plane.

It should be apparent that the multiple ion exit aperture arrangements shown in FIGS. 47-50 are not as advantageous as the ion source arrangement which uses a single rectangular slit or plural stacked rectangular slits. However, the multiple aperture embodiments do have many of the other advantages of this invention in that they can be utilized to produce an ion beam having higher current than prior art ion sources would have by utilizing the principle of extending the area of the ion emitting envelope in a plane parallel to the ion dispersion plane and maintaining substantial extension in the ion dispersion plane throughout the region between the source and analyzing magnet. In particular, the multiple stacked array of ion exit apertures shown in FIG. 50 would produce substantially higher ion beam current in smaller overall machine size than is possible from prior art beam line arrangements. All of the other advantages of compactness and low analyzing magnet power requirements may be achieved with the multiple aperture ion source except that there is some degradation in the compactness due to the requirement that the collimating arrangement 139 be provided between the deceleration electrode 138 and the analyzing magnet 140.

Details of a Second Preferred Embodiment

FIG. 51 shows the main components of an ion implanter beam line 400 in accordance with a presently preferred embodiment of this invention. Beam line 400 comprises an ion source arrangement 410, ion mass analyzing system 420, a mass resolving system 430, and a post-acceleration system 440 which accelerates the resolved ion beam to a target element 450. Ion source arrangement 410 includes a source assembly 411, a source magnet assembly 412, and an ion beam extraction assembly 413. Ion mass analyzing system 420 includes ion beam flight tube 421 and beam analyzing magnet assembly 422. Mass resolving system 430 includes a vacuum gate valve 431, ion drift tube 432, and mass resolving slit assembly 433. Post-acceleration system 440 may take a number of configurations, including the graded acceleration voltage system disclosed in copending and commonly assigned U.S. patent application entitled "Ion Beam Acceleration System." Target element 450 may typically be a semiconductor wafer being subjected to ion implantation. The individual wafers may be carried on a wafer processor apparatus such as that disclosed in co-pending and commonly assigned Wauk et al. U.S. patent application entitled "Ion Implanting Apparatus and Method."

The various ion implanter beam line components depicted in FIG. 51 are shown in greater detail in other drawing figures to be described below except for the source magnet assembly 412. Source magnet assembly 412 is utilized when a Freeman-type source assembly is incorporated in the ion source arrangement 410. Source magnet assembly 412 includes magnet poles 412A extending into the ion source housing from opposite sides and a magnet coil 412B, each of which coils is preferably separately powered so that the magnetic field generated thereby can be separately controlled. A magnetic field return circuit is provided and comprises vertical return bar 412C and a U-shaped magnetic return yoke 412D which carries the return magnetic field around the bottom portion of ion source arrangement 410.

Using this configuration, the magnetic field return circuit for the source magnet assembly 412 does not interact with the magnetic field components of the mass analyzing system 420 in a way which could produce vertical magnetic field components in the region immediately in front of the ion source chamber and source assembly 411, i.e., a field parallel to the extracted ion beam. It has been discovered that, if the source magnet return circuit is provided simply as a U-shaped return yoke at the level of the source magnet poles 412A, a magnetic field interaction with the beam analyzing magnet assembly produces such a resultant vertical magnetic field component which reduces the efficiency of the ion source.

In other words, the efficient operation of the Freeman-type source requires that the magnetic field between the poles 412A which are aligned with the filament-cathode of the Freeman-type source be substantially parallel to the filament-cathode so that electrons emitted from the cathode will spiral around the cathode for high ionization efficiency of the gas in the source. If, instead, the spiralling path of the electrons is disturbed by a component of magnetic field in this vicinity which is parallel to the beam, the ion generation efficiency of the source will be substantially depressed and the resultant ion beam which can be extracted by the ion beam extraction assembly will be substantially lowered. The source magnet assembly 412 shown in FIG. 51 with the magnetic return circuit arrangement depicted avoids production of any vertical component of magnetic field in front of the source and thus permits full efficient Freeman source operation for high ion beam current production and extraction.

FIG. 52 shows in greater detail ion source arrangement 410. Source housing 460 provides the basic vacuum enclosure for the source assembly 411 and beam extraction assembly 413. Source housing 460 has a rectangular aperture 461 in the top wall thereof for communicating the ion beam generated to the flight tube 421 mounted above this top wall. A vacuum pump port 462 in one side of the housing 460 communicates with a vacuum pump arrangement for evacuating the source housing. The bottom wall of chamber 460 has a port 463 therein for receiving the extraction assembly 413 and the source assembly 411. Both the beam extraction assembly 413 and the source assembly 411 are constructed and arranged to be separately removable modules, that is, each assembly is completely removable as a separate unit for cleaning and maintenance. Moreover, the two assemblies can be removed together for alignment checks between the source and extraction electrodes.

The details of the beam extraction assembly 413 will be discussed in detail below in conjunction with several drawing views thereof. However, at this point it should be understood that the separate module aspect of beam extraction assembly 413 involves an extraction assembly flange 413A which mounts to the bottom wall of housing 460 and carries thereon all of the other elements of the beam extraction assembly, including a support base member 413B and the extraction and deceleration electrodes 413C which are mounted on a support pillar arrangement 413D. With this modular arrangement all of these components are removed from the chamber 460 when the extraction assembly flange 413A is removed.

Similarly, ion source assembly 411 is removable from chamber 460 as an integrated single module, the details of which will now be described in conjunction with FIGS. 52-55.

The main components of source assembly 411 are source assembly flange 471, source insulator 472, source chamber support arrangement 474, a source gas feed arrangement 475, and an electrical biasing arrangement for the ion source components including filament bias and current supply arrangements 476A and 476B, and anode supply arrangements 476C. Source flange 471 and source insulator 472 are removably mounted to the extraction assembly flange 413A utilizing a mounting bolt arrangement (not shown). Source flange 471 is mounted to insulator 472 by way of a mounting bolt and wing nut arrangement 477. The support assembly 474 for the ion source arc chamber assembly 473 comprises vertical support pillars 478 mounted on a pedestal 479 as shown in FIG. 53. The pedestal 479 is in turned carried on the ion source flange 471 and comprises a hollow pedestal structure which receives the ion source gas feed assembly 475.

Ion source arc chamber 473 includes a housing 480 with separate U-shaped anodes 481 supported on the bottom wall thereof. Filament-cathode 482 is located on its opposite ends by filament support 482A. Filament clamps 483 are clamped to each end of filament-cathode 482, and each is connected to a filament lead 484 which is fed through the top of pedestal 479 to a high current feed through 485 in source flange 471. Appropriate filament insulators 486 electrically isolate the filament-cathode from the ion source chamber 478. As shown in FIG. 52 separate electric bias lead wires 487 are coupled to the individual anodes 481 and provide separate bias voltage thereto for purposes described above in connection with FIGS. 42-44.

A heat shield fin arrangement 488 comprising a plurality of heat shield fins is interposed between source chamber 480 and pedestal 479 to reflect heat from the ion source chamber back toward the chamber and away from the pedestal and the vapor supply system 475.

Vapor supply 475 is a separate module which includes a flange 489 mounted with a mounting bolt and wing nut assembly to the source flange 41. A gas feed assembly 490, involving a tube carried on the flange 489 and extending through the top of pedestal 479 directly into the arc chamber 480, is provided for direct supply of a gas such as boron trifluoride into the source chamber. A pair of solid source charge capsules 491 with associated cartridge heaters 492 and thermocouple temperature sensors 493 are provided for evaporating solid source materials, such as arsenic, to provide vapors coupled into the arc chamber 480 through feed tubes 494.

The front plate 495 of the ion source arc chamber 480 includes an ion exit aperture 496, the structure and details of which will be described below.

FIGS. 56-60 depict the ion beam extraction assembly 413 which includes, as shown in FIGS. 59 and 60, a beam control vane assembly which is carried on the extraction assembly flange.

Referring first to FIGS. 56-58, it will be seen that the extraction assembly flange 500 carries thereon an electrode support base 501 which is supported on the flange 500 by means of an alignment-support arrangement 502. The alignment-support arrangement 502 includes a pair of support posts 503 which have a conical top bearing surface on which the ring-shaped base 501 is supported in a tiltable fashion. A cam follower arrangement 504 controls the tilting of the extraction electrode base 501 on the support 503. A tension spring 505 is connected at one end to a mounting post 506 fastened to the electrode support base 501 and at the other end to a support post 507 mounted to the flange 500. This arrangement biases the cam follower 504a against the cam 504B. Cam 504B is driven by a lead screw 508 which is coupled by way of a gear mechanism 509 to an electric motor 510. This motor controlled electrode base tilting mechanism enables the extraction and deceleration electrodes to be aligned with respect to the ion exit slit in the ion source.

This alignment mechanism is at terminal potential along with the electrode support base 501, the deceleration electrode support pillars 511, and the deceleration electrode 512. The extraction electrode support pillars 513 comprise a composite of a metal pillar section 514 and an insulating pillar section 515 with a ceramic shield arrangement 516 shielding the insulator section 515 from contaminating particles and deposits. The extraction electrode 517 is mounted in a cantilevered fashion on the top of the support pillars 513. In a similar fashion the deceleration electrode 512 is mounted in a. cantilevered fashion on the support pillars 511.

Provision has also been made for a fringe electrode arrangement including the fringe support pillar 518 carried on support base 501 and having a U-shaped fringe electrode 519 carried thereon in a cantilevered mounting arrangement.

The extraction electrode 517 includes thicker central section 517A which includes a generally rectangular slit 517B through which the extracted ion beam passes. Similarly, deceleration electrode 512 includes central section 512A with a generally rectangular aperture 512B formed therein through which the ion beam extracted from the ion source passes.

The cantilevered mounting arrangement of the extraction electrode 517 and the deceleration electrode 512 provide an overall electrode mounting arrangement which has a large open volume for good pumping conductance of gas flowing out of the ion exit slit of the ion source. In the electrode mounting arrangement depicted in FIGS. 37 and 38 and described above, it is necessary to shield the insulators which support the extraction electrode 237 on the deceleration electrode support arrangement 235 from contamination. This shield arrangement is not shown in FIGS. 37 and 38, but is mounted inside of the insulators and effectively surrounds the aperture in the deceleration electrode; and thus substantially reduces the vacuum pumping conductance in that region.

When such an ion source and electrode assembly is operated with a gas fed source such as boron trifluoride, a relatively high gas pressure in the arc chamber forces a substantial amount of the boron trifluoride gas out of the ion exit aperture into the extraction and deceleration electrode region. With the insulator shield in place, this boron trifluoride gas tends to escape in large quantities into the ion flight tube and thus to permeate the other components of the beam line. Contraseed to this, the electrode support arrangement shown in FIGS. 56 and 57 separately mounts the extraction electrode in a cantilevered fashion on its own support pillars which are electrically isolated from the electrode support base 501 with a shielding arrangement 516 which is not in the vicinity of the extraction and deceleration electrodes themselves. The enhanced pumping conductance of that region enables the vacuum pump system communicating with the source housing as shown in FIG. 52, to more effectively remove the boron trifluoride gas escaping from the ion exit aperture in the front plate of the source. This reduces the amount of such gas which reaches the flight tube and downstream beam components.

Referring now to FIGS. 59 and 60, a beam vane control system 520 will be described. Beam vane control system 520 includes beam intercepting vane elements 521, 522 mounted on one end of individual support arms 523, 524, the other end of which is mounted on a shaft 525 as shown in FIG. 60. Shaft 525 also carries a cam arm 526 which is spring loaded by tension spring 527 against a cam follower 528 carried on a cam follower plate 529. Cam follower plate 529 travels vertically on a guide post 530 and is driven up and down by a drive screw arrangement 531 which is powered by an electric motor 532 through a belt drive arrangement 533. A pair of solenoids 534, 535 are individually operable under remote control to provide a cam stop for the cam arms designated 526. By operating one of the solenoids 534, 535 while the cam arm 526 is in its most vertical position and the attached beam control vane 521 has its extreme edge at the center line of the ion beam, the other beam control vane can be separately operated by the cam follower plate and cam arm arrangement to sweep the beam control vane across the beam to enable incremental measurements of beam current to be performed.

A position sensing potentiometer 536 is carried on follower plate 537 and is driven by a gear arrangement 538 which includes a gear element 539 carried on the drive shaft 531. In this manner an electrical signal giving the position of the beam control vanes may be provided to a manual or computer controlled operational control system for the ion implanter apparatus.

In normal operation of the beam control vane assembly, both solenoids 534, 535 would be de-actuated so that their corresponding stop elements would be retracted and both of the cam arms 526 would be free to rotate with movement of the cam follower plate 529. The beam control vanes 521 and 522 are thus utilized to control beam current entering the flight tube of the analyzing magnet assembly.

Because the beam vane control system 520 is entirely mounted to and supported on the extraction assembly flange 500, the beam control vane assembly and the extraction electrode assembly are removable as a single module from the source housing 460. The beam vane control assembly 520 in this embodiment is preferable to the beam vane control assembly disclosed in the embodiment of FIGS. 35 and 36 because only the beam control vanes 521 and 522 themselves are located in the high temperature region above the extraction electrode system. The actuator mechanism and rotational mounting shaft (including vacuum seals 525A) for the beam control vanes are located remote from the hot extraction region and are thus less subject to having their operation degraded by heat.

It should also be noted that the source housing 460 as shown in FIG. 52 does not have a vacuum gate valve present for sealing the rectangular aperture 461 in the top wall of housing 460. The vacuum gate valve has been removed to the other side of the flight tube of this embodiment, both for enhancing its reliability and to avoid venting the post-acceleration system when removing the flight tube for cleaning. The gate valve arrangement shown in FIG. 36 of the other embodiment is subject to high temperature despite the coolant flowing through the beam vane assembly in the upper wall of the chamber in that embodiment. In the embodiment shown in FIGS. 52–59, no cooling of the beam control vane is required since the vanes 521, 522 are formed of a material such as graphite which can withstand the high temperatures and the more sensitive components of the actuation system are removed from the high temperature region.

FIGS. 61–63 depict the ion mass analyzing system 420 which basically includes separate electromagnet assemblies which are disposed on each side of the ion beam flight tube 421 depicted in FIG. 51. The ion beam flight tube is not shown in FIGS. 61–63 to avoid obscuring the structure of the electromagnet assemblies. A preferred flight tube structure is disclosed in co-pending and commonly assigned U.S. patent application entitled "Ion Implantation Apparatus and Method." Since the beam analyzing magnet assembly involves a symmetrical arrangement of electromagnets, only one side of the overall assembly will be described for illustration purposes.

Considering the electromagnet assembly from the central flight tube region outward, the assembly includes an inner pole piece 550 and an inner coil 551, and an outer pole piece 555 together with an outer coil 556. The pole face 552 of inner pole 550 has the general shape depicted in the central cross hatched region shown in FIG. 62. The entry edge 553 of the inner pole 550 is disposed at about a forty five degree angle to the path of a ribbon ion beam entering the flight tube region between the opposing inner pole faces. The exit edge 554 of the inner pole is disposed at about a thirty five degree angle to the vertical. It should be understood that the ion beam exiting the flight tube region between the pole faces is an analyzed ion beam with the ions of selected mass, i.e., ions corresponding to the selected ion species, focused to a focal point at the mass resolving slit which is positioned at the end of a drift tube region as shown in FIG. 51. These relatively highly angled entry and exit edges of the inner magnet pole provide beam converging fringe focussing at both regions.

Outer pole 555 and its associated electromagnet coil 556 together with the magnetic return yoke 537 complete one-half of the beam analyzing magnet assembly 420. An entry shunt arrangement 560 is provided at the ion beam entry region of the analyzing magnet to produce a magnetic field free region adjacent the fringe field region 562. Without this entry shunt, the full fringe focussing power would not be realized. An exit shunt 565 is provided at the exit edge of the ion beam from the region between the inner pole faces for essentially the same purpose of controlling ion optics at the beam exit side of the analyzing magnet system.

The overall shape of the inner pole has an outline which is designed so that the selected ion species will be focused at the resolving slit. Selection of which ion mass is resolved at the resolving slit is determined by the strength of the magnetic field in the pole gap and this is, in turn, controlled by the magnitude of the current supply to the electromagnet coils 551 and 556.

The outer electromagnet assembly comprising coil 556 and pole piece 555 is housed within a cooling can (not shown) through which a cooling fluid is circulated to dissipate the heat generated by the electric current flowing through the coil.

FIGS. 64-68 depict mass resolving system 430 which includes an ion drift region 580 formed between a pair of side fences 581 and 582 which are mounted within a cylindrical terminal electrode 583 which has a cylindrical cup shaped end cap 584. End wall 585 has an aperture 586 formed therein through which the focused ion beam of the selected ion species passes to the resolving slit assembly 587. Resolving slit assembly 587 is shown in an enlarged end view in FIG. 66 and comprises a multiple resolving slit frame 588 having a plurality of resolving slit inserts 589 mounted therein for purposes which were described previously. As shown in FIG. 65, the multiple resolving slit frame 588 is mounted in a cantilevered manner on a swinging arm 590 which is attached at the other end to a coupling block 591, which is, in turn, mounted on a rotating shaft arrangement depicted in FIG. 69. A parallel arrangement of coolant tubes traverses the length of the swing arm 590 to cool the resolving slit frame 588. As shown in FIGS. 64 and 67 coolant tubes 592 and 593 supply cooling fluid to the end wall 585 which terminates the ion drift tube region 580. These coolant tubes also cool the side fences 581 and 582 which are struck by unselected ions in the ion beam.

A Faraday cup arrangement 595 is shown in FIGS. 64 and 65 and includes a Faraday cup 596 mounted in a cantilevered manner on swing arm 597 which is mounted on a coupling block 598 attached to a rotatable shaft for purposes of moving the Faraday cup in and out of the ion beam. A suppression magnet system 600 is disposed at the end of the ion drift tube region to provide a magnetic field which has a vertical component across the length of the aperture 586 and prevents electrons from escaping from the Faraday cup when it is positioned in the beam.

FIG. 64 also discloses a portion of a post-acceleration system 440 of the type disclosed in more detail in copending and commonly assigned U.S. patent application entitled "Ion Beam Post Acceleration System and Method," and reference to that application is made for details of the structure and operation of such a post-acceleration system.

FIGS. 68 and 69 depict a sliding vacuum gate valve arrangement 610 which may be operated to selectively seal the end of the drift tube region 580 to maintain vacuum in the drift tube and the post-acceleration system when maintenance is performed on either the analyzing magnet assembly or the ion source assembly which results in the vacuum being broken in the beam line components preceding the drift tube. FIGS. 68 and 69 also depict drive arrangements 620 and 621 for the multiple resolving slit assembly and the Faraday cup assembly. Only the drive arrangement 620 is shown in complete detail, since both are essentially identical.

The gate valve arrangement 610 includes a pneumatic cylinder 611 which is coupled to a shaft 612 extending through a bellows arrangement 613 to drive a gate valve 614. The gate valve block 614 rides on rollers 615 and has a lower block portion 614A and a upper block 614B which are coupled together by a spring biased camming arrangement 617. As the shaft 612 pushes the sliding gate valve block 614 toward the opening, it eventually encounters a stop 616 with the lower block 614A. At this point over travel of the top portion 614B causes the camming mechanism 617 to push the lower block 614A into a vacuum seal contact with the wall 580A.

The actuator 620 includes a ratchet and pall arrangement 622 operated by a pneumatic cylinder 623 to drive a shaft 624. Shaft 624 in turn drives rotatably mounted shaft 625 through a cam arrangement 626. Shaft 625 is a hollow shaft through which concentric fluid coupling tubes are disposed for carrying cooling fluid to the coolant channels extending through the swing arm 590. An optical rotary position sensor 626 is provided to signal to a control system the actual shaft position and thus position of either the multiple resolving slit frame or the Faraday cup.

FIG. 70 depicts, in an enlarged section view, the presently preferred geometry for the narrow dimension of the ion exit aperture 496 in the front plate 495 of the ion source depicted in FIGS. 52 and 53. In this specific embodiment, the front plate 495 is formed of graphite material having a thickness of about six millimeters. The base 496A of the ion exit aperture 496 is about five millimeters. Its length in the longer dimension is 110 millimeters. A vertical step about 0.25 millimeters in thickness creates an initial vertical wall portion 496B, and this initial wall portion is followed by a second wall portion 496C which is formed at about a forty five degree angle.

The five millimeter wide ion exit aperture contrasts with the one to three millimeter width dimension utilized in all known prior art ion implantation systems which have been commercially produced. As previously indicated, it has apparently been the universal belief of artisans and experts in the field of ion implantation sources that it was necessary to limit the width of the ion exit slit to a dimension in the range of one to three millimeters (typically about two millimeters) in order to maintain a stable ion beam and to have sufficient resolving power. A prototype ion implanter incorporating the principles of this invention has been successfully operated with the five millimeter wide aperture depicted in FIG. 71. The upper limit of width of the aperture appears to be a function of the maximum beam divergence which can be accepted by the analyzing system. Additional limiting factors on slit width are the increased extraction gap and extraction voltage required to maintain beam quality with greater slit widths. At some point a practicable limit would be reached, especially since higher extraction voltages tend to increase sparking problems.

From the raw beam current numbers given above (i.e., twenty eight milliAmps of boron and sixty seven milliAmps of arsenic), it will be readily appreciated that the use of a wide exit slit in a single exit slit system (which is preferable for a Freeman source having a single filament-cathode positioned in front of the exit slit) produces dramatic advances in ion implant apparatus. The only sacrifice involved in using such a wider exit slit for extraction of higher beam currents is the greater ion beam divergence that is encountered. This greater beam divergence generally requires, in the ion optics of this invention, that the magnet pole gap in the mass analyzing system be enlarged. However, this need for a wider pole gap can be offset to a substantial extent by using fringe focussing at the entry side of the analyzing magnet.

The raw beam currents discussed above were achieved with a sixty five millimeter magnet pole gap which is presently considered optimum for boron and arsenic ion beams. This same gap can be used with a twelve kilovolt preacceleration voltage for antimony ions. Alternatively, a fifty millimeter magnet gap with twenty kilovolts preacceleration may be used for antimony ions.

The beam analyzing magnet system utilized in a prototype of this invention has a total weight of about one ton which compares to the six to seven ton weight of an analyzing magnet system which would probably be required in an implanter system using prior art optics to achieve the same beam current performance. This reduction in magnet size and weight is due to a number of factors involved in the new ion optics of this invention and the new source and extraction system operating parameters. Overall, the prototype system of this invention is comparable in size and weight to prior art "high current" machines which cannot begin to generate comparable beam currents.

The improved beam current generating capability of ion implantation systems in accordance with this invention will have a dramatic effect on productivity of ion implanters in commercial utilization in the future. Generally, ion implantation systems in accordance with this invention will be able to do the work of two to four ion implanters of the prior art type. This performance capability will be achieved without a large increase in beam line costs. Accordingly, since ion implantation has become a production technique of choice for doping semiconductor integrated circuit devices, commercial ion implanter systems which utilize the principles of this invention and the various features which make up the whole of this invention will make a strong contribution to reducing the overall capital costs involved in systems for future production of high density integrated circuits.

The impact of the new technology of this invention will be felt especially strong in the production of high density complimentary MOS circuits where as many as seven or eight ion implantation steps, some low dosage and some high dosage, are typically involved. The impact will be especially significant in the high dose boron implants required in CMOS production, e.g., implants of $10^{16}$ ions per square centimeters.

BEAM CURRENT IMPROVEMENTS WITH PRIOR ART OPTICS

It should also be possible to employ certain features of this invention to enable ion implantation systems using prior art, conventional ion optics to achieve higher ion beam currents in a practicable system embodiment. In such conventional optics, as shown in FIG. 5, the longer dimension of the ion exit slit 32 is perpendicular to the dispersion plane of the analyzing magnet 40. Accordingly, the ion beam divergence is in the dispersion plane. The use of a wider ion exit aperture (i.e., four or five millimeters in width) to increase extracted beam current will most likely result in a substantial increase in beam divergence in the dispersion plane. This change, by itself, would not result in more useful beam current through the resolving slit unless the width of the entry face of the analyzing magnet were substantially increased to accommodate the greater beam divergence. This may be practicable in some situations especially if the exit aperture is increased in width to only four millimeters.

However, using the combination of a wider ion exit aperture with the acceleration-deceleration feature of this invention discussed above with respect to FIG. 31 (and possibly with some other carefully implemented changes) may make it quite practicable to achieve substantially higher useful ion beam currents in systems employing prior art optics. The acceleration-deceleration feature of this invention provides a beam converging cylindrical lens which could be employed to reduce ion beam divergence in the dispersion plane. This would reduce the amount of increase in width of the entry face of the analyzing magnet required to handle the increased beam divergence from a wider source. Furthermore, the acceleration-deceleration feature of this invention results in lower ion beam velocity which reduces the size/power requirements of the analyzing magnet and makes it more feasible to increase the pole width without greatly increasing overall magnet size, weight, and power requirement.

In addition, it may be possible to use a wider ion exit aperture with somewhat reduced length (but overall larger ion extraction area) and then move the ion source closer to the analyzing magnet to reduce the total beam width entering the magnet. The overall combination of a wider, shorter ion exit aperture (but larger beam extraction area), acceleration-deceleration biasing of extraction and deceleration electrodes, and wider magnet entry faces should enable substantially greater useful ion beam currents to be obtained with prior art ion optics. Increases in useful beam currents in the range of fifty to one hundred percent may be achievable with this approach, especially for the lighter ions such as boron (mass 11).

It should be apparent from the above description of numerous features and alternative embodiments of the various features of this invention, that the principles of the invention are of broad applicability to a wide variety of specific embodiments of ion implantation apparatus. Each of the various features of the invention contributes materially to the improvements in ion implantation system performance. Many of the features taken together with each other result in dramatic improvements in the overall ion implantation system from the standpoints of compactness of beam line design, high ion beam current generating capabilities, and reliability of operation.

Having described the various embodiments of the features of the invention, it should be understood that numerous changes could be made by persons of skill in the art without departing from the scope of the invention as claimed in the following claims.

What is claimed is:

1. In a system for implanting ions into a target element, ion source means including an ion exit aperture means through which generated ions may freely pass and being electrically biased to a preanalysis acceleration voltage; an extraction electrode means positioned in the vicinity of said ion exit aperture means and biased to a voltage value relative to said preanalysis acceleration voltage to extract and accelerate ions from said ion source means; and a deceleration electrode means positioned downstream of said extraction electrode means and being biased to a voltage relative to said extraction voltage value, the voltage value of the deceleration electrode means relative to the extraction electrode means being of the same order of magnitude as the voltage value of the extraction electrode means relative to the preanalysis acceleration electrode means, substantially to decrease the velocity of ions passing through the region between said extraction electrode means and said deceleration electrode means.

2. The system of claim 1, further comprising a stabilized power supply means for supplying said preanalysis acceleration voltage and an unstabilized power supply means for supplying said voltage to said extraction electrode means so that said extraction electrode voltage will rapidly drop in magnitude when a spark discharge occurs between said ion source means and said extraction electrode means, such that the energy of said spark is limited and said spark is quickly quenched without substantially affecting the velocity of extracted ions entering said analyzing means.

3. In a system for implanting ions into a target element, ion source means for producing an ion beam; beam analyzing means for receiving said ion beam and separating various ion species in said beam on the basis of mass to produce an analyzed beam; and beam resolving means disposed in the path of said analyzed beam for permitting a preselected ion species to pass to said target element; said beam resolving means comprising a plurality of beam resolving elements each having a resolving aperture, and means for selectively positioning one of said beam resolving elements in the path of said analyzed beam.

4. The system of claim 3, wherein each of said beam resolving elements is dedicated to a particular ion species so that contamination from other ion species deposited on the edges of other resolving elements can not be sputtered off during ion implanting process.

5. The system of claim 3, wherein said beam resolving means further comprises an ion drift tube communicating at one end with said beam analyzing means and having an ion beam exit aperture at the opposite end thereof, said beam resolving elements being positioned adjacent said ion beam exit aperture and comprising a mounting frame with a plurality of beam resolving slits carried thereon, and said positioning means comprises means for selectively positioning one of said beam resolving slits in position to communicate with said ion beam exit aperture.

6. The system of claim 5, wherein said positioning means comprises a shaft rotatably mounted at said end of said drift tube communicating with said analyzing means, a coupling arm mounted at one end to said shaft and at the other end to said mounting frame such that said mounting frame translates across said other end of said ion drift tube in front of said ion beam exit aperture as said shaft rotates, and an actuator means for producing a precisely controlled rotation of said shaft to predefined rotary positions to position one of said beam resolving slits in a precise location in front of said ion beam exit aperture.

7. In a system for implanting ions into a target element, ion source means for producing an ion beam; beam analyzing means for receiving said ion beam and selectively separating various ion species in said beam on the basis of mass to product an analyzed beam exiting said analyzing means, and beam resolving means disposed in the path of said analyzed beam for permitting a preselected ion species to pass to said target element; said ion source means comprising an ion source arc chamber having a front plate with a rectangualr ion exit aperture therein, an extraction electrode means mounted in front of said ion exit aperture means and electrically biased with respect to said front plate to extract a beam of ions from said ion source arc chamber through said ion exit aperture means, said ion exit aperture means having a width substantially greater than three millimeters such that a high current beam of ions is extracted from said ion source arc chamber.

8. The system of claim 7, wherein said front plate of said ion source arc chamber is about six millimeters in thickness, said ion exit aperture means is formed to a width of about five millimeters, and said ion exit slit has a cross-sectional configuration comprising a first wall portion about 0.25 millimeter long extending substantially perpendicular to the back surface of said front plate and a second wall portion extending from said first wall portion toward the front wall surface of said front plate at an angle of about forty five degrees.

9. The system of claim 7, wherein said analyzing means comprises an analyzing magnet system including a pair of magnet pole pieces having inner surfaces spaced from each other by substantially equal distances thereacross, the front entry edges of said pole pieces being angled substantially to the entrance path of the ion beam traversing the region between said poles to provide a strong fringe focussing field at the beam entrance end of said pole pieces for producing a converging lens action on the ion beam in the non-dispersion plane of the magnet system, said ion exit aperture means width producing an ion beam with substantially greater divergence than an aperture with more narrow width, and said fringe focussing field of said entry face of said analyzing magnet assisting in converging said diverging beam into said pole gap.

10. The system of claim 9, wherein a beam entry magnetic field shunt is provided at the beam entry end of said magnet pole pieces and spaced a short distance away from said magnet poles and spaced a short distance away from said magnet poles to provide a magnetic field free entry region for said ion beam prior to encountering said fringe focussing field of said angled pole piece edges and to enhance the effectiveness of said fringe focussing field.

11. The system of claim 10, wherein said magnet pole pieces have rear exit edges angled substantially to the exit path of the ion beam, and further comprising a beam exit magnetic field shunt located at the beam exit end of said magnet pole pieces and spaced a short distance away from said magnet poles to provide a magnetic field free exit region for said ion beam after passing through said fringe focussing field.

12. The system of claim 7, wherein said ion source means further comprises a deceleration electrode means mounted downstream of said extraction electrode means, said front plate of said ion source arc chamber being biased to a preanaylsis acceleration voltage, said extraction electrode means being biased to a voltage value relative to said preanalysis acceleration voltage to extract and accelerate ions from said source; and said deceleration electrode means being biased to a voltage value relative to said extraction voltage to decrease substantially the velocity of ions passing through the region between said extraction electrode means and said deceleration electrode means.

13. The system of claim 12, further comprising a stabilized power supply means for supplying said preanalysis acceleration voltage and an unsabilized power supply means for supplying said voltage to said extraction electrode means so that said extraction electrode voltage will rapidly drop in magnitude when a spark discharge occurs between said source front plate and said extraction electrode means, to limit the energy of, and quickly quench, said spark without substantially affecting the velocity of extracted ions entering said analyzing means.

14. The system of claim 12, wherein said bias voltage on said extraction electrode means has a magnitude at least about ten percent of the difference in magnitudes of said preanaylsis acceleration voltage and the voltage applied to said deceleration electrode means.

15. The system of claim 7, further comprising a deceleration electrode means mounted downstream from said extraction electrode means, said ion source means and said extraction and deceleration electrodes means being mounted within a source chamber housing, and further comprising a support arrangement for said extraction electrode means and said deceleration electrode means including an electrode support base, a first support pillar arrangement mounted on one side of said electrode support base for supporting said extraction electrode means thereon in a cantilevered manner and having a shielded insulator section remote from said extraction electrode means, and a second support pillar arrangement for supporting said deceleration electrode means thereon in a cantilevered manner above and separated from said extraction electrode means; said source chamber housing including an opening in one wall thereof running parallel to said support pillar arrangements and said support pillar arrangements and said cantilevered mounting of said electrodes providing a region of high vacuum pumping conductance thereat, such that gas from a gas fed ion source is more readily removed from said source chamber to avoid such gas entering the beam analyzing means and other portions of the system.

16. The system of claim 7, wherein said ion source means further comprises an elongated filament-cathode disposed lengthwise within said source chamber, and an elongated anode disposed adjacent said filament-cathode; means applying a current generating electrical potential difference across said filament-cathode; means applying an arc creating bias between said chamber and said filament-cathode to generate ions within said chamber; and magnetic means applying a magnetic field parallel to said filament-cathode with a non-uniform field strength from one end of said filament cathode to the other to counteract non-uniform ion generation characteristics from one end of said source to the other.

17. The system of claim 16, wherein said magnetic means includes a pair of magnetic pole pieces positioned at opposite ends of said ion source means and substantially aligned with said filament-cathode and separate field coils positioned on said pole pieces for separately controlling the magnetic field intensity generated in the vicinity of each pole piece.

18. In a system for implanting ions into a target element, ion source means for producing an ion beam; beam analyzing means for receiving said ion beam and selectively separating various ion species in said beam on the basis of mass to produce an analyzed beam exiting said analyzing means, and beam resolving means disposed in the path of said analyzed beam for permitting a preselected ion species to pass to said target element, said ion source means including a source chamber housing and an electrode module and a source module mounted within said housing; said source module comprising a source mounting flange, an ion source carried on said source mounting flange, and a source insulator carried on said source mounting flange and being removably mounted along with said source mounting flange to said electrode module mounting flange such that said ion source module comprises a separately removable module.

19. The system of claim 18, wherein said electrode module includes a mounting flange, and electrode support base carried on said mounting flange, and an electrode assembly carried on said support base, said mounting flange being removably mounted to said source chamber housing such that said mounting flange, said support base and said electrode assembly comprise a separately removable module; said source mounting flange and said source insulator being mounted to said electrode mounting flange.

20. The system of claim 19, wherein said electrode assembly comprises an extract in electrode, a deceleration electrode, a first support pillar arrangement mounted on one side of said electrode support base for supporting said extraction electrode thereon in a cantilevered manner and having a shielded insulator section remote from said extraction electrode, and a second support pillar arrangement mounted on the opposite side of said electrode support base for supporting said deceleration electrode thereon in a cantilevered manner above and separated from said extraction electrode; said source chamber housing including an opening in one wall thereof running parallel to said support pillar arrangements and said support pillar arrangements and said contilevered mounting of said electrode providing a region of high vacuum pumping conductance thereat, such that gas from a gas fed ion source is more readily removed from said source chamber to avoid such gas entering the beam analyzing means and other portions of the system.

21. The system of claim 20, wherein said electrode module further comprises a beam control vane assembly carried on said electrode module mounting flange, said beam control vane assembly comprising a pair of upper vanes positioned downstream of said deceleration electrode, a vane support element mounted at one end of each of said vanes and extending past the outside edges of said support pillars for said electrodes and said electrode support base, rotation mounting means coupling to the other end of each of said vane support elements for rotationally mounting said vanes and said vane support element to said electrode assembly mounting flange, and vane driving means for driving said rotation mounting means to selectively position said vane support elements and said vanes so that said vanes intercept a preselected portion of the length of said ion beam passing through said deceleration electrode.

22. The system of claim 21, wherein said beam control vane assembly further comprises means for selectively driving only one of said vanes into and out of said beam while maintaining the other vane in a position which fully blocks one-half of the ion beam so that the characteristics of said ion beam can be analyzed by gradually passing incremental additional portions of one-half of said ion beam to said analyzing means.

23. In a method for operating an ion source system comprising an ion source having an ion emitting region, an extraction electrode positioned in the vicinity of said ion emitting region, and a second electrode positioned substantially adjacent said extraction electrode, the steps of:
 applying a preanalysis acceleration voltage to said ion source;
 applying to said extraction electrode a bias potential having a value relative to said preanalysis acceleration voltage to extract and accelerate ions from said source; and
 applying to said second electrode a bias potential having a value relative to said bias potential value on said extraction electrode of the same order of magnitude as the value of the bias potential on the extraction electrode relative to the preanalysis acceleration voltage, to reduce substantially the velocity of ions travelling between said extraction electrode and said second electrode.

24. The method of claim 23, wherein the step of applying said preanalysis acceleration voltage to said ion source comprises applying a stabilized potential thereto and the step of applying a bias potential to said extraction electrode comprises applying an unstabilized potential thereto so that said potential with rapidly drop in magnitude when a spark discharge occurs between said ion source and said extraction electrode, to limit the energy of, a quickly quench, said spark without substantially affecting the velocity of extracted ions entering said analyzing means.

25. In a method for implanting ions of substantially a single preselected ions species into a target element, the steps of:
 generating an ion beam of substantially uniform velocity and having a plurality of ion species therein, including said preselected ion species;
 analyzing said ion beam to separate ions having different values of charge to mass ratio into different beam paths;
 selecting from a group of beam resolving elements a particular beam resolving element; and
 positioning said selected beam resolving element in the path of the ion beam of said preselected ion species to pass said ions to said target element.

26. In an ion source system, a source chamber with an elongated ion exit aperture in one wall thereof; an elongated filament-cathode disposed lengthwise within said source chamber; means applying a current generating electrical potential difference across said filament-cathode; means applying an arc creating bias between said chamber and said filament-cathode to generate ions within said chamber; and means applying a magnetic field parallel to said filament-cathode with a non-uniform field strength to counteract non-uniform ion generating characteristics from one end of said source to the other.

27. In an ion source system, a source chamber with an elongated ion exit aperture formed in one wall thereof; an elongated filament-cathode disposed lengthwise within said source chamber and substantially parallel to said aperture; a plurality of separate anode elements mounted within said source chamber with electrical isolation therebetween; and means for applying separate bias voltages to said separate anode structures for independent control of the ion current generated in the vicinity of each of said anode structures.

28. The ion source system of claim 27, further comprising means for separately detecting the current flow between each of said separate anode elements and said filament-cathode.

29. In a method for generating an ion beam of selecting energy for an ion implantation system, the steps of:
 creating a plasma of ions within a generally confined volume;
 extracting a beam of ions from said plasma with an accelerating voltage; and
 decelerating said beam of ions with a substantial decelerating voltage relative to said accelerating voltage, said deceleration voltage being of the same order of magnitude as said accelerating voltage.

30. The method of claim 29, wherein said deceleration of said beam produced by said deceleration voltage has a magnitude at least ten percent of the selected energy of the beam.

31. In a method for implanting ions of substantially a single preselected ion species into a target element, the steps of:
 generating an ion beam having a plurality of ion species therein, including said preselected ion species;
 analyzing said ion beam to separate ions having different values of charge to mass ratio into different focused ion beam paths; and
 passing the focused ion beam of said preselected ion species through a preselected one of a plurality of beam resolving elements into said target element.

* * * * *